United States Patent
Sakata et al.

(10) Patent No.: US 8,286,124 B2
(45) Date of Patent: Oct. 9, 2012

(54) PRINTED CIRCUIT BOARD DESIGN ASSISTING METHOD, PRINTED CIRCUIT BOARD DESIGN ASSISTING DEVICE, AND STORAGE MEDIUM

(75) Inventors: Toshiyasu Sakata, Kawasaki (JP); Eiichi Konno, Kawasaki (JP); Takahiko Orita, Kawasaki (JP); Yoshitaka Nishio, Kawasaki (JP); Kazunori Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 12/819,580

(22) Filed: Jun. 21, 2010

(65) Prior Publication Data
US 2010/0325594 A1 Dec. 23, 2010

(30) Foreign Application Priority Data
Jun. 22, 2009 (JP) ................................. 2009-147588

(51) Int. Cl.
*G06F 17/50* (2006.01)
(52) U.S. Cl. ......... 716/137; 716/126; 716/132; 716/136
(58) Field of Classification Search .................. 716/136, 716/132, 126, 13
See application file for complete search history.

(56) References Cited

U.S. PATENT DOCUMENTS

2001/0018761 A1* 8/2001 Sasaki et al. ..................... 716/15
2008/0178139 A1* 7/2008 Pfeil et al. ........................ 716/15

FOREIGN PATENT DOCUMENTS

| JP | 2000-261110 | 9/2000 |
|----|-------------|--------|
| JP | 2001-53185  | 2/2001 |
| JP | 2001-144205 | 5/2001 |
| JP | 2003-218540 | 7/2003 |
| JP | 3745176     | 2/2006 |

* cited by examiner

*Primary Examiner* — Thuan Do
*Assistant Examiner* — Brian Ngo
(74) *Attorney, Agent, or Firm* — Staas & Halsey LLP

(57) ABSTRACT

A printed circuit board design assisting method, device and storage medium are provided. The assisting method includes referring to the position of terminals of a grid array package part, and attributes indicating whether each of the terminals is a power source terminal or a ground terminal, and selecting the power source terminals as a terminal to be researched, searching for a new connection path between the terminal which has been selected, and one of the ground terminals, by way of a first decoupling capacitor, determining whether there is duplication of paths between the new connection path and an connection path between the terminals connected by way of a second decoupling capacitor, changing the position of the second decoupling capacitor if duplication is detected, and re-searching a connection path between the terminals by way of the second decoupling capacitor, which is not in duplicate with the new connection path.

14 Claims, 63 Drawing Sheets

| CONDITION NO. | CONDITION NAME | CONNECTION CONDITIONS | | | | | | |
|---|---|---|---|---|---|---|---|---|
| | | BGA PART NO. | TERMINAL NO. | MOUNTING FACE | TOLERANCE DISTANCE | VOLTAGE VALUE | DECOUPLING CAPACITOR PART NO. | NUMBER |
| 1 | FOR I2006(1) | I2006 | 26 | L1 SURFACE | 2.000mm | - | C6180 | 1 |
| 2 | FOR I2006(1) | I2002 | UNSPECIFIED | L1 SURFACE | 2.000mm | - | C6191 | 1 |
| 3 | FOR I2006(10) | I2002 | UNSPECIFIED | L1 SURFACE | 2.000mm | - | C6186 | 1 |
| 4 | FOR I2006(11) | I2002 | UNSPECIFIED | L1 SURFACE | 2.000mm | - | C6183 | 1 |
| 5 | FOR I2006(12) | I2002 | 978 | L1 SURFACE | 2.000mm | - | C6184 | 1 |
| 6 | FOR I2006(2) | I2002 | 172 | L1 SURFACE | 2.000mm | - | C6190 | 1 |
| ... | ... | ... | ... | ... | ... | ... | ... | ... |

330

F[UP TO NUMBER OF P + NUMBER OF V]
LINKS TO P AND V WITH RESEARCHED FLAG ON

| | |
|---|---|
| 1 | Fi:LINK TO P OR V |
| 2 | |
| 3 | |
| 4 | |
| 5 | |
| 6 | |
| 7 | |
| 8 | |

⋮

360

DECOUPLING CAPACITOR TABLE

| DECOUPLING CAPACITOR NAME | VOLTAGE VALUE | ... |
|---|---|---|
| C0001 | +0.75 | |
| C0002 | +0.75 | |
| C0003 | +0.75 | |
| C0004 | +1.2 | |
| C0005 | +1.2 | |
| C0006 | +1.2 | |
| C0007 | +1.5 | |
| C0008 | +1.5 | |
| C0009 | +1.5 | |

FIG. 49

| P[i] (i=1,2,···,36) BGA TERMINAL | | | | Pv[] LINK TO VIA FORMATION CANDIDATE POSITION | | | |
|---|---|---|---|---|---|---|---|
| COORDINATES | TYPE | VOLTAGE VALUE | ··· | FIRST | SECOND | THIRD | FOURTH |
| 1 | B 2 | POWER SOURCE | +1.5 | | A 1 | C 1 | A 3 | C 3 |
| 2 | D 2 | SIGNAL | | | C 1 | E 1 | C 3 | E 3 |
| 3 | F 2 | SIGNAL | | | E 1 | E 3 | | |
| 4 | H 2 | SIGNAL | | | I 1 | I 3 | | |
| 5 | J 2 | SIGNAL | | | K 1 | I 1 | K 3 | I 3 |
| 6 | L 2 | SIGNAL | | | M 1 | K 1 | M 3 | K 3 |
| 7 | B 4 | POWER SOURCE | +1.2 | | A 3 | C 3 | A 5 | C 5 |
| 8 | D 4 | GND | | | C 3 | E 3 | C 5 | E 5 |
| 9 | F 4 | SIGNAL | | | E 3 | E 5 | | |
| 10 | H 4 | SIGNAL | | | I 3 | I 5 | | |
| 11 | J 4 | SIGNAL | | | K 3 | I 3 | K 5 | I 5 |
| 12 | L 4 | SIGNAL | | | M 3 | K 3 | M 5 | K 5 |
| 13 | B 6 | GND | | | A 5 | C 5 | | |
| 14 | D 6 | POWER SOURCE | +0.75 | | C 5 | E 5 | | |
| 15 | F 6 | GND | | | E 5 | | | |
| 16 | H 6 | SIGNAL | | | I 5 | | | |
| 17 | J 6 | SIGNAL | | | K 5 | I 5 | | |
| 18 | L 6 | SIGNAL | | | M 5 | K 5 | | |
| 19 | B 8 | SIGNAL | | | A 9 | C 9 | | |
| 20 | D 8 | SIGNAL | | | C 9 | E 9 | | |
| 21 | F 8 | SIGNAL | | | E 9 | | | |
| 22 | H 8 | SIGNAL | | | I 9 | | | |
| 23 | J 8 | SIGNAL | | | K 9 | I 9 | | |
| 24 | L 8 | SIGNAL | | | M 9 | K 9 | | |
| 25 | B 10 | SIGNAL | | | A 11 | C 11 | A 9 | C 9 |
| 26 | D 10 | SIGNAL | | | C 11 | E 11 | C 9 | E 9 |
| 27 | F 10 | SIGNAL | | | E 11 | E 9 | | |
| 28 | H 10 | SIGNAL | | | I 11 | I 9 | | |
| 29 | J 10 | SIGNAL | | | K 11 | I 11 | K 9 | I 9 |
| 30 | L 10 | SIGNAL | | | M 11 | K 11 | M 9 | K 9 |
| 31 | B 12 | SIGNAL | | | A 13 | C 13 | A 11 | C 11 |
| 32 | D 12 | SIGNAL | | | C 13 | E 13 | C 11 | E 11 |
| 33 | F 12 | SIGNAL | | | E 13 | E 11 | | |
| 34 | H 12 | SIGNAL | | | I 13 | I 11 | | |
| 35 | J 12 | SIGNAL | | | K 13 | I 13 | K 11 | I 11 |
| 36 | L 12 | SIGNAL | | | M 13 | K 13 | M 11 | K 11 |

| | V[j] (j=1,2,...,49) 321 LINK TO VIA FORMATION CANDIDATE POSITION | | Vp[] LINK TO TERMINAL | | | | W[] LINK TO OTHER VIA FORMATION CANDIDATE POSITION CONNECTABLE BY DECOUPLING CAPACITOR | | | |
|---|---|---|---|---|---|---|---|---|---|---|
| | COORDINATES | ... | FIRST | SECOND | THIRD | FOURTH | FIRST | SECOND | THIRD | FOURTH |
| 1 | A 1 | | B 2 | | | | C 1 | A 3 | | |
| 2 | C 1 | | D 2 | B 2 | | | A 1 | E 1 | C 3 | |
| 3 | E 1 | | F 2 | D 2 | | | C 1 | E 3 | | |
| 4 | G 1 | | | | | | | | | |
| 5 | I 1 | | H 2 | J 2 | | | K 1 | I 3 | | |
| 6 | K 1 | | J 2 | L 2 | | | M 1 | I 1 | K 3 | |
| 7 | M 1 | | L 2 | | | | K 1 | M 3 | | |
| 8 | A 3 | | B 4 | B 2 | | | C 3 | A 1 | A 5 | |
| 9 | C 3 | | D 4 | B 4 | D 2 | B 2 | A 3 | E 3 | C 1 | C 5 |
| 10 | E 3 | | F 4 | D 4 | F 2 | D 2 | C 3 | E 1 | E 5 | |
| 11 | G 3 | | | | | | | | | |
| 12 | I 3 | | H 4 | J 4 | H 2 | J 2 | K 3 | I 1 | I 5 | |
| 13 | K 3 | | J 4 | L 4 | J 2 | L 2 | M 3 | I 3 | K 1 | K 5 |
| 14 | M 3 | | L 4 | L 2 | | | K 3 | M 1 | M 5 | |
| 15 | A 5 | | B 6 | B 4 | | | C 5 | A 3 | | |
| 16 | C 5 | | D 6 | B 6 | D 4 | B 4 | A 5 | E 5 | C 3 | |
| 17 | E 5 | | F 6 | D 6 | F 4 | D 4 | C 5 | E 3 | | |
| 18 | G 5 | | | | | | | | | |
| 19 | I 5 | | H 6 | J 6 | H 4 | J 4 | K 5 | I 3 | | |
| 20 | K 5 | | J 6 | L 6 | J 4 | L 4 | M 5 | I 5 | K 3 | |
| 21 | M 5 | | L 6 | L 4 | | | K 5 | M 3 | | |
| 22 | A 7 | | | | | | | | | |
| 23 | C 7 | | | | | | | | | |
| 24 | E 7 | | | | | | | | | |
| 25 | G 7 | | | | | | | | | |
| 26 | I 7 | | | | | | | | | |
| 27 | K 7 | | | | | | | | | |
| 28 | M 7 | | | | | | | | | |
| 29 | A 9 | | B 8 | B 10 | | | C 9 | A 11 | | |
| 30 | C 9 | | D 8 | B 8 | D 10 | B 10 | A 9 | E 9 | C 11 | |
| 31 | E 9 | | F 8 | D 8 | F 10 | D 10 | C 9 | E 11 | | |
| 32 | G 9 | | | | | | | | | |
| 33 | I 9 | | H 8 | J 8 | H 10 | J 10 | K 9 | I 11 | | |
| 34 | K 9 | | J 8 | L 8 | J 10 | L 10 | M 9 | I 9 | K 11 | |
| 35 | M 9 | | L 8 | L 10 | | | K 9 | M 11 | | |
| 36 | A 11 | | B 10 | B 12 | | | C 11 | A 13 | A 9 | |
| 37 | C 11 | | D 10 | B 10 | D 12 | B 12 | A 11 | E 11 | C 13 | C 9 |
| 38 | E 11 | | F 10 | D 10 | F 12 | D 12 | C 11 | E 13 | E 9 | |
| 39 | G 11 | | | | | | | | | |
| 40 | I 11 | | H 10 | J 10 | H 12 | J 12 | K 11 | I 13 | I 9 | |
| 41 | K 11 | | J 10 | L 10 | J 12 | L 12 | M 11 | I 11 | K 13 | K 9 |
| 42 | M 11 | | L 10 | L 12 | | | K 11 | M 13 | M 9 | |
| 43 | A 13 | | B 12 | | | | C 13 | A 11 | | |
| 44 | C 13 | | D 12 | B 12 | | | A 13 | E 13 | C 11 | |
| 45 | E 13 | | F 12 | D 12 | | | C 13 | E 11 | | |
| 46 | G 13 | | | | | | | | | |
| 47 | I 13 | | H 12 | J 12 | | | K 13 | I 11 | | |
| 48 | K 13 | | J 12 | L 12 | | | M 13 | I 13 | K 11 | |
| 49 | M 13 | | L 12 | | | | K 13 | M 11 | | |

PRINTED CIRCUIT BOARD DESIGN ASSISTING METHOD, PRINTED CIRCUIT BOARD DESIGN ASSISTING DEVICE, AND STORAGE MEDIUM

This application is related to and claims priority to Japanese Patent Application No. 2009-147588 filed on Jun. 22, 2009, and incorporated herein by reference.

BACKGROUND

1. Field

The embodiments herein are directed to assisting of placement design for parts to be mounted on a printed circuit board.

2. Description of Related Art

An increasing number of pins are being used with LSI (Large Scale Integration), and as a result, packaging called BGA (Ball Grid Array) has come to be often used for packaging. With BGA, ball-shaped electrodes of solder are arrayed in a grid fashion. Note that a package wherein flat electrode pads are arrayed in a grid fashion instead of the solder balls with BGA may be referred to as LGA (Lad Grid Array). Grid array packaging such as BGA and LGA allow a greater number of electrodes to be provided as compared with a QFP (Quad Flat Package) where terminals are extended from the four sides.

With grid array packaging, a great number of electrodes are arrayed densely. Accordingly, wiring design for the printed circuit board side which mounts the grid array package is more difficult. Various contrivances have been made regarding wiring on the printed circuit board which mounts the grid array package, examples of which include Japanese Patent No. 3,745,176, Japanese Laid-open Patent Publication No. 2000-261110, Japanese Laid-open Patent Publication No. 2003-218540, and Japanese Laid-open Patent Publication No. 2001-53185.

Signal transmission speeds and signal rising speeds are increasing. Accordingly, the number of decoupling capacitors required for one grid array package to prevent simultaneous switching output noise is also increasing. For example, 350 or more decoupling capacitors may be required for one 1,500-pin class grid array package. Decoupling capacitors for allowing such a grid array package to operate are placed very close to the connection terminals of electrodes of the grid array package. Accordingly, a great number of decoupling capacitors will be placed in a narrow range corresponding to the size of the grid array package.

However, with conventional printed circuit board design, placement of decoupling capacitors has been performed manually by a designer using CAD (Computer Aided Design), which has been extremely time and labor consuming. In particular, the increase in the number of decoupling capacitors required has become a factor which markedly increases the number of part placement operations in printed circuit board design.

SUMMARY

It is an aspect of the embodiments disclosed herein to provide a printed circuit board design assisting method, a storage medium in which is recorded a program for assisting design, and a printed circuit board design assisting device.

The aspects can be attained by a printed circuit board design assisting method including referring to the position of terminals of a grid array package part, and attributes indicating whether each of the terminals is a power source terminal or a ground terminal, and selecting the power source terminals as a terminal to be researched; searching for a new connection path between the terminal which has been selected, and one of the ground terminals, by way of a first decoupling capacitor; determining whether there is duplication of paths between the new connection path and an connection path between the terminals connected by way of a second decoupling capacitor; changing the position of the second decoupling capacitor if duplication of connection paths is detected, and re-searching a connection path between the terminals by way of the second decoupling capacitor, which is not in duplicate with the connection path searched in the search.

The above aspects can be attained by a storage medium in which is recorded a program for assisting design of a printed circuit board onto which is to be mounted a grid array package part, said program causing a computer to execute the processing of referring to the position of a plurality of terminals of said grid array package part, and a part information storage in which are stored attributes indicating whether each of said terminals is a power source terminal or a ground terminal, and selecting, one at a time, said power source terminals of said grid array package part as a terminal to be researched; searching for a new connection path between said terminal to be researched which has been selected, and one of said ground terminals, by way of a first decoupling capacitor; referring to a connection path storage for storing an already-existing connection path between said terminals connected by way of a second decoupling capacitor regarding which placement has already been determined, and determining whether there is duplication of paths between said new connection path and said already-existing connection path; storing said new connection path in said connection path storage in the event that duplication of connection paths is not detected; changing the position of said second decoupling capacitor in the event that duplication of connection paths is detected; re-searching a connection path by way of said second decoupling capacitor, between said terminals connected by said second decoupling capacitor, which is not in duplicate with said new connection path; deleting said already-existing connection path, which has been the object of re-searching, from said connection path storage; and storing the connection path obtained by re-searching and said new connection path in said connection path storage The above aspects can be attained by a printed circuit board design assisting device to execute processing of assisting design of a printed circuit board onto which is to be mounted a grid array package part, said device including research object terminal selector for referring to the position of a plurality of terminals of said grid array package part, and a part information storage in which are stored attributes indicating whether each of said terminals is a power source terminal or a ground terminal, and selecting, one at a time, said power source terminals of said grid array package part as a terminal to be researched; connection path searcher for referring to said a part information storage and searching for a new connection path between said terminal to be researched which has been selected, and one of said ground terminals, by way of a first decoupling capacitor; path duplication determiner for referring to connection path storage for storing an already-existing connection path between said terminals connected by way of a second decoupling capacitor regarding which placement has already been determined, and determining whether there is duplication of paths between said new connection path and said already-existing connection path; path re-searcher for changing the position of said second decoupling capacitor in the event that duplication of connection paths is detected, and re-searching a connection path by way of said second decoupling capacitor, between said terminals connected by said second decoupling capacitor, which is not in duplicate with said new connection path; and connection path changing means for storing said new connection path in said connection path storage in the event that duplication of connection paths is not detected, deleting said already-existing connection path, which has been the object of re-searching, from said connection path storage, and storing the connection path obtained by re-searching and said new connection path in said connection path storage.

It is to be understood that both the foregoing summary description and the following detailed description are explanatory as to some embodiments of the present invention, and not restrictive of the present invention as claimed. These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 13 illustrates an example of the data structure of association information;

FIG. 49 illustrates an example of a BGA terminal list;

FIG. 50 illustrates an example of a via formation candidate position list;

DETAILED DESCRIPTION OF THE EMBODIMENTS

Figure 1:
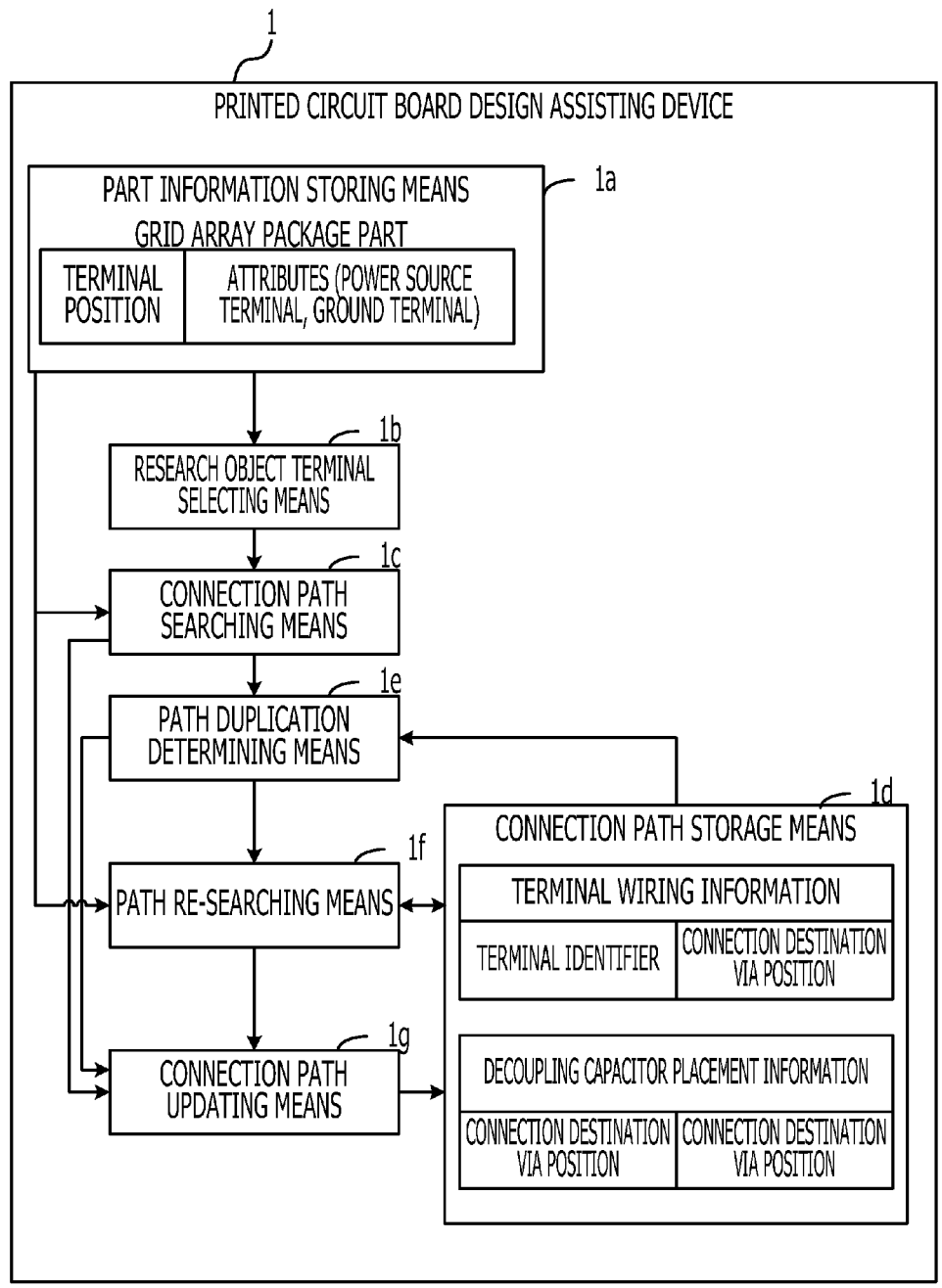
FIG. 1 is a functional block diagram of a printed circuit board design assisting device according to a first embodiment of the present invention.

FIG. 1 illustrates a first exemplary embodiment. A printed circuit board design assisting device 1 performs design assisting processing for a printed circuit board for mounting a grid array package part. The printed circuit board design assisting device 1 includes a part information storage 1a, a research object terminal selector 1b, a connection path searcher 1c, a connection path storage 1d, a path duplication determiner 1e, a path re-searcher 1f, and a connection path updater 1g.

The part information storage 1a store grid array package part information including the position of multiple terminals of the grid array package part, and attributes indicating whether a terminal is a power source terminal or ground terminal.

The research object terminal selector 1b makes reference to the part information storage 1a and selects one power source terminal of the grid array package part at a time, as a research object terminal.

The connection path searcher 1c make reference to the part information storage 1a, and search a new connection path between the selected research object terminal and one of the ground terminals, by way of a first decoupling capacitor.

The connection path storage 1d stores an already-existing connection path between terminals connected by way of a second decoupling capacitor regarding which the placement has already been determined. The connection path is indicated by terminal wiring information and decoupling capacitor placement information, for example. In the terminal wiring information is registered the correlation between the grid array package part and the position of vias which are connection targets. In the decoupling capacitor placement information is registered the positions of vias which are the connection destinations of two terminals of the decoupling capacitor. Thus can be known the position of the first via whereby outline wiring is performed from a power source terminal, the position of the second via which may be connected by the decoupling capacitor from the position of the first via, and the ground terminal which is to be connected by outline wiring to the position of the second via. That is to say, the terminal wiring information and the decoupling capacitor placement information shows the connection path from the power source terminal to the ground terminal by way of the decoupling capacitor.

The path duplication determiner 1e make reference to the connection path storage 1d, and determine whether there is duplication between the new connection path and the already-existing connection path.

In the event that there is duplication in the connection paths, the path re-searcher 1f change the position of the second decoupling capacitor, and re-search a connection path between the terminals connected by the second decoupling capacitor, which is by way of the second decoupling capacitor but is not duplicate of the new connection path.

The connection path updater 1g stores the new connection path in the connection path storage 1d in the event that no duplication has been detected in the connection paths. In the event that duplication has been detected in the connection paths, the connection path updater 1g delete the already-existing connection path which has been the object of re-searching, from the connection path storage 1d, and store the connection path obtained by the re-searching and the new connection path in the connection path storage 1d.

With such a printed circuit board design assisting device, first, the research object terminal selector 1b select one power source terminal of the grid array package part at a time, as a research object terminal. Next, the connection path searcher 1c search a new connection path between the selected research object terminal and one of the ground terminals, by way of a first decoupling capacitor. The path duplication determiner 1e determine whether there is duplication between the new connection path and an already-existing connection path. In the event that no duplication has been detected between the connection paths, the connection path updater 1g stores the new connection path in the connection path storage 1d.

In the event that duplication has been detected in the connection paths, the path re-searcher 1f change the position of the second decoupling capacitor, and re-search a connection path between the terminals connected by the second decoupling capacitor, which is by way of the second decoupling capacitor but is not duplicate of the new connection path. The connection path updater 1g delete the already-existing connection path which has been the object of re-searching, from the connection path storage 1d, and store the connection path obtained by the re-searching and the new connection path in the connection path storage 1d.

Thus, the position of decoupling capacitors placed between a power source terminal and ground terminal, and wiring from the decoupling capacitor to each of the terminals, can be determined automatically.

Note that grid array package parts include BGA parts and LGA parts. Hereinafter, the placement situation of decoupling capacitors to be connected to terminals will be described using BGA parts as an example.

Figure 2:
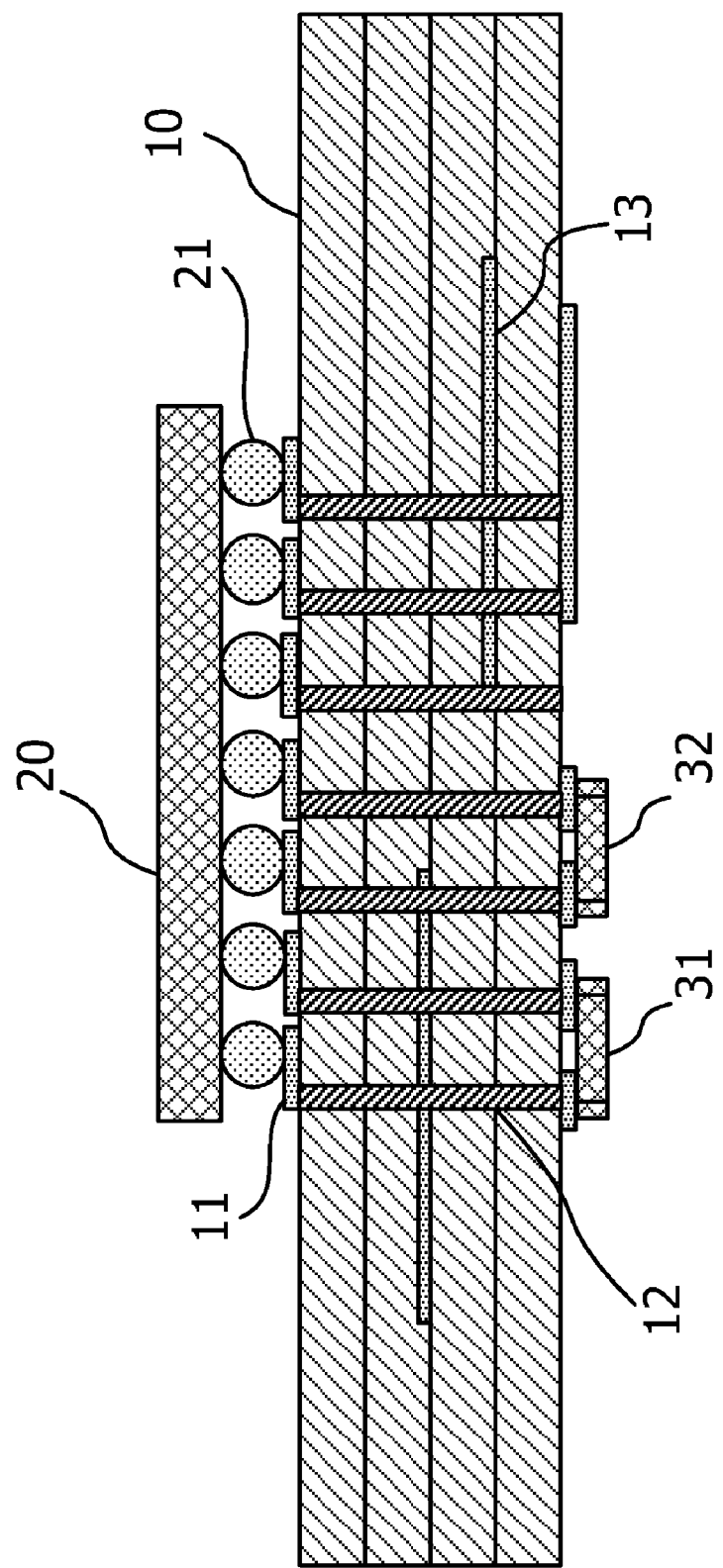
FIG. 2 is a cross-sectional view of a printed circuit board mounting a BGA part.

FIG. 2 is a cross-sectional diagram of a printed circuit board mounting a BGA part. FIG. 2 shows an example of a printed circuit board 10 mounting a BGA part 20. Multiple mounting pads 11 are provided on the upper face of the printed circuit board 10 at positions matching the terminals of the BGA part 20. In the example in FIG. 2, lines are formed from multiple vias 12 to mounting pads 11. Note that the insides of the vias 12 are filled in with an electroconductive material, and that parts can be mounted on places where vias 12 are formed. Such a configuration wherein mounting pads 11 are formed at the positions of vias 12 is called COH (Chip on Hole).

The BGA part 20 has multiple solder bumps 21 provided to each of the terminals disposed on the lower face thereof. The solder bumps 21 are joined to the mounting pads 11 of the printed circuit board 10. The reflow soldering is performed by passing the printed circuit board 10 with the BGA part 20 thereupon through a reflow furnace, in a state in which the solder bumps 21 are in contact with the mounting pads 11 of the printed circuit board 10.

The vias 12 vertically penetrate the printed circuit board 10, with the insides thereof being filled with an electroconductive material such as copper or the like. The vias 12 are connected to the lower face of the printed circuit board 10 and internal lines 13.

Decoupling capacitors 31 and 32 are mounted to lines 13 formed on the lower face of the printed circuit board 10. Each of the decoupling capacitors 31 and 32 has one terminal connected to a via connected to the power source terminal of the BGA part 20, and the other connected to a via connected to the ground (GND) terminal. Thus, noise generated at the power source terminals of the BGA part 20 is removed by the decoupling capacitors 31 and 32.

Such decoupling capacitors are provided near the power source terminals of the BGA part 20. Accordingly, a great number of decoupling capacitors are placed on the face of the printed circuit board 10 opposite to the face on which the BGA part 20 is mounted, in a region corresponding to the position of the BGA part 20 on the opposite face. Determining the placement of such decoupling capacitors can be easily performed by using the printed circuit board design assisting device shown in FIG. 1.

That is to say, the printed circuit board design assisting device detects candidates for vias whereby wiring to the power source terminal can be performed, and detects the placement locations of decoupling capacitors which can be connected to candidate vias. In the event that there is already another decoupling capacitor at the placement location of the decoupling capacitor at that time, the printed circuit board design assisting device shifts the position of the other decoupling capacitor. In the event that there is yet another decoupling capacitor where the other decoupling capacitor is to be shifted, the printed circuit board design assisting device shifts the position of the yet another decoupling capacitor as well. Thus, shifting the position of other decoupling capacitors which are affected by placement of the new decoupling capacitor, a little at a time, allows maximal placement of decoupling capacitors.

Processing wherein a decoupling capacitor which has been already placed is shifted to secure a placement location for a new decoupling capacitor will be described with reference to FIGS. 3A through 5C.

Figure 3A:
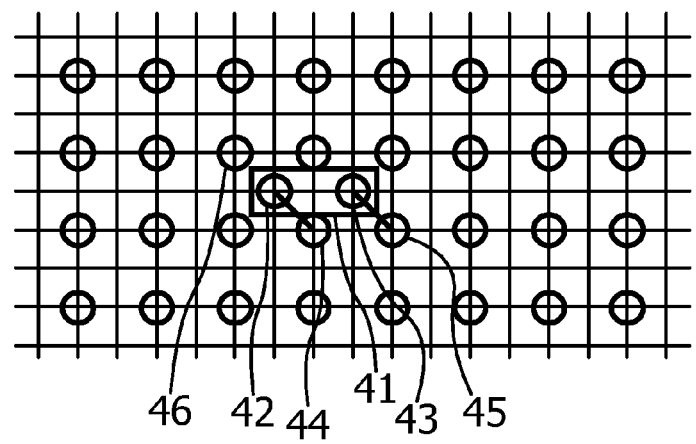
FIGS. 3A through 3C illustrate decoupling capacitor placement processing (part 1)
Figure 3B:
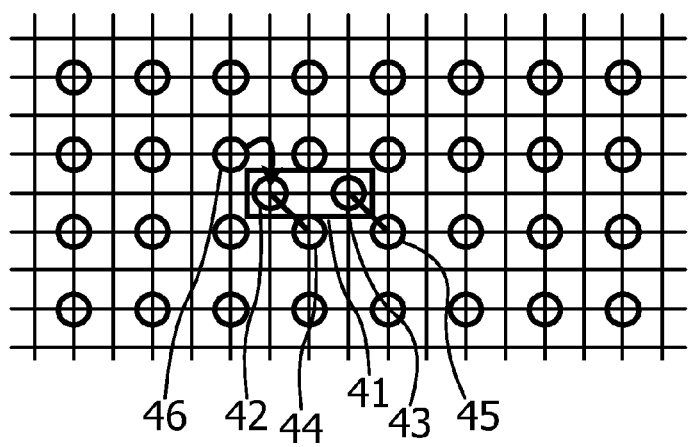
Figure 3C:
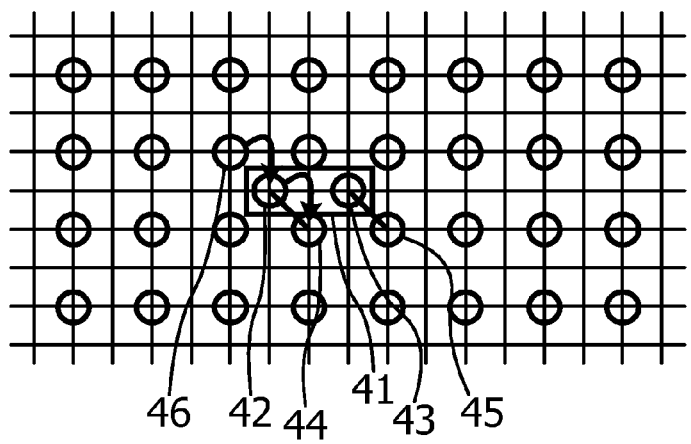

FIGS. 3A through 3C illustrate placement processing of a decoupling capacitor. In FIGS. 3A through 3C, as well as in the subsequent FIGS. 4A through 5C, the terminals of the BGA part, vias, decoupling capacitors, and wiring lines, are shown projected on a plane (X-Y plane) parallel to the upper face and lower face of the printed circuit board.

The first state (ST1) illustrates a state partway through placing a decoupling capacitor to be connected to the terminals of the BGA part. In this state, a decoupling capacitor 41 has already been placed. The decoupling capacitor 41 may be connected to two vias 42 and 43. The via 42 may be connected to a terminal 44 of the BGA part by wiring, and the via 43 may be connected to a terminal 45 of the BGA part by wiring. We will say that a placement location for connecting a decoupling capacitor to a terminal 46 is to be detected in such a state.

The second state (ST2) illustrates a state wherein a candidate for a via by which to connect to the terminal 46 of the BGA part has been selected. In this example, the via 42 has been selected as a via candidate by which to connect to the terminal 46. Accordingly, a search is made for a terminal already connected to the via 42, tracing the line from the via 42.

The third state (ST3) illustrates a state wherein a connection destination is being searched for the via 42. The search reveals that the via 42 has already been connected to the terminal 44. Accordingly, a search is made for another via to connect the terminal 44 to, in order to connect the terminal 46 to the via 42.

Figure 4A:
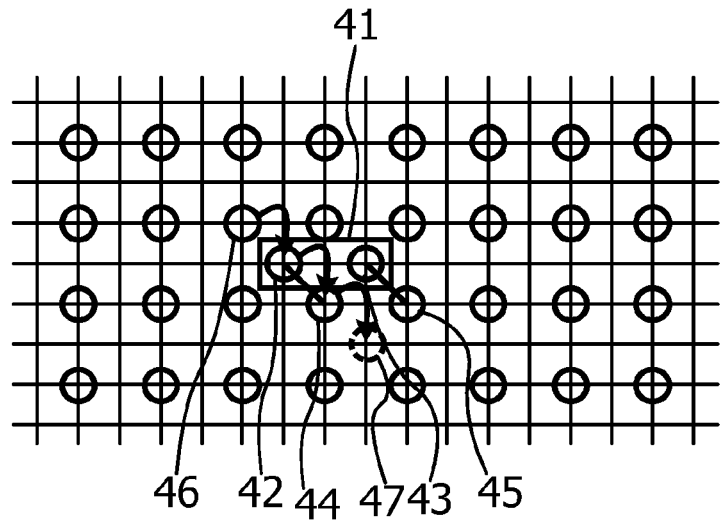
FIGS. 4A through 4C illustrate decoupling capacitor placement processing (part 2)
Figure 4B:
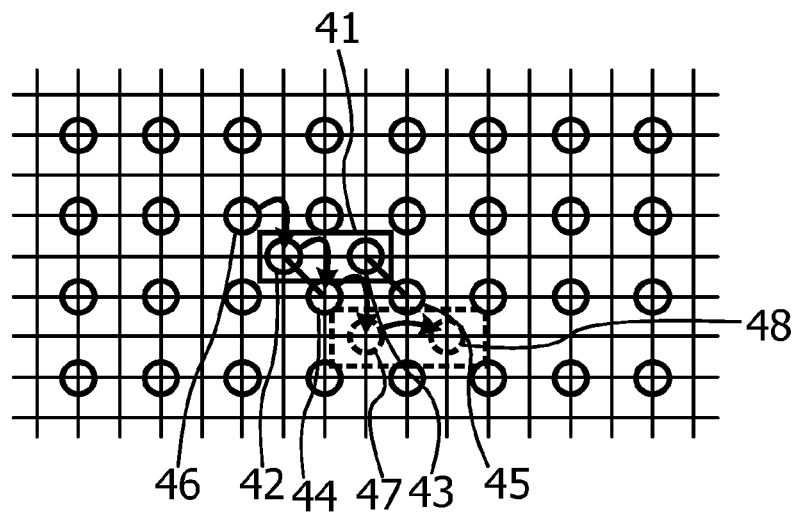
Figure 4C:
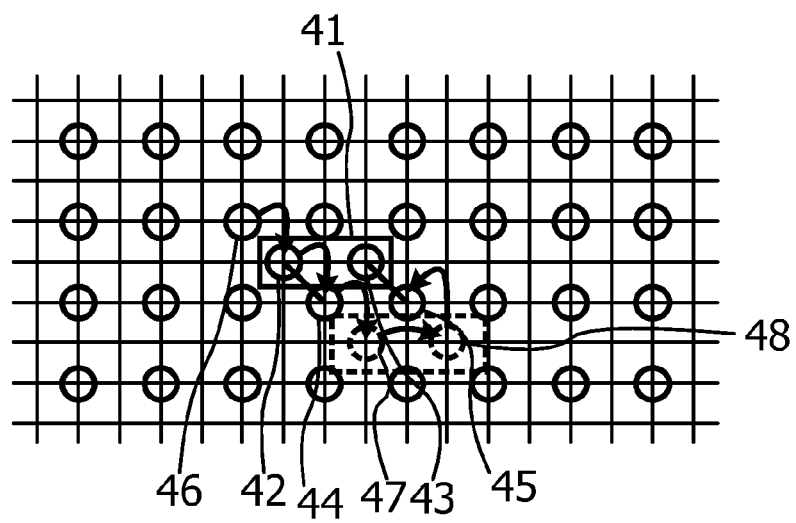

FIGS. 4A through 4C illustrate placement processing situation of the decoupling capacitor. The fourth state (ST4) illustrates a state wherein a via to serve as a candidate for another via to connect the terminal 44 to is being searched for. In this example, a candidate for the via 47 is detected to the lower right of the terminal 44. The decoupling capacitor 41 is already connected to the terminal 44, so in the event that the via which is the connection destination of the terminal 44 is changed, and position of the decoupling capacitor 41 also changes at the same time.

The fifth state (ST5) illustrates a state wherein the moving destination of the decoupling capacitor 41 is being searched. In this case, a new via 48 is provided to the right of the via 47, and the positions of connecting to the via 47 and via 48 are candidates of the moving destination of the decoupling capacitor 41. In the case of moving the decoupling capacitor 41, the via which is the connection destination of the other terminal 45 connected to the decoupling capacitor 41 is also changed.

The sixth state (ST6) illustrates a state wherein the terminal 45 has been selected as the terminal to connect to the via 48. Thus, it has been determined that the position of the decoupling capacitor 41 can be moved. Moving the decoupling capacitor 41 enables connection of the terminal 46 to the via 42. A search is performed for a placement location for the decoupling capacitor, so as to connect the decoupling capacitor which is to be connected to the terminal 46, to the via 42.

Figure 5A:
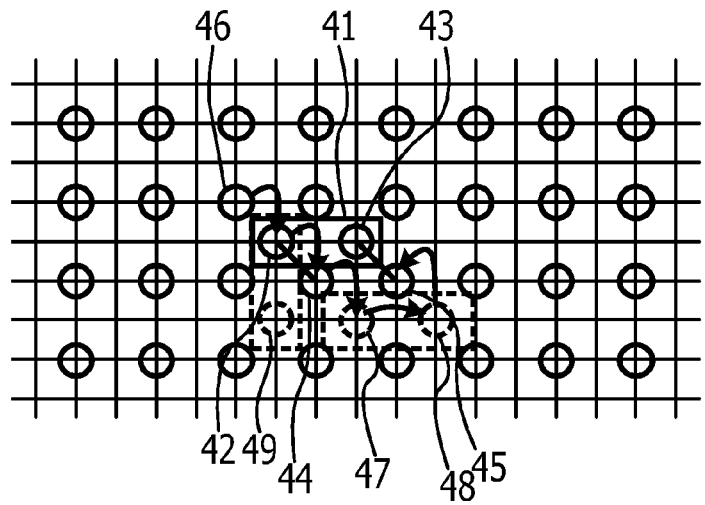
FIGS. 5A through 5C illustrate decoupling capacitor placement processing (part 3)
Figure 5B:
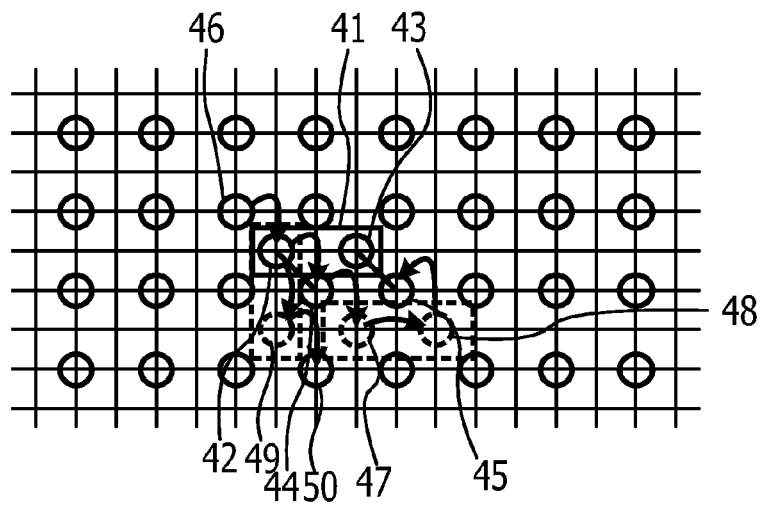
Figure 5C:
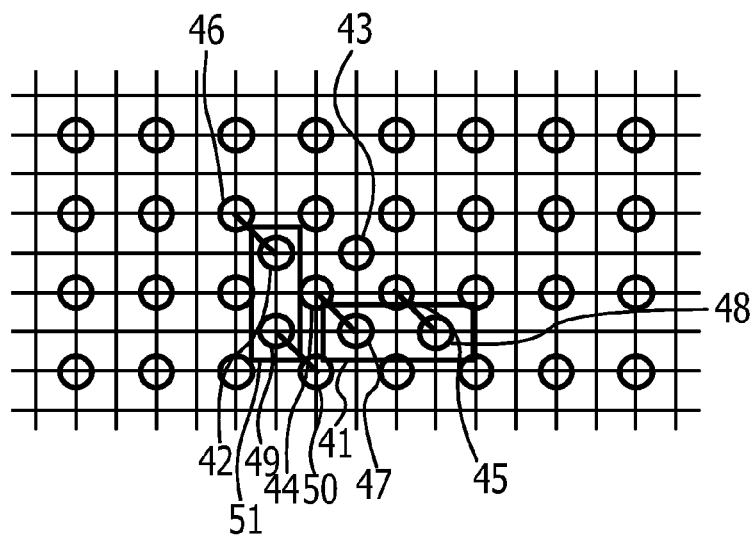

FIGS. 5A through 5C illustrate a placement processing situation of the decoupling capacitor. The seventh state (ST7) illustrates a state wherein the placement location of the decoupling capacitor to be connected to the terminal 46 is being searched. In this example, a new via 49 is provided below the via 42, and the positions of connecting to the via 42 and via 49 are candidates of the placement location of the decoupling capacitor.

When placing a decoupling capacitor, if one side may be connected to a power source terminal, the other side will be connected to a ground terminal. Accordingly, a ground terminal to which connection can be made is searched from placement locations serving as candidates for the new decoupling capacitor.

The eighth state (ST8) illustrates a state wherein a ground terminal which can be connected from the new decoupling capacitor is being searched for. In this example, a terminal 50 is detected as a ground terminal. Due to the terminal 50 being detected, it has been determined that the decoupling capacitor can be placed at the candidate location. Accordingly, the moving of the decoupling capacitor 41 and the placement of the new decoupling capacitor are finalized.

The ninth state (ST9) illustrates a state wherein a new decoupling capacitor 51 has been placed. The decoupling capacitor 41 has been moved, the terminal 46 may be connected to the via 42, and the decoupling capacitor 51 for the terminal 46 is placed at the position of the via 42.

The case illustrated in FIGS. 3A through 5C is an example wherein the placement location of the decoupling capacitor 51 can be secured simply by shifting the position of one decoupling capacitor 41. However, unlike this case, there are cases wherein another decoupling capacitor has already been placed at the movement destination of the decoupling capacitor 41. In this case, the position of the decoupling capacitor situated at the movement destination of the decoupling capacitor 41 will also be shifted. Thus, other decoupling capacitors which are an obstruction to the moving of a decoupling capacitor already placed are shifted in order. Thus, the placement location of the decoupling capacitor 51 to be newly placed can be secured in a sure manner.

Note that this is not restricted to placement of decoupling capacitors, and reconfiguration is also performed as necessary regarding connection relations between vias and terminals which have already been decided in the processing for determining the position of vias for wiring from the terminals of the BGA part 20. Now, processing for shifting wiring that has been set, in order to secure vias serving as new placement destinations from terminals, will be described with reference to FIGS. 6A through 8C.

Figure 6A:
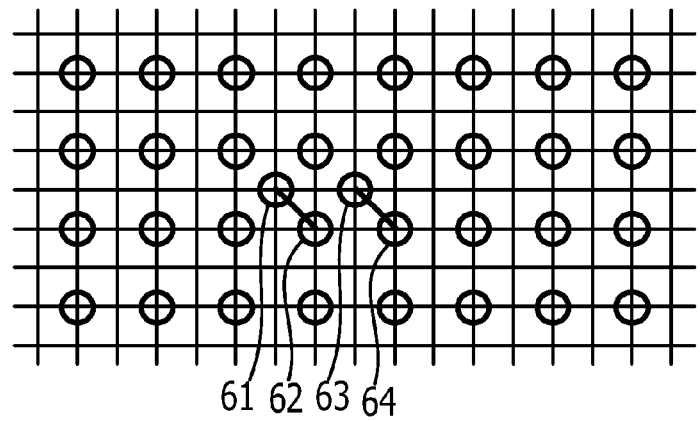
FIGS. 6A through 6C illustrate processing for securing vias for terminal wiring (part 1)
Figure 6B:
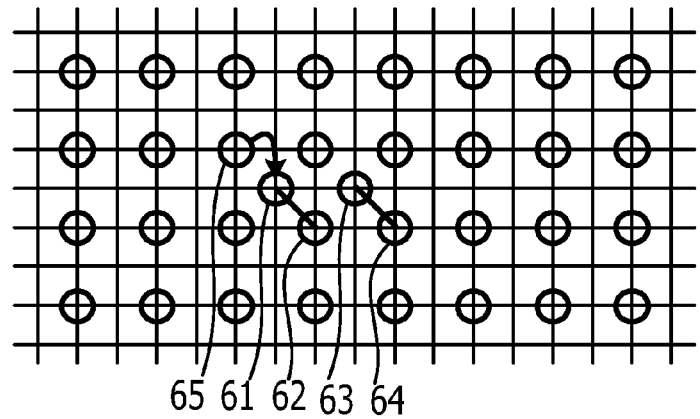
Figure 6C:
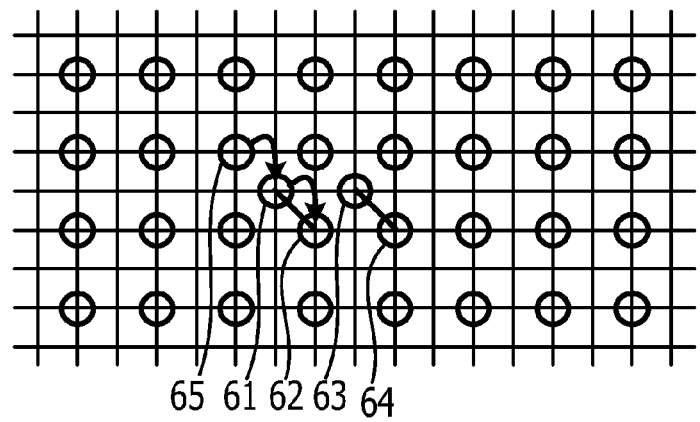

FIGS. 6A through 6C illustrate a state of processing for securing vias for wiring terminals. In FIGS. 6A through 6C, as well as in the subsequent FIGS. 7A through 8C, the terminals of the BGA part, vias, and wiring lines, are shown projected on a plane parallel to the upper face and lower face of the printed circuit board.

The eleventh state (ST11) illustrates a state partway through determining the position of vias to connect wiring from the terminals of the BGA part. In this state, formation of two vias 61 and 63 have already been determined. A terminal 62 may be connected to a via 61, and a terminal 64 may be connected to a via 63.

The twelfth state (ST12) illustrates a state wherein a candidate for a via to be connected to a terminal 65 of the BGA part has been selected. In this example, a via 61 has been selected as a candidate for the via to be connected to the terminal 65. Accordingly, a search is made for a terminal already connected to the via 61, tracing the line from the via 61.

The thirteenth state (ST13) illustrates a state wherein a connection destination is being searched for the via 61. The search reveals that the via 61 has already been connected to the terminal 62. Accordingly, a search is made for another via to connect the terminal 62 to, in order to connect the terminal 65 to the via 61.

Figure 7A:
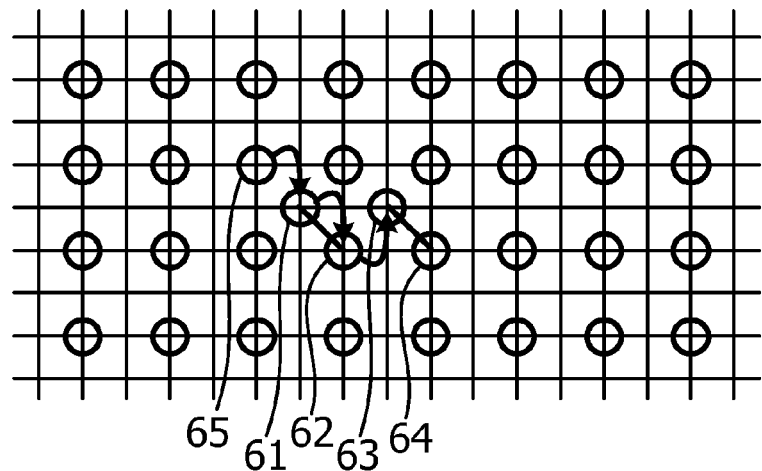
FIGS. 7A through 7C illustrate processing for securing vias for terminal wiring (part 2)
Figure 7B:
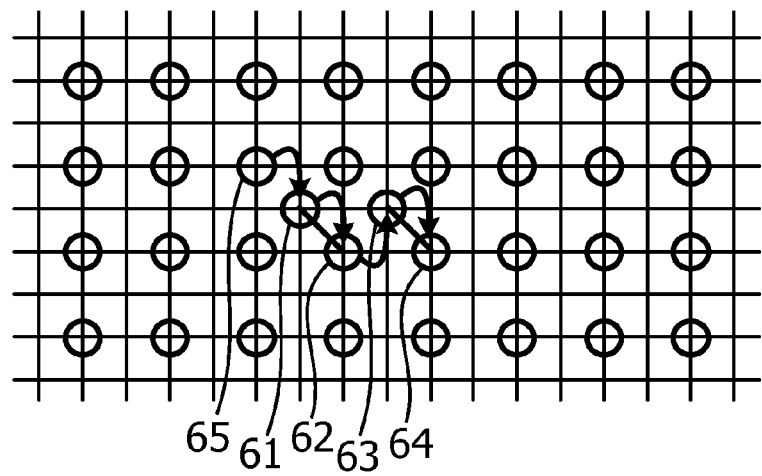
Figure 7C:
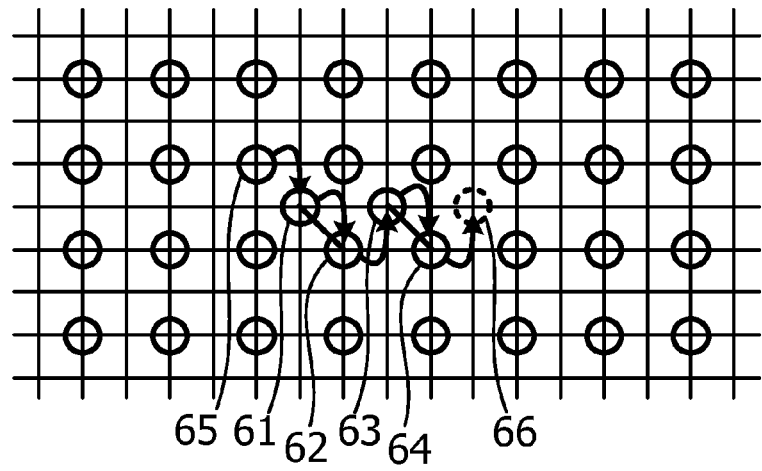

FIGS. 7A through 7C illustrate a state of processing for securing vias for wiring terminals. The fourteenth state (ST14) illustrates a state wherein a via to serve as a candidate for the connection destination for the terminal 62 is being searched for. In this example, the via 63 to the upper right of the terminal 62 has been selected as a candidate for the connection destination. Accordingly, the line is traced from the via 63, and the terminal already connected to the via 63 is searched for.

The fifteenth state (ST15) illustrates a state wherein a connection destination is being searched for the via 63. The search reveals that the via 63 has already been connected to the terminal 64. Accordingly, a search is made for another via to connect the terminal 64 to, in order to connect the terminal 62 to the via 63.

The sixteenth state (ST16) illustrates a situation of searching for a via to serve as a candidate for another connection destination for the terminal 64. In this example, a new via 66 formed to the upper right of the terminal 64 has been selected as a candidate for the connection destination. The via 66 is newly formed, and accordingly may be connected to none of the terminals. Thus, it is revealed that the terminal 64 can be connected to the via 66 without changing the connection relations between other terminals and vias.

Figure 8A:
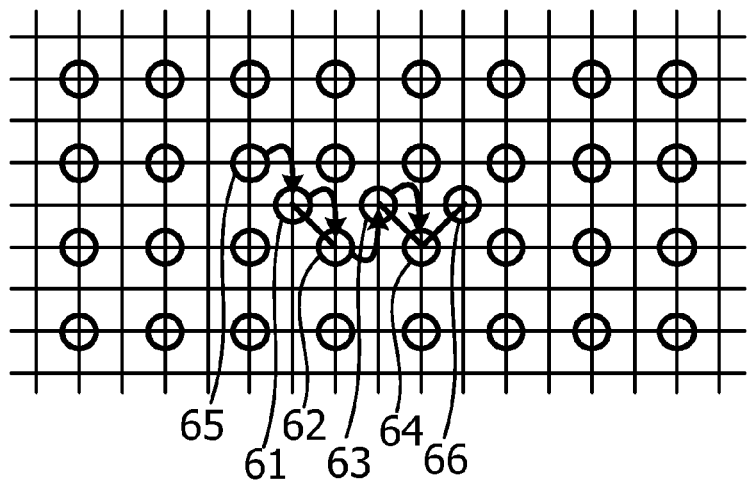
FIGS. 8A through 8C illustrate processing for securing vias for terminal wiring (part 3)
Figure 8B:
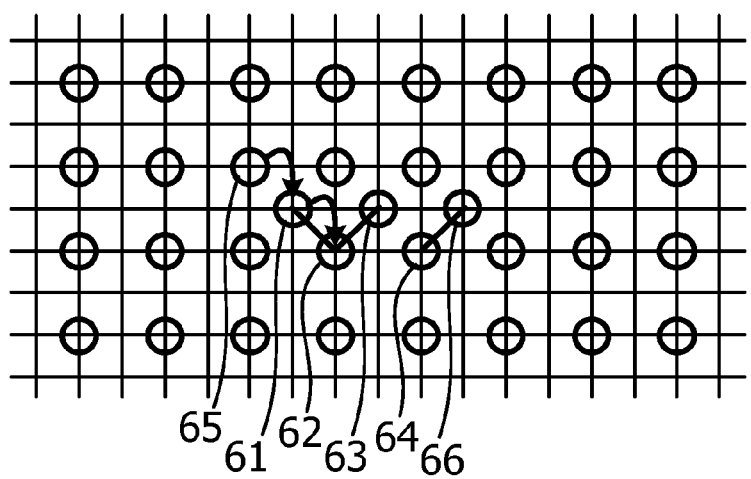
Figure 8C:
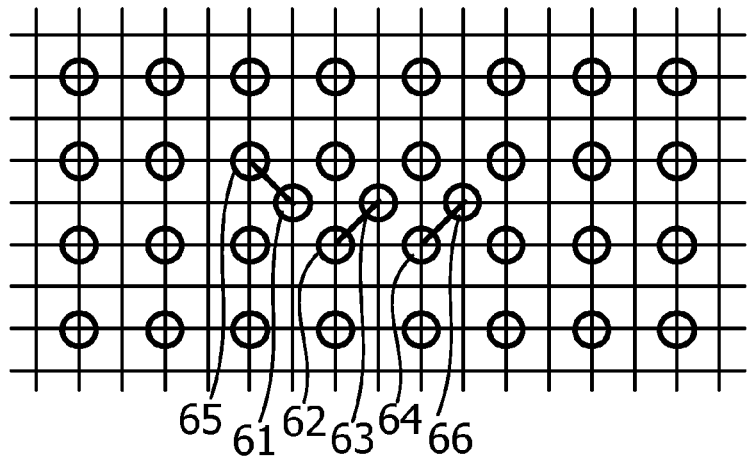

FIGS. 8A through 8C illustrate a state of processing for securing vias for wiring terminals. The seventeenth state (ST17) illustrates the situation of finalization of the via serving as the connection destination of the terminal 64. Connecting the terminal 64 to the via 66 has been finalized. Accordingly, the connection relation between the terminal 64 and via 63 is resolved.

The eighteenth state (ST18) illustrates the situation of finalization of the via serving as the connection destination of the terminal 62. Connecting the terminal 62 to the via 63 is finalized due to the connection relation between the terminal 64 and via 63 having been resolved. Accordingly, the connection relation between the terminal 62 and via 61 is resolved.

The nineteenth state (ST19) illustrates the situation of finalization of the via serving as the connection destination of the terminal 65. Connecting the terminal 65 to the via 61 is finalized due to the connection relation between the terminal 62 and via 61 having been resolved.

Thus, the via 61 to serve as the connection destination of the terminal 65 is secured.

Manually performing operations for moving the position of decoupling capacitors and changing the connection relations of wiring, such as described above, is extremely time and labor consuming. With the present embodiment, moving the position of decoupling capacitors and changing the connection relations of wiring are executed automatically by the printed circuit board design assisting device. Accordingly, the task of determining the placement of decoupling capacitors and the positions for forming vias for connection to BGA part terminals is facilitated.

An exemplary second embodiment of a printed circuit board design assisting device includes functions useful for placement of decoupling capacitors. The printed circuit board design assisting device according to the second embodiment can be realized by causing a computer, for example, to execute a printed circuit board design assisting program.

With the printed circuit board design assisting device according to the second embodiment, the following implementations may be included.

(1) The printed circuit board design assisting device has a database with a data structure wherein the association between a BGA part and decoupling capacitors is clarified. In this database is registered the association between the terminals of a BGA part and decoupling capacitors, in addition to the association among parts.

(2) The printed circuit board design assisting device groups decoupling capacitors under predetermined conditions. Grouped decoupling capacitors are given an order of priority, so that a greater number of the more important decoupling capacitors is placed with priority. Examples of the types of orders of priority include higher priority for analog systems, the order of voltage values, pin count classified by power source voltage values, and so on. With the present embodiment, we will say that the lower the power source voltage is that the decoupling capacitor will be connected to, the higher the priority. Decoupling capacitors connected to lower power source voltage have little noise margin. Accordingly, the reliability of the printed circuit board can be improved by connecting the decoupling capacitors in a sure manner.

(3) The printed circuit board design assisting device performs outline wiring from the BGA part to the decoupling capacitors at the same time as positioning the decoupling capacitors.

(4) The printed circuit board design assisting device configures sub-groups wherein the decoupling capacitors grouped by BGA parts are further classified by power source voltage values. Objects representing the decoupling capacitors for each sub-group are displayed temporarily placed around a BGA part.

(5) The printed circuit board design assisting device accepts instruction of two outline techniques for wiring from the terminals of the BGA part, which are direct via outline to pins, and via outline to positions shifted half-grid on both the X and Y directions from the inter-terminal grid of the BGA part. The printed circuit board design assisting device then determines the placement position of the decoupling capacitors based on the specified technique.

(6) The printed circuit board design assisting device gives priority to placement wherein the mounting direction of the decoupling capacitors is unified in the same radial direction, taking into consideration the ease of wiring from the BGA part terminals.

(7) The printed circuit board design assisting device controls whether to permit placement to a cross-shaped boundary portion generally provided within BGA parts, where situating vias for wiring is avoided whenever possible.

(8) After selecting a BGA part and decoupling capacitor, the printed circuit board design assisting device displays connection lines between the two.

(9) The printed circuit board design assisting device recognizes the voltage of the power source configuring the BGA part, and inspects whether an appropriate number of decoupling capacitors has been connected to the power source terminal group.

(10) The printed circuit board design assisting device has mounting conditions for BGA parts and decoupling capacitors correlated therewith, and verifies whether mounting is being performed that conforms to the mounting conditions.

By combining these functions, design tasks relating to determining of placement positions of decoupling capacitors as to the printed circuit board is facilitated, and also printed circuit boards with high reliability can be designed.

Figure 9:
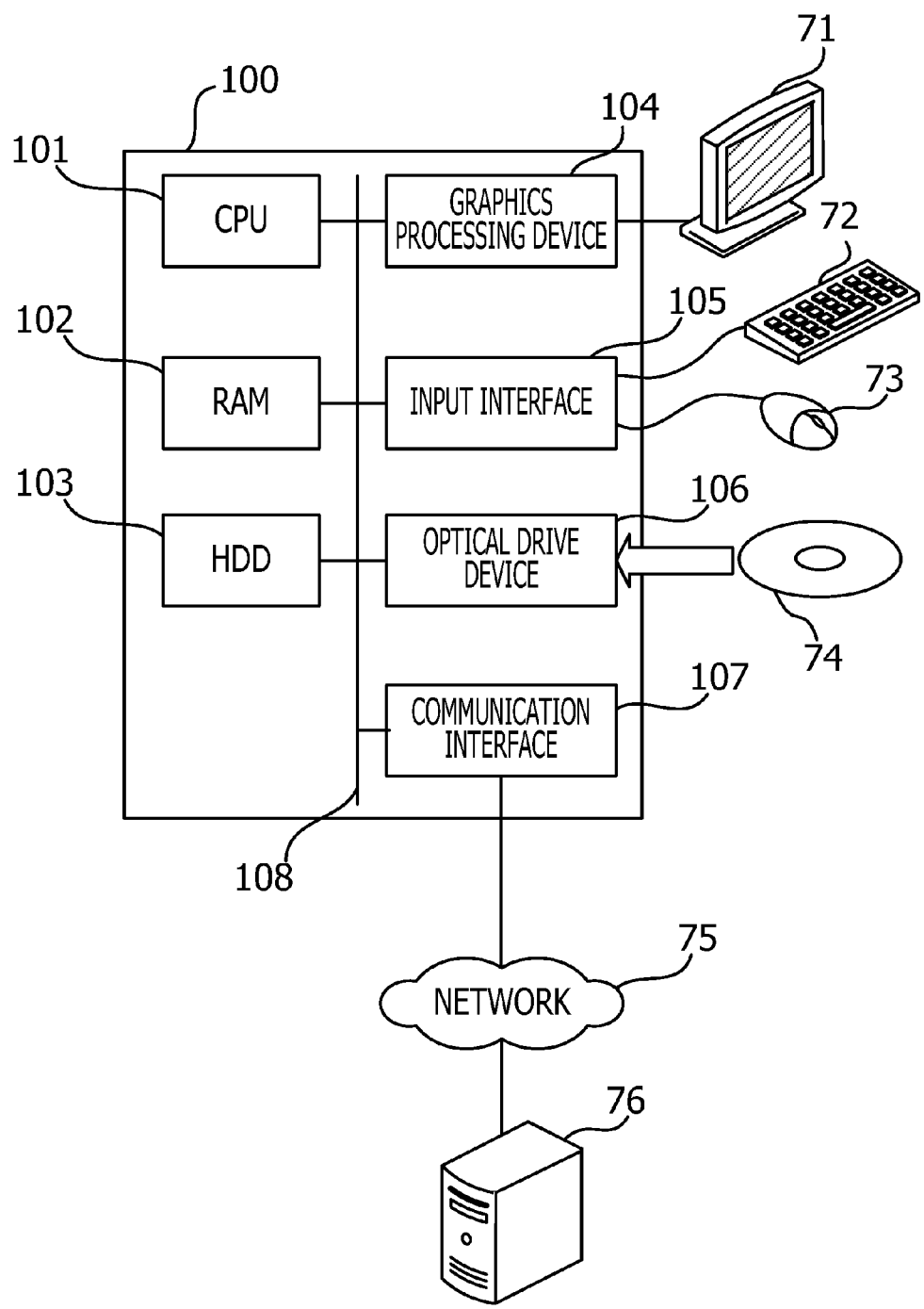
FIG. 9 illustrates a hardware configuration example of a printed circuit board design assisting device.

FIG. 9 illustrates an example of the hard ware configuration of a printed circuit board design assisting device. A printed circuit board design assisting device 100 is controlled in its entirety by a CPU (Central Processing Unit) 101. RAM (Random Access Memory) 102 and multiple peripheral devices are connected to the CPU 101 via a bus 108.

The RAM 102 is used as a primary storage device for the printed circuit board design assisting device 100. At least a part of an OS (Operating System) and application programs to be executed by the CPU 101 are temporarily stored in the RAM 102. Also, the RAM 102 stores various types of data necessary for processing which the CPU 101 performs.

Examples of peripheral devices connected to the bus 108 include a hard disk drive (may be abbreviated to the acronym "HDD") 103, graphics processing device 104, input interface 105, optical drive device 106, and communication interface 107.

The HDD 103 magnetically performs writing/reading of data to/from a built-in disk. The HDD 103 is used as a secondary storage device for the printed circuit board design assisting device 100. The HDD 103 stores OS programs application programs, and various types of data. Semiconductor storage devices such as flash memory or the like may also be used for a secondary storage device.

A monitor 71 may be connected to the graphics processing device 104. The graphics processing device 104 displays screens on the monitor 71 in accordance with commands from the CPU 101. Examples of the monitor 71 include display devices using a CRT (Cathode Ray Tube), liquid crystal display devices, and so forth.

A keyboard 72 and mouse 73 are connected to the input interface 105. The input interface 105 transmits signals transmitted from the keyboard 72 and mouse 73 to the CPU 101. Note that the mouse 73 is one example of a pointing device, and that other pointing devices may be used instead. Examples of other pointing devices include touch panels, tablets, touch pads, trackballs, and so forth.

The optical drive device 106 uses laser beams or the like to read data recorded in an optical disc 74. The optical disc 74 is a portable recording medium in which data is recorded so as to be readable by reflection of light. Examples of optical discs 74 include DVDs (Digital Versatile Discs), DVD-RAM, CD-ROM (Compact Disc Read Only Memory), CD-R (Recordable)/RW (ReWritable), and so forth.

The communication interface 107 may be connected to a network 75. The communication interface 107 exchanges data with other computers such as a server 76 and the like via the network 75.

The processing functions of the present embodiment can be realized by a hardware configuration such as described above.

Figure 10:
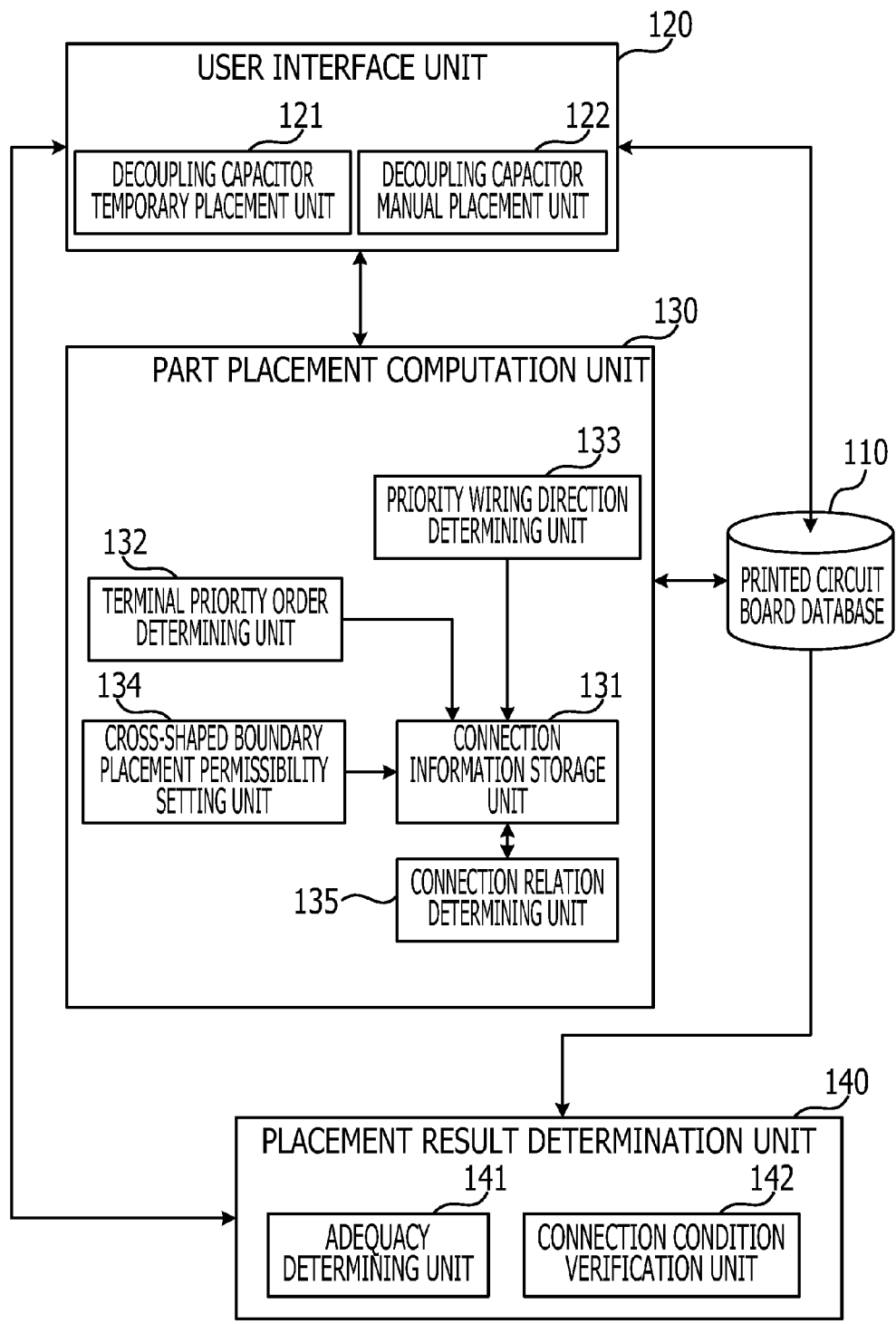
FIG. 10 is a functional block diagram of a printed circuit board design assisting device.

FIG. 10 is a functional block diagram of the printed circuit board design assisting device 100. The printed circuit board design assisting device 100 has a printed circuit board database 110, a user interface unit 120, a part placement computation unit 130, and a placement result determination unit 140.

The printed circuit board database 110 is a database storing information relating to the structure of the printed circuit board, information relating to the BGA part to be mounted to the printed circuit board, information relating to decoupling capacitors to be connected to the terminals of the BGA part, and so forth. Also, information clarifying the association between the BGA part and the decoupling capacitors is stored in the printed circuit board database 110. A portion of the storage region of the HDD 103, for example, is used as the printed circuit board database 110.

The user interface unit 120 is a user interface which, upon receiving operation input from the designer of the printed circuit board, displays a screen for printed circuit board designing. The user interface unit 120 includes a decoupling capacitor temporary placement unit 121 and a decoupling capacitor manual placement unit 122.

The decoupling capacitor temporary placement unit 121 configures sub-groups of decoupling capacitors correlated with terminals of the BGA part, classified by power source voltage values. The decoupling capacitor temporary placement unit 121 then displays the decoupling capacitors in sub-groups temporarily placed in predetermined positions on the printed circuit board design screen.

The decoupling capacitor manual placement unit 122 places the decoupling capacitors at the predetermined positions on the printed circuit board in accordance with the operation input form the designer. Also, upon a decoupling capacitor being selected, the decoupling capacitor manual placement unit 122 displays connecting lines between the selected decoupling capacitor and the terminals of the BGA part with which the decoupling capacitor has been correlated. Displaying the connection lines enables the association to be visually recognized. The decoupling capacitor manual placement unit 122 stores the information of the placed decoupling capacitors in the printed circuit board database 110.

The part placement computation unit 130 obtains, by computation, the positions of decoupling capacitors to be mounted to the printed circuit board, the positions of vias to which outline wiring from the terminals of the BGA part are to be connected to, and so forth. the part placement computation unit 130 then stores the computation results in the printed circuit board database 110. In order to realize such functions, the part placement computation unit 130 includes a connection information storage unit 131, a terminal priority order determining unit 132, a priority wiring direction determining unit 133, a cross-shaped boundary placement permissibility setting unit 134, and a connection relation determining unit 135.

The connection information storage unit 131 is a storage function for storing information regarding outline wiring for BGA part terminals and information regarding placement locations of decoupling capacitors, at a partway state when the connection relation determining unit 135 is partway through computation processing. A part of the storage region of the RAM 102, for example, serves as the connection information storage unit 131.

The terminal priority order determining unit 132 sets an order of priority to the decoupling capacitors correlated with the terminals of the BGA part, determined according to the placement locations thereof. For example, the terminal priority order determining unit 132 sets the priority of decoupling capacitors correlated with terminals with low voltage values to a high priority. The terminal priority order determining unit 132 can also set the priority of decoupling capacitors correlated with signal terminals of an analog system to a high priority. Further, the terminal priority order determining unit 132 can set the order of priority for decoupling capacitors correlated with power source voltage terminals having a small terminal count (or great terminal count), depending on the number of terminals classified according to the power source voltage values. According to an exemplary embodiment, an order of priority of decoupling capacitors correlated with low-voltage terminals is to be set high. This is because low-voltage terminals are readily affected by noise, and accordingly there is a greater need for such low-voltage terminals to be connected to decoupling capacitors.

The priority wiring direction determining unit 133 determines a position to serve as an object of consideration with priority, at the time of considering positions of vias for wiring the terminals of the BGA part. Specifically, more vias are wired radially from terminals to the vias, the higher the priority wiring direction determining unit 133 sets the priority of the object of consideration. The priority wiring direction determining unit 133 then arrays candidates for via positions to be wired from the terminals within the connection information storage unit 131 in order according to priority.

The cross-shaped boundary placement permissibility setting unit 134 sets whether to place decoupling capacitors in a cross-shaped boundary region passing through the center of the BGA part. Specifically, in the event that decoupling capacitors are not to be placed in the cross-shaped boundary, the cross-shaped boundary placement permissibility setting unit 134 sets a flag for via formable positions in the region indicating that the position has already been researched as a via formation candidate. Setting this flag excludes the position for being a via formation candidate. If a via is not formed, there will be no decoupling capacitors placed in that region, either. On the other hand, in the event that decoupling capacitors are to be placed in the cross-shaped boundary, the cross-shaped boundary placement permissibility setting unit 134 sets a flag for via formable positions in the region indicating that the position has not yet been researched as a via formation candidate. This includes via formable positions in the cross-shaped boundary as the object of consideration, which also enables decoupling capacitors to be placed there.

The connection relation determining unit 135 sequentially selects terminals of the BGA part within the connection information storage unit 131 in order from those with high order of priority. The connection relation determining unit 135 then determines the placement location of the decoupling capacitors correlated with the selected terminals. Note that for the positions to form vias for connection of wiring from the terminals, the connection relation determining unit 135 considers whether the candidate positions around a certain via will have wiring following the order of priority determined by the priority wiring direction determining unit 133. Accordingly, a placement wherein the mounting directions of decoupling capacitors are unified in the same direction can be given priority. Unifying the wiring direction as much as possible allows the decoupling capacitors to be arrayed in an orderly fashion. Decoupling capacitors arrayed in an orderly fashion result in less empty space, so a greater number of decoupling capacitors can be placed.

Also, the connection relation determining unit 135 excludes, from the object of consideration, positions regarding which an researched flag has been set as a via formation candidate position, from consideration as a via formation candidate position for wiring from a terminal. Thus, whether decoupling capacitors are placed in the cross-shaped boundary region at the middle of the BGA part can be controlled.

The placement result determination unit 140 makes reference to the printed circuit board database 110 to evaluate the placement result of the decoupling capacitors. The evaluation results are displayed on the monitor 71 via the user interface unit 120. The placement result determination unit 140 has an adequacy determining unit 141 and a connection condition verification unit 142 to evaluate the placement results of decoupling capacitors.

The adequacy determining unit 141 groups the BGA part with the decoupling capacitors necessary therefore. The adequacy determining unit 141 then recognizes the power source voltage of power source terminals of the BGA part, and calculates the ratio of terminals of the power source terminal group to which decoupling capacitors are connected.

The connection condition verification unit 142 verifies whether the placed decoupling capacitors satisfy connection conditions, based on the connection conditions of the BGA part and the decoupling capacitors correlated therewith.

Figure 11:
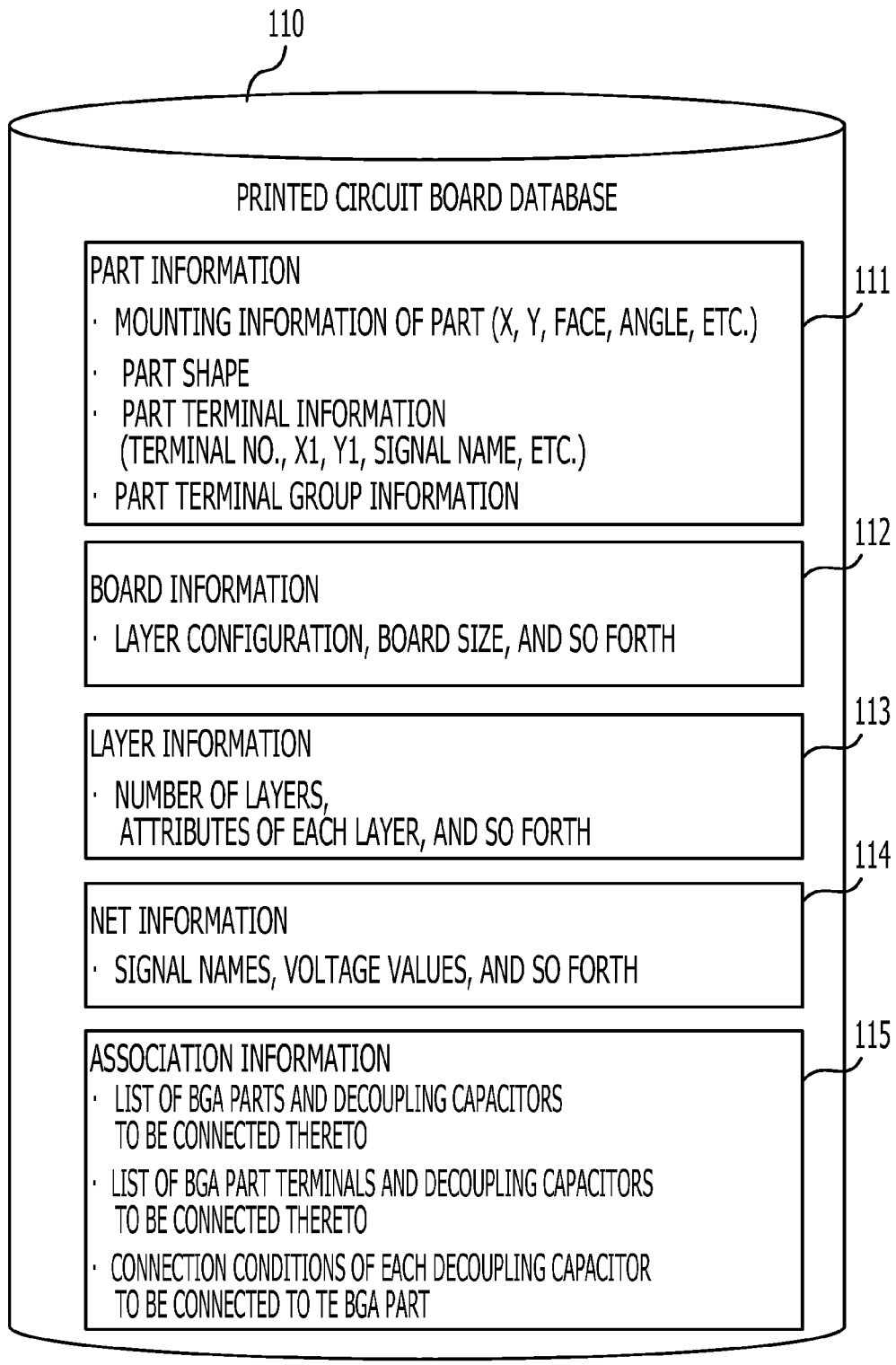
FIG. 11 illustrates an example of the data structure of a printed circuit board.

FIG. 11 illustrates an example of the data structure of the printed circuit board database 110. Stored in the printed circuit board database 110 are a part information 111, board information 112, layer information 113, net information 114, and association information 115.

The a part information 111 is information relating to the BGA part and decoupling capacitors to be mounted to the printed circuit board. The a part information 111 includes, for example, part mounting information for each of the parts, part shapes thereof, part terminal information, and part terminal group information.

The part mounting information includes the position of the part on the printed circuit board, the orientation of the part, and so forth. The position of the part is indicated by coordinates of reference points of parts in a world coordinate system defined regarding the printed circuit board, for example. The orientation of the parts is indicated by an angle between the world coordinates system and a local coordinates system of the part, for example.

As for the shape of parts, the vertices of each face making up a part are expressed as coordinates in a local coordinate system of the part, for example. The shape obtained by combining the faces is the shape of the part.

Part terminal information includes terminal Nos. of the terminals proceeded to the part, the positions of the terminals, the names of signals input/output to/from each terminal, and so on. The positions of the terminals are expressed as coordinates in a local coordinate system, for example. In the event that the part is a BGA part, the part terminal information includes identification information regarding whether each terminal is a power source terminal, signal terminal, or ground terminal. Further, for power source terminals of a BGA part, the part terminal information also includes information indicating the power source voltage.

Part terminal group information is information relating to the group to which each terminal belongs when the part terminals are grouped in accordance with the type of power source voltage.

The board information 112 is information relating to the printed circuit board. The board information 112 includes the layer configuration of the printed circuit board, the board size thereof, and so forth. The board information 112 also includes the positions of vias formed on the printed circuit board, the diameter of the vias, and so forth.

The layer information 113 is information relating to layers making up the printed circuit board. The layer information 113 includes, for example, the number of layers, the attributes of each layer, and so forth.

The net information 114 is information relating to the wiring on the printed circuit board. The net information 114 includes, for example, the names of signals passing through each line, voltage values thereof, and so on. The net information 114 also includes information relating to outline wiring from the BGA part to the vias, as well.

The association information 115 is information relating to the association between the BGA part and the decoupling capacitors. The association information 115 includes a list of BGA parts, and a list of decoupling capacitors to be connected to each BGA part. Also, the association information 115 includes a list of decoupling capacitors to be connected to each terminal of the BGA part. Further, the association information 115 includes connection conditions for each decoupling capacitor to be connected to the BGA part.

Information within the printed circuit board database 110 which affects determination of the placement location of decoupling capacitors is disclosed.

Figure 12:
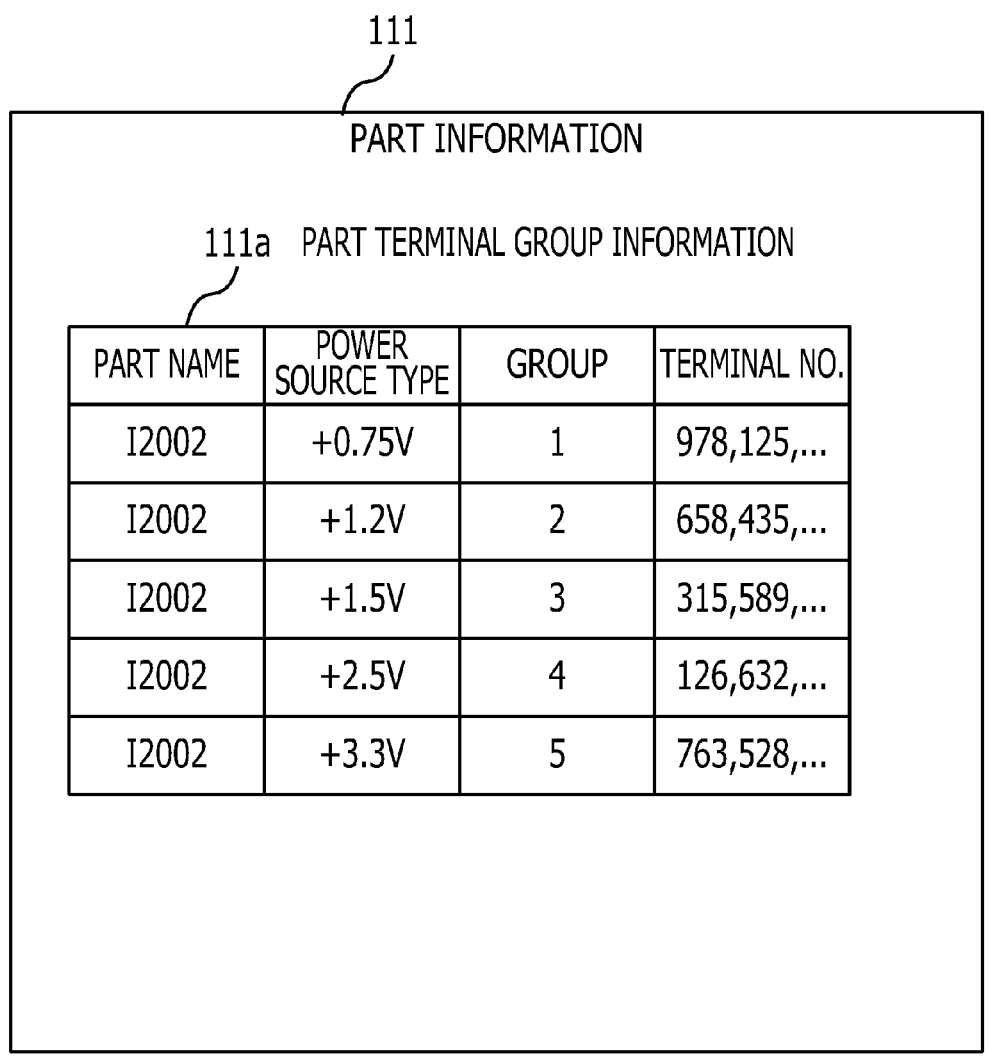
FIG. 12 illustrates an example of part terminal group information within part information.

FIG. 12 illustrates an example of part terminal group information within the part information. The part terminal group information 111a is of a table structure including columns for "part name", "power source type", "group", and "terminal No.". Each row of information under the columns is part terminal group information relating to one group. While the example shown in FIG. 12 has the part terminal group information 111a as a table structure, but other data structures may be employed.

Under the column "part name" is set the part No. of the BGA part which is the object of grouping. Under the column "power source type" is set the power source type of terminals belonging to the group. Under the column "group" is set an identification No. of the group. Under the "terminal No." is set an identification No. of the terminals belonging to the group (terminal No.).

FIG. 13 illustrates an example of the data structure of association information. The association information 115 has columns for "condition No." and "connection conditions". Under the column "condition No." is set an identification No. for connection conditions (condition No.). Under the column "connection conditions" is set connection conditions relating to the decoupling capacitors to be connected to each BGA part terminal.

The column "connection conditions" is broken down in to further columns of "condition name", "BGA part No.", "terminal No.", "mounting face", "tolerance distance", "voltage value", "decoupling capacitor part No.", and "number". Under the column "condition name" is set an identification name for the connection condition. Under the column "BGA part No." is set a part No. for the BGA part to which the connection condition is to be applied. Under the column "terminal No." is set the terminal No. of the terminal to which the connection condition is to be applied. Note that in the event that no particular terminal is specified and just connection conditions for mounting the decoupling capacitor is defined, "unspecified" is set in the "terminal No." column. Under the column "mounting face" is set information indicating the face of the printed circuit board to which the decoupling capacitor is to be mounted. Under the column "tolerance distance" is set the maximum distance allowable between the terminal and decoupling capacitor. Under the column "voltage value" is set the voltage tolerance value (voltage withstanding) of the decoupling capacitor. Under the column "decoupling capacitor part No." is set the part No. of the decoupling capacitor correlated with the BGA part terminal. Under the column "number" is set the number of decoupling capacitors to be connected to the BGA part terminal.

In the example shown in FIG. 13, the tolerance distance for each of the decoupling capacitors is set to "2.000 mm". This tolerance distance is greater than the distance between the BGA part terminal and decoupling capacitor terminal in the event of placing the decoupling capacitor at a position shifted half-grid in the X and Y axial direction from the inter-terminal grid of the BGA part. While the same tolerance distance is set for all of the decoupling capacitors in the example shown in FIG. 13, the tolerance distance can be optionally set for each decoupling capacitor. For example, decoupling capacitors connecting to power source terminals which have a higher power source voltage may have a tolerance distance set which is longer than "2.000 mm".

With the printed circuit board design assisting device 100 having the configuration such as described above, automatic placement of decoupling capacitors with wiring from BGA terminals, and automatic wiring from BGA terminals to vias, is performed, in accordance with operation input from the designer. First, automatic placement of decoupling capacitors will be described in detail.

Figure 14:
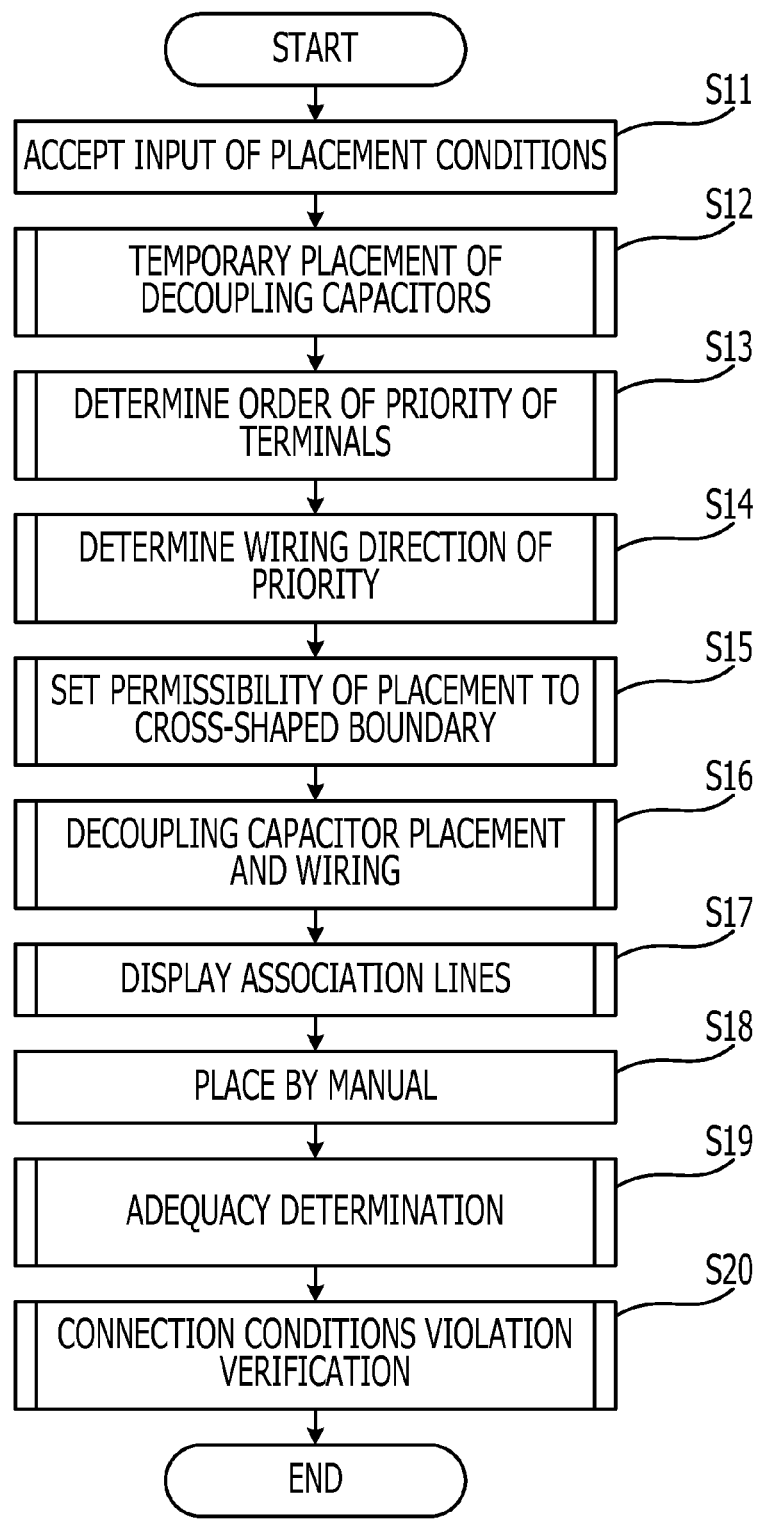
FIG. 14 is a flowchart of decoupling capacitor placement processing.

FIG. 14 is a flowchart of decoupling capacitor placement processing. Description of the processing shown in FIG. 14 will now be made following the operation Nos. therein. Note that this processing may be executed in the event that an operation input is performed to instruct decoupling capacitor placement processing.

[Operation S11] The user interface unit 120 accepts operation input from the designer, instructing placement conditions. Placement conditions include: whether to form a via directly beneath a BGA part terminal or at a position shifted half-grid in the X and Y axial direction from the inter-terminal grid; the BGA part to which decoupling capacitors are to be placed; placement locations for temporary placement of decoupling capacitors; whether temporary placement is to be near the BGA part or on the outside of the printed circuit board; and whether to permit placement to the cross-shaped boundary portion.

[Operation S12] The user interface unit 120 causes the decoupling capacitor temporary placement unit 121 to perform temporary placement of decoupling capacitors on the screen. The decoupling capacitor temporary placement unit 121 places the decoupling capacitors correlated with the BGA part to which the decoupling capacitors are to be placed, in groups according to power source terminals of the BGA part, and displays on the screen of the monitor

[Operation S13] The terminal priority order determining unit 132 determines the order of terminals to be selected as objects of consideration for placement positions of decoupling capacitors. For example, the smaller the applied voltage of a terminal is, the higher the priority given by the terminal priority order determining unit 132 is. The terminal priority order determining unit 132 rearranges the list of BGA part terminals stored in the connection information storage unit 131 in accordance with the order of priority.

[Operation S14] The priority wiring direction determining unit 133 determines a priority wiring direction for each terminal of the BGA part. Specifically, the priority wiring direction determining unit 133 determines an order of selection of via formation positions serving as the wiring destination from the BGA part terminals, so that the wiring from the BGA part terminals to the vias will be radial. Here, "radial wiring" may be defined as wiring wherein a vector indicating the position of a via from the position of a terminal is pointing in a direction away from the center of the BGA part. Arranging the wiring direction to be the same thus allows the decoupling capacitors to be neatly arrayed, so a greater number of decoupling capacitors can be placed. Note that what is important is that the direction of wiring is arranged to be the same, and accordingly, wiring may be used regarding which the vector indicating the position of the via from the position of the terminal is in the direction toward the center of the BGA part.

Upon the priority wiring direction being determined, the priority wiring direction determining unit 133 rearranges the candidates for via formation positions correlated with the terminals within the connection information storage unit 131 in accordance with the order of priority.

[Operation S15] The cross-shaped boundary placement permissibility setting unit 134 receives instructions regarding whether to place decoupling capacitors at the cross-shaped boundary of the BGA part, by way of the user interface unit 120. In accordance with the instructions, the cross-shaped boundary placement permissibility setting unit 134 sets a researched or unresearched flag at the via formable position within the cross-shaped boundary in the connection information storage unit 131.

[Operation S16] The connection relation determining unit 135 determines the position of the decoupling capacitors to be connected to each of the terminals of the BGA part, and sets wiring to be connected to the decoupling capacitors from the terminals by way of the vias. Specifically, the connection relation determining unit 135 selects terminals of the BGA part within the connection information storage unit 131 following the order of priority. Next, the connection relation determining unit 135 researches whether vias can be formed and a decoupling capacitor placed for positions around the selected terminal, in order from those with high order of priority. At this time, the connection relation determining unit 135 excludes positions set as researched from the object of research.

Note that in the event that a wiring to connect a decoupling capacitor to another terminal has been set for the via being researched as a via formation candidate, the connection relation determining unit 135 considers whether the position of the decoupling capacitor connected to the other terminal can be shifted.

[Operation S17] The user interface unit 120 displays association lines illustrating the relation between the correlated terminals and decoupling capacitors on the monitor 71, in response to operation input from the designer.

[Operation S18] The decoupling capacitor manual placement unit 122 places decoupling capacitors on the printed circuit board in response to operation input from the designer. At this time, the decoupling capacitor manual placement unit 122 can also changed the positions of decoupling capacitors placed by the connection relation determining unit 135, in response to operation input from the designer.

[Operation S19] The adequacy determining unit 141 determines the adequacy of the decoupling capacitors relating to the BGA part, in response to operation input from the designer instructing adequacy determination. Adequacy is represented in terms of the percentage of BGA part terminals to which decoupling capacitors have been connected.

[Operation S20] In response to operation input of instructions from the designer to verify the connection conditions, the connection condition verification unit 142 verifies whether the decoupling capacitors connected to the BGA part terminals satisfy connection conditions. In the event that there is a decoupling capacitor which does not satisfy the connection conditions, the connection condition verification unit 142 outputs an error. The output error is displayed on the monitor 71 by way of the user interface unit 120.

Thus, placement of decoupling capacitors to be connected to BGA parts can be easily performed. Details of each processing shown in FIG. 14 will be described below.

Placement condition input reception processing shown in operation S11 will be described in detail. Placement conditions that are input include conditions relating to the via formation position. Via formation position conditions include whether to form a via a position shifted half-grid from the terminal or directly beneath the terminal.

Figure 15:
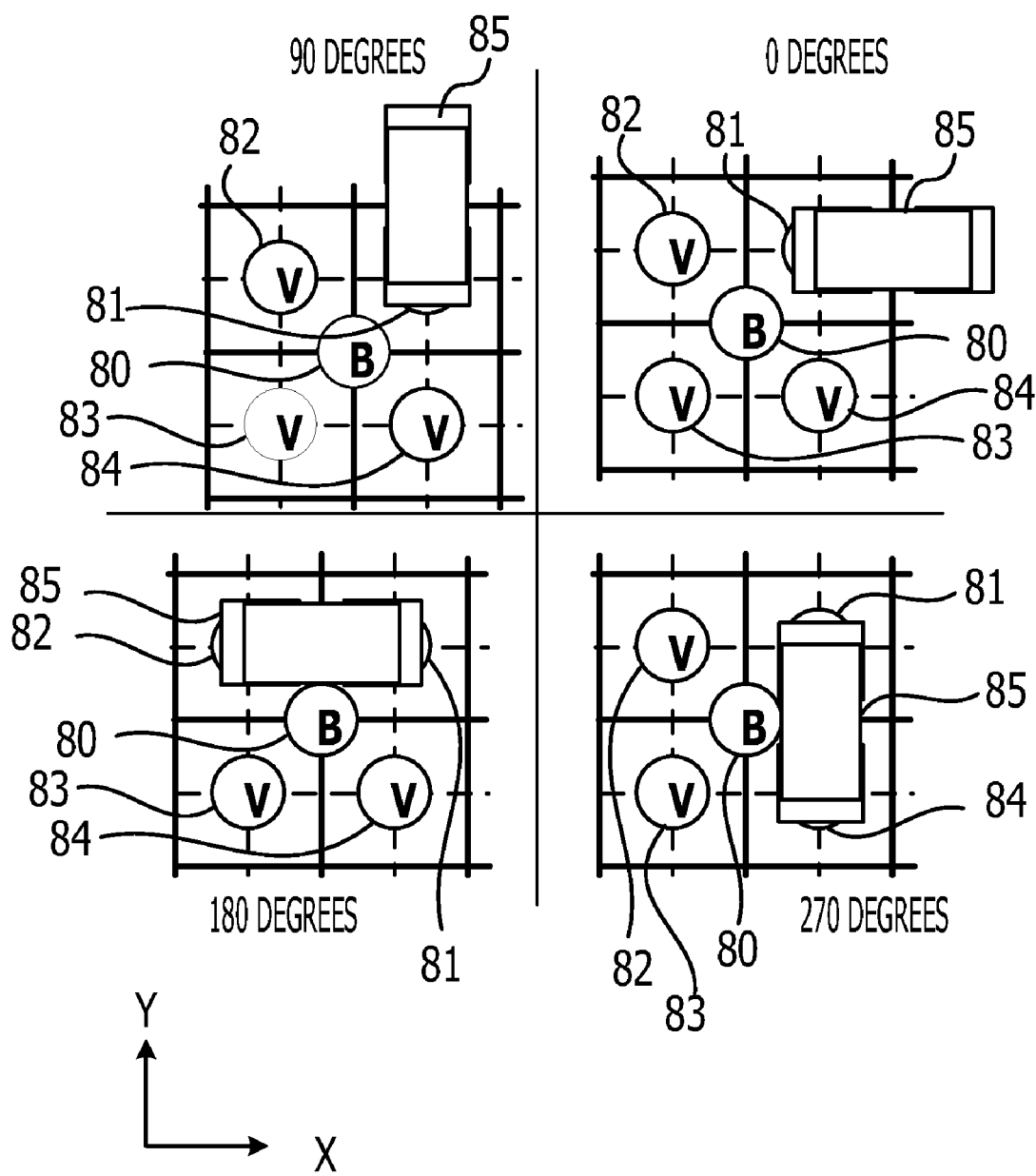
FIG. 15 illustrates the placement relation between terminals and vias in the event that vias are to be placed shifted half a grid from terminals.

FIG. 15 illustrates the positional relation between terminals and vias in the event of placing a via shifted half-grid from the terminal. In FIG. 15, "B" represents terminals, and "V" represents vias (also the same in FIGS. 16, 23A and 23B, and 24).

In the example in FIG. 15, an example of candidates of via positions to which to connect a terminal 80. The solid lines in FIG. 15 are the grid, of which the terminal pitch of the BGA part terminals is the unit width. The grid indicated by the solid lines serves as the terminal grid. The terminals of the BGA part are each positioned on the grid points of the terminal grid.

The dotted lines show a grid has been shifted in the X-axial direction and Y-axial direction by half the unit width of the terminal grid (i.e., half-grid), from the terminal grid shown by solid lines. The grid indicated by the dotted lines serves as the via grid. Vias of the printed circuit board can be formed on the grid points of the via grid.

The terminal 80 can be wired to any one of the vias 81 through 84 shifted in the X direction and Y direction by a half-grid from the terminal 80. There are four directions to select from for the outline wiring from the terminal 80 to the vias. In the example shown in FIG. 15, the via 81 has been selected as the connection destination of the terminal 80.

Upon the via 81 having been selected, consideration is made regarding the placement location of a decoupling capacitor 85 of which one terminal may be connected to the via 81. The decoupling capacitor 85 has two terminals, of which the pitch is the same as the grid pitch of the via grid. When considering the placement location of the decoupling capacitor 85, placement can be made in the four orientations indicated in FIG. 15 based on the placement orientation with the position of the via 81 as a reference. If we express the orientation of the decoupling capacitor 85 in terms of the angle between the long side of the decoupling capacitor 85 and the X-axis, the orientations are 0 degrees, 90 degrees, 180 degrees, and 270 degrees. For example, if the decoupling capacitor 85 is placed in the 180 degrees orientation, the decoupling capacitor 85 is placed at a position connecting the via 81 and via 82. Also, if the decoupling capacitor 85 is placed in the 270 degrees orientation, the decoupling capacitor 85 is placed at a position connecting the via 81 and via 84.

Figure 16:
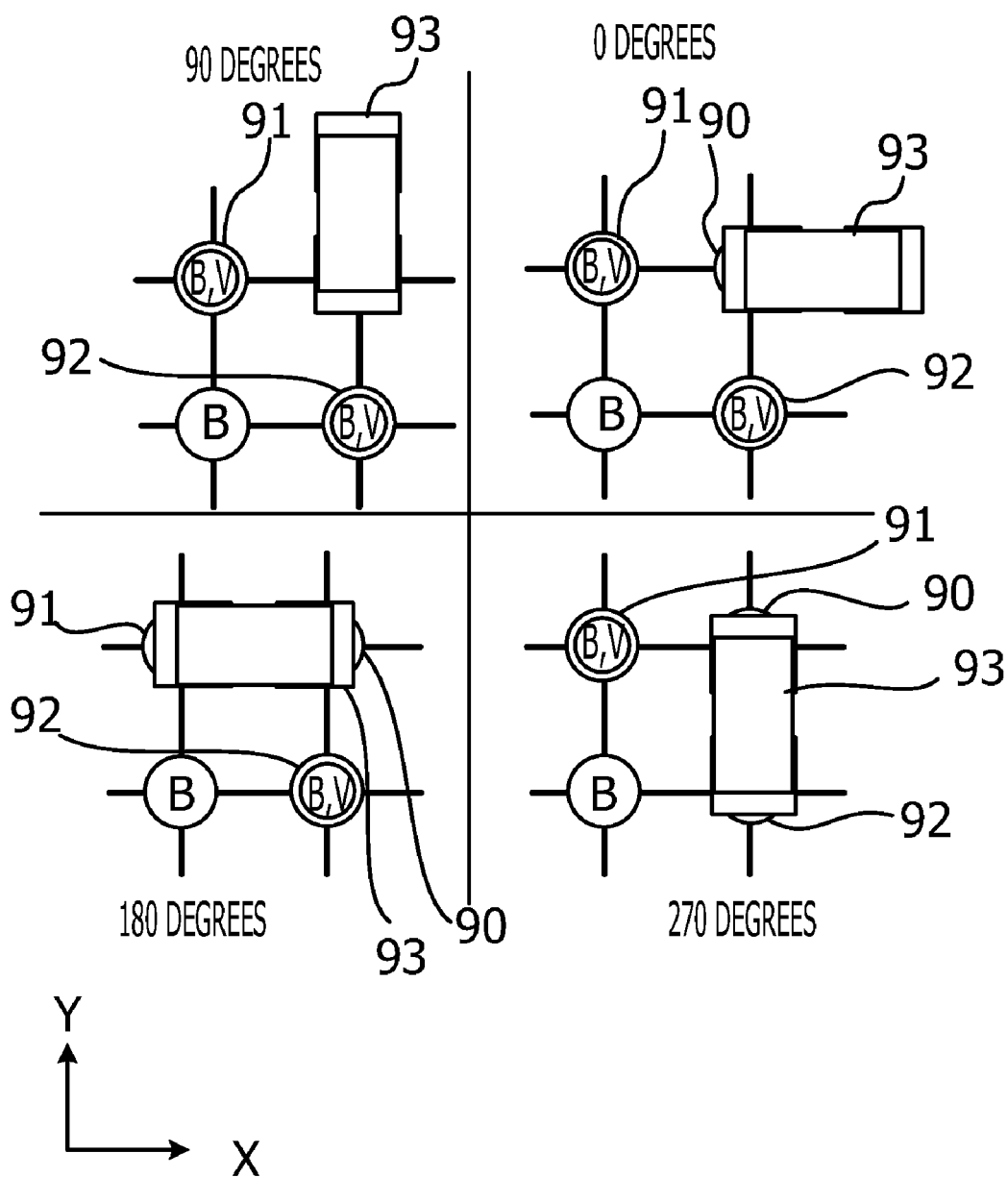
FIG. 16 illustrates the placement relation between terminals and vias in the event that vias are to be situated directly below terminals.

FIG. 16 illustrates the positional relation between terminals and vias in the case of placing the vias directly beneath the terminals. In the example in FIG. 16, examples of candidates of via positions to connect to a terminal 90 are shown. The solid shown lines in FIG. 16 are the grid, of which the terminal pitch of the BGA part terminals is the unit width. The grid indicated by the solid lines serves as the terminal grid. The terminals of the BGA part are each positioned on the grid points of the terminal grid. Also, the vias of the printed circuit board can be formed on the grid points of the terminal grid. In FIG. 16, positions where a terminal and via overlap are indicated by "B, V".

A via is formed directly beneath the terminal 90, and wiring is performed. Next, consideration is made regarding the placement location for a decoupling capacitor 93 of which one terminal may be connected to the via provided at the position of the terminal 90. The decoupling capacitor 93 has two terminals, of which the pitch is the same as the grid pitch of the via grid. When considering the placement location of the decoupling capacitor 93, placement can be made in the four orientations indicated in FIG. 16 based on the placement orientation with the position of the terminal 90 as a reference. If we express the orientation of the decoupling capacitor 93 in terms of the angle between the long side of the decoupling capacitor 93 and the X-axis, the orientations are 0 degrees, 90 degrees, 180 degrees, and 270 degrees. For example, if the decoupling capacitor 93 is placed in the 180 degrees orientation, the decoupling capacitor 93 is placed at a position connecting the terminal 90 and terminal 82. Also, if the decoupling capacitor 93 is placed in the 270 degrees orientation, the decoupling capacitor 93 is placed at a position connecting the terminal 90 and terminal 92.

The user interface unit 120 obtains operation input instructing whether to place vias shifted half-grid from the terminals as shown in FIG. 15, of to place vias directly beneath the terminals as shown in FIG. 16, and stores the operation input in the RAM 102 as placement conditions. The user interface unit 120 then hands the placement conditions relating to the positional relation between the terminals and vias to the part placement computation unit 130. Thus, the position of vias is determined by the part placement computation unit 130, following the placement conditions.

Also, placement conditions include temporary placement location specification. The user interface unit 120 obtains operation input indicating the location for temporary placement, and stores this in the RAM 102 as placement conditions. The user interface unit 120 then hands the placement conditions relating to the temporary placement location to the decoupling capacitor temporary placement unit 121. Thus, the decoupling capacitors are temporarily position on the screen of the monitor 71 by the decoupling capacitor temporary placement unit 121.

Figure 17:
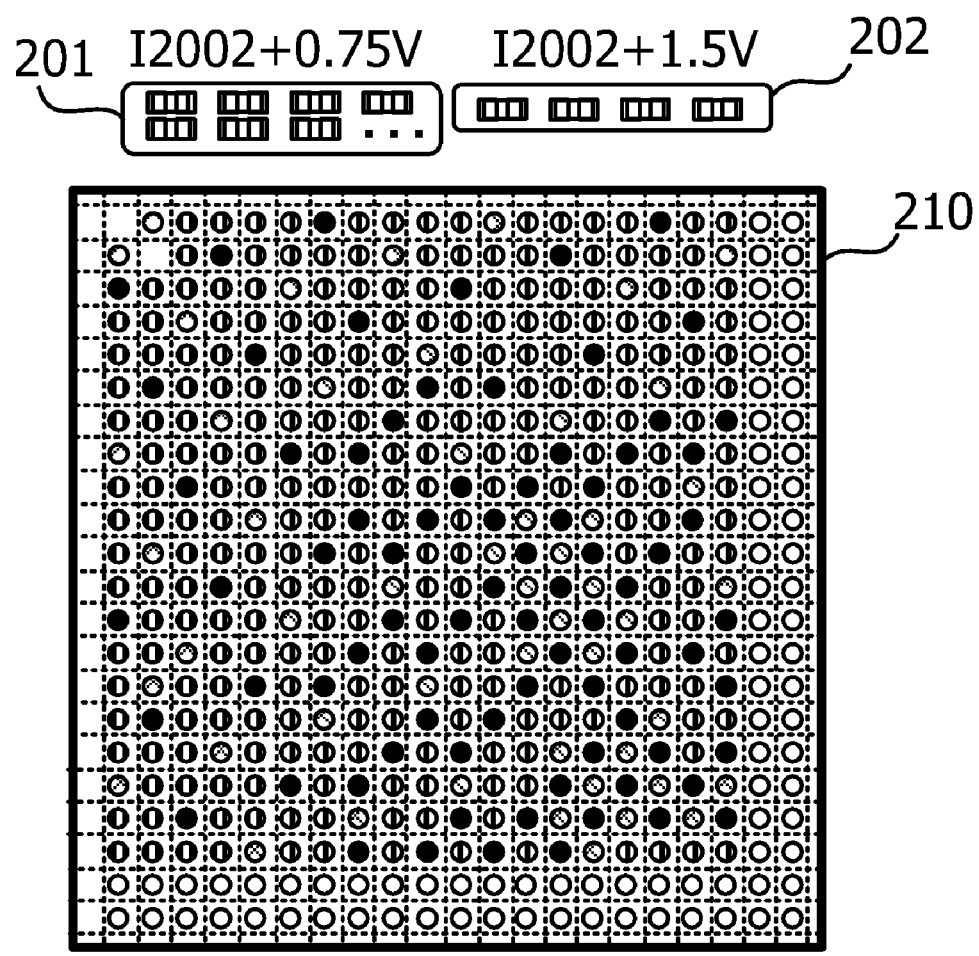
FIG. 17 illustrates a display example in a case of temporarily placing decoupling capacitors near a BGA part.

FIG. 17 illustrates an example of a display mode wherein decoupling capacitors are temporarily placed near the BGA part. The screen displays the BGA part 210, and decoupling capacitors classified into groups 201 and 202 above the BGA part 210. The groups 201 and 202 have been obtained by grouping the power source terminals of the BGA part by power source type.

The groups 201 and 202 are each surrounded by a rectangular frame. Also, the part No. of the BGA part with which the decoupling capacitors within the group have been correlated, and the voltage value of the power source type to which the corresponding terminals belong.

Figure 18:
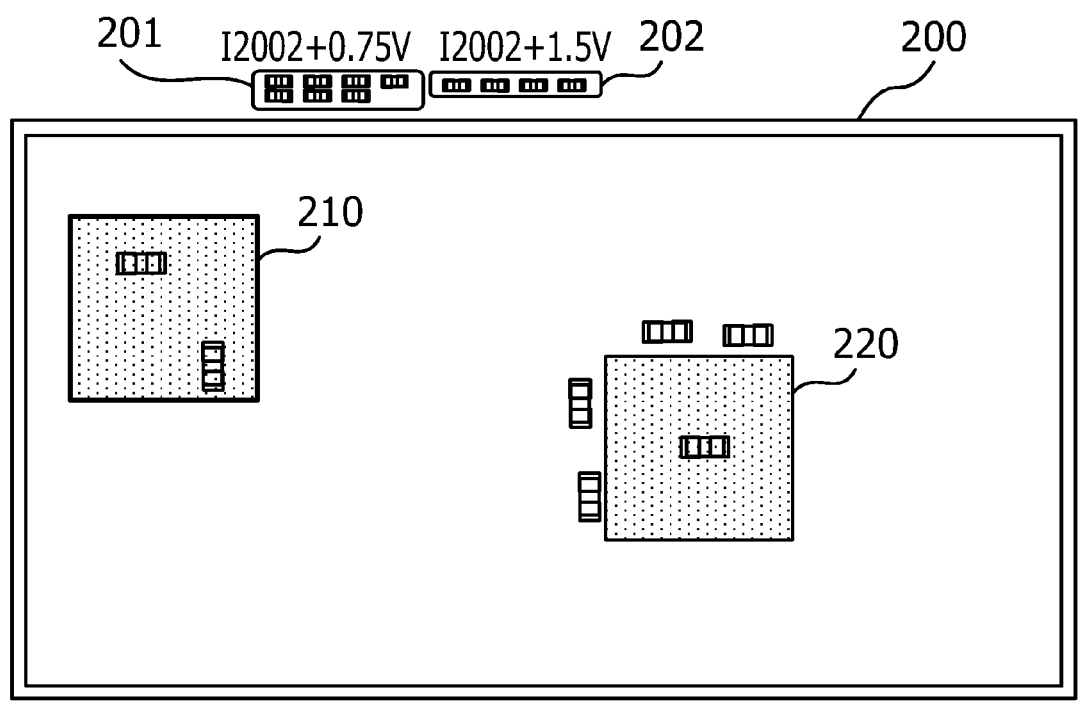
FIG. 18 illustrates a display example in a case of temporarily placing decoupling capacitors outside of a printed circuit board.

FIG. 18 illustrates an example of a display mode wherein decoupling capacitors are temporarily placed outside of the printed circuit board. In the example shown in FIG. 18, the screen displays two BGA parts 210 and 220 on the printed circuit board 200, of which the BGA part 210 selected as the object of decoupling capacitor placement is displayed in a highlighted manner. Decoupling capacitors related to the BGA part 210 which is the object of decoupling capacitor placement, classified into groups 201 and 202, are displayed above the BGA part 210.

Figure 19:
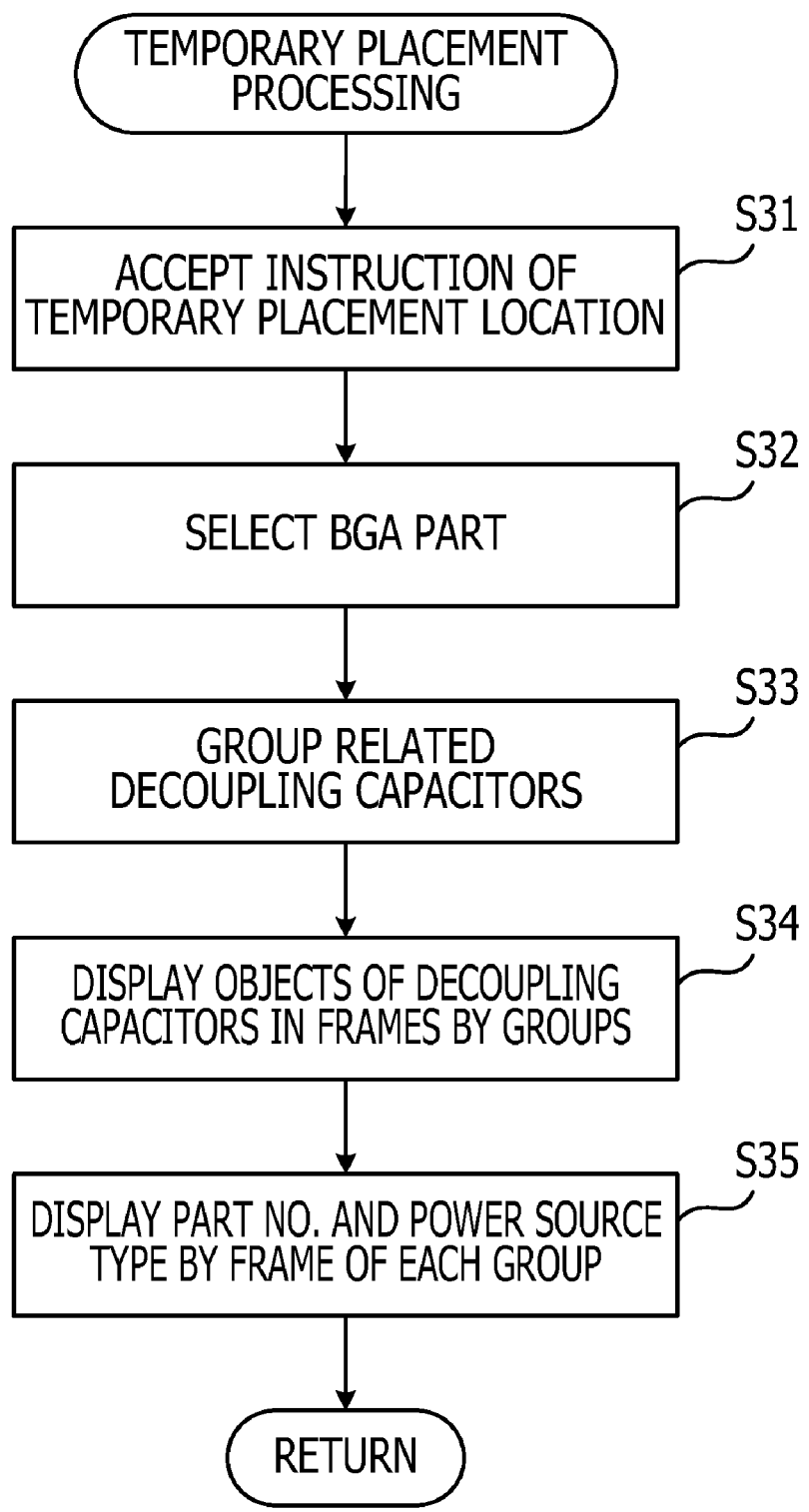
FIG. 19 is a flowchart of temporary placing processing.

FIG. 19 is a flowchart of temporary placement processing. Description of the processing shown in FIG. 19 will now be made following the operation Nos. therein.

[Operation S31] The user interface unit 120 accepts input of placement conditions instructing the temporarily placement location. The user interface unit 120 then hands the temporary placement location instructions to the decoupling capacitor temporary placement unit 121.

[Operation S32] The user interface unit 120 accepts operation input selecting the BGA part to serve as the object of decoupling capacitor placement. The user interface unit 120 then hands information of the selected BGA part (e.g., part No.) to the decoupling capacitor temporary placement unit 121.

[Operation S33] The decoupling capacitor temporary placement unit 121 groups the decoupling capacitors related with the selected BGA part. Specifically, the decoupling capacitor temporary placement unit 121 can recognize the power source type of each terminal of the BGA part by making reference to the part terminal group information 111a within the a part information 111 shown in FIG. 12. Also, the decoupling capacitor temporary placement unit 121 can recognize the decoupling capacitor correlated to each terminal by making reference to the association information 115 shown in FIG. 13. This information enables the decoupling capacitor temporary placement unit 121 to group the decoupling capacitors related to the terminals of the BGA part 210 by power source type. That is to say, the decoupling capacitor temporary placement unit 121 groups decoupling capacitors correlated with the terminals belonging to power source types of the same voltage, in the same group.

[Operation S34] The decoupling capacitor temporary placement unit 121 displays objects of the decoupling capacitors in frames for each group. Specifically, the decoupling capacitor temporary placement unit 121 displays frames for each group at the placement location specified in operation S31. Next, the decoupling capacitor temporary placement unit 121 displays, in each group frame, objects corresponding to the decoupling capacitors belonging to that group.

[Operation S35] The decoupling capacitor temporary placement unit 121 displays the part No. of the related BGA part, and the power source type, above the frame for each group.

Thus, decoupling capacitors having a linked relation with the BGA part are displayed, having been classified into groups and temporarily placed, following grouping according to the power source terminals of the BGA part. Such temporary placement facilitates placement instructions in the event of manually placing the decoupling capacitors to the BGA part 20. That is to say, the objects of the decoupling capacitors which have been temporarily placed can be optionally moved by the designer, by instructions with a mouse pointer. Upon a decoupling capacitor being moved upon the BGA part, the position to which the decoupling capacitor has been moved is determined as the placement location of that decoupling capacitor.

In the event that the placement location of the decoupling capacitor has been automatically determined by the part placement computation unit 130, the objects of the decoupling capacitors regarding which the positions have been determined are moved to the determined locations. Thus, the situation of placement of decoupling capacitors for each group in automatic placement can be readily recognized by the designer. In the event that there are objects of decoupling capacitors remaining within the frame of the group, for example, the designer can recognize at a glance that there are unplaced decoupling capacitors.

Thus, placing the decoupling capacitors so as to be lined up according to voltage value allows work time for placing the decoupling capacitors to be reduced.

Figure 20:
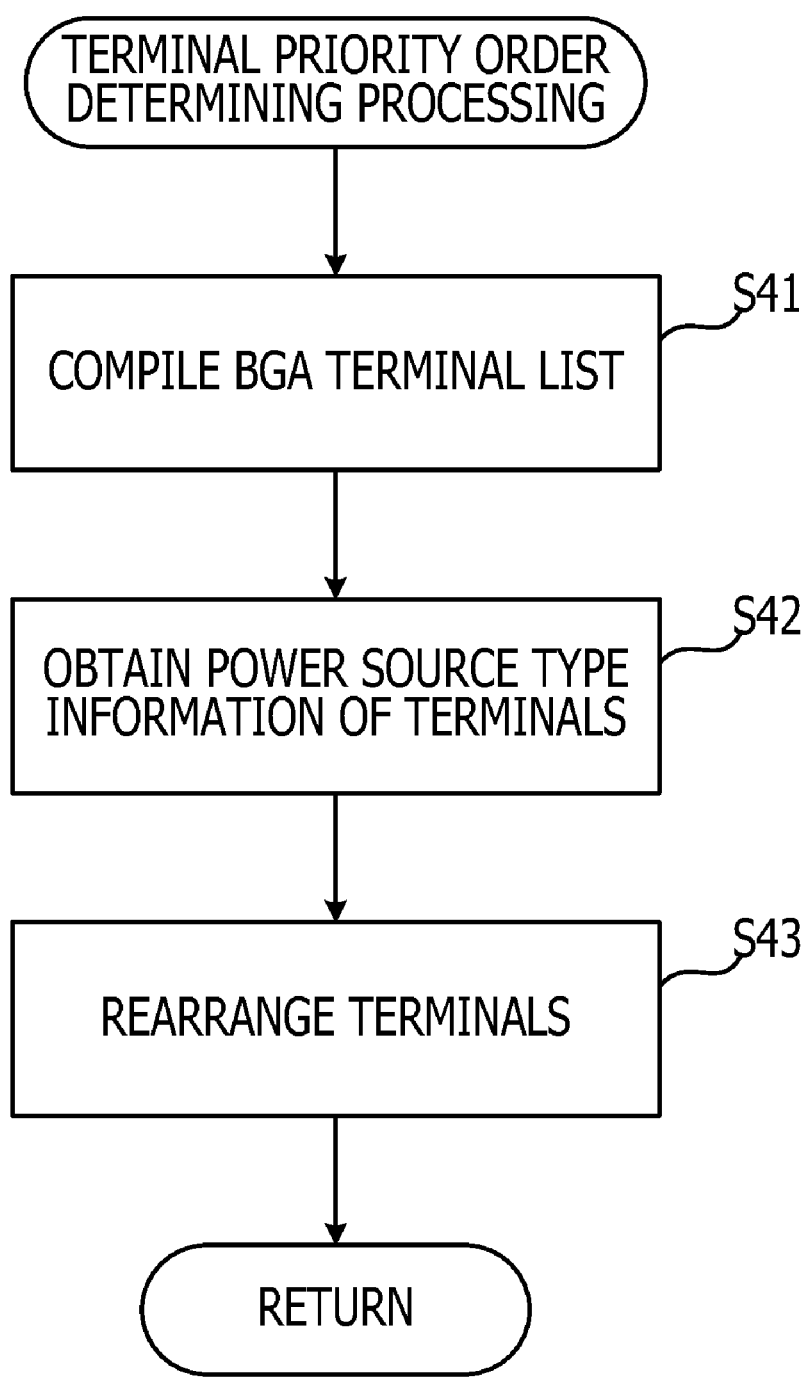
FIG. 20 is a flowchart of terminal priority order determining processing.

Next, details of terminal priority order determining processing will be described. FIG. 20 is a flowchart of the terminal priority order determining processing. Description of the processing shown in FIG. 20 will now be made following the operation Nos. therein.

[Operation S41] The terminal priority order determining unit 132 creates a BGA terminal list. Specifically, the terminal priority order determining unit 132 makes reference to the a part information 111 of the BGA part in the printed circuit board database 110, and obtains terminal identifiers for the BGA part. The terminal priority order determining unit 132 then arrays the obtained terminal identifiers, and creates the BGA terminal list. The created BGA terminal list is stored in the connection information storage unit 131.

[Operation S42] The terminal priority order determining unit 132 obtains the power source type information of the terminal. Specifically, the terminal priority order determining unit 132 obtains the part terminal group information 111*a* within the a part information 111. The terminal priority order determining unit 132 determines the power source type of each terminal based on the terminal No. for each power source type shown in the part terminal group information 111*a*.

[Operation S43] The terminal priority order determining unit 132 reorders the terminals in the BGA terminal list in order from the power source types with low voltage.

Figure 21:
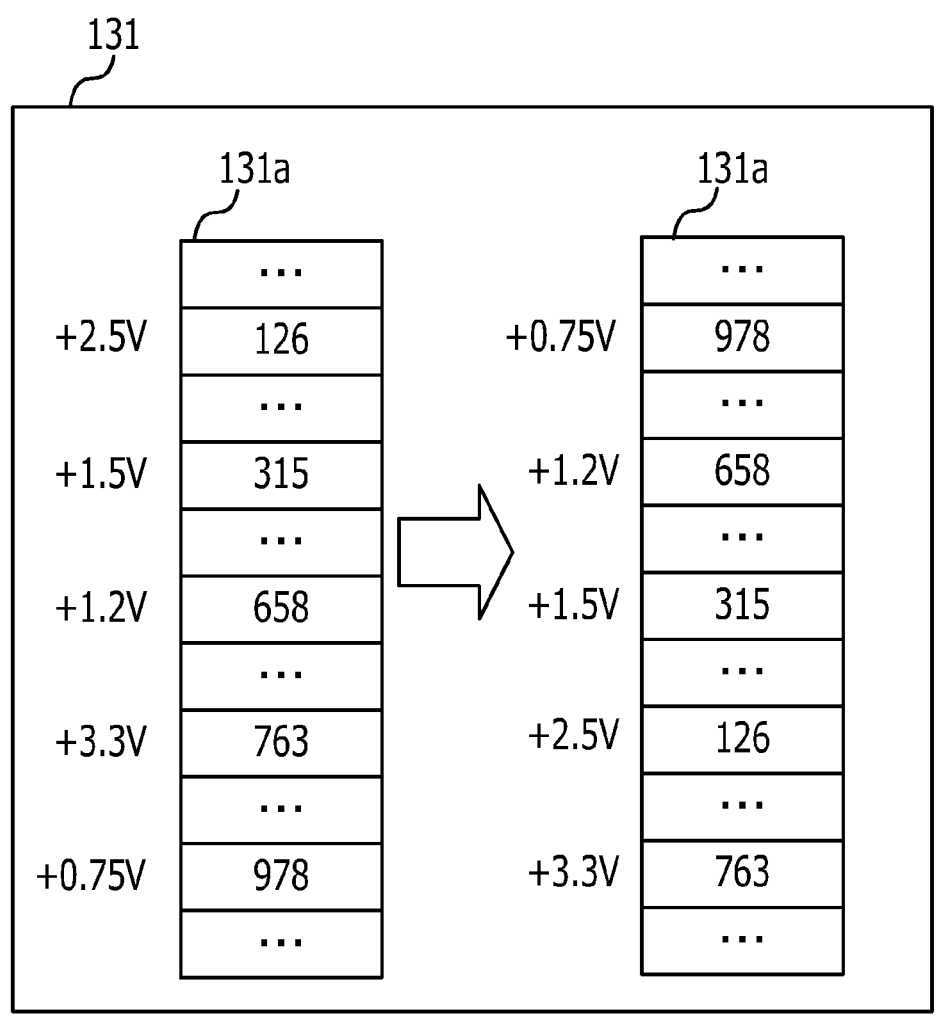
FIG. 21 illustrates rearranging of a BGA terminal list.

FIG. 21 illustrates reordering of the BGA terminal list. As shown in FIG. 21, the connection information storage unit 131 stores a BGA terminal list 131*a*. The BGA terminal list 131*a* is a list of terminal identifies of the BGA part which is the object of decoupling capacitor placement. The power source types of the terminals can be found from the part terminal group information 111*a*. Accordingly, the BGA terminal list 131*a* is sorted by the terminal priority order determining unit 132 so that the identifiers of terminals with low voltage are of higher order.

Arranging so that the identifiers of terminals with low voltage are of higher order on the BGA terminal list 131*a* causes the connection relation determining unit 135 to select terminals with the lowest voltage, with the highest priority. As a result, decoupling capacitors can be connected in a sure manner to terminals with low voltage. Terminals with low voltage are readily affected by noise, and accordingly there is a greater need for such low-voltage terminals to be connected to decoupling capacitors. That is to say, connecting decoupling capacitors to terminals with low voltage in a sure manner improves the reliability of the printed circuit board.

Next, priority wiring direction determining processing will be described. With the priority wiring direction determining processing, consideration is given with priority to whether to perform wiring from BGA terminals to vias in the direction of radial outline wiring.

Figure 22:
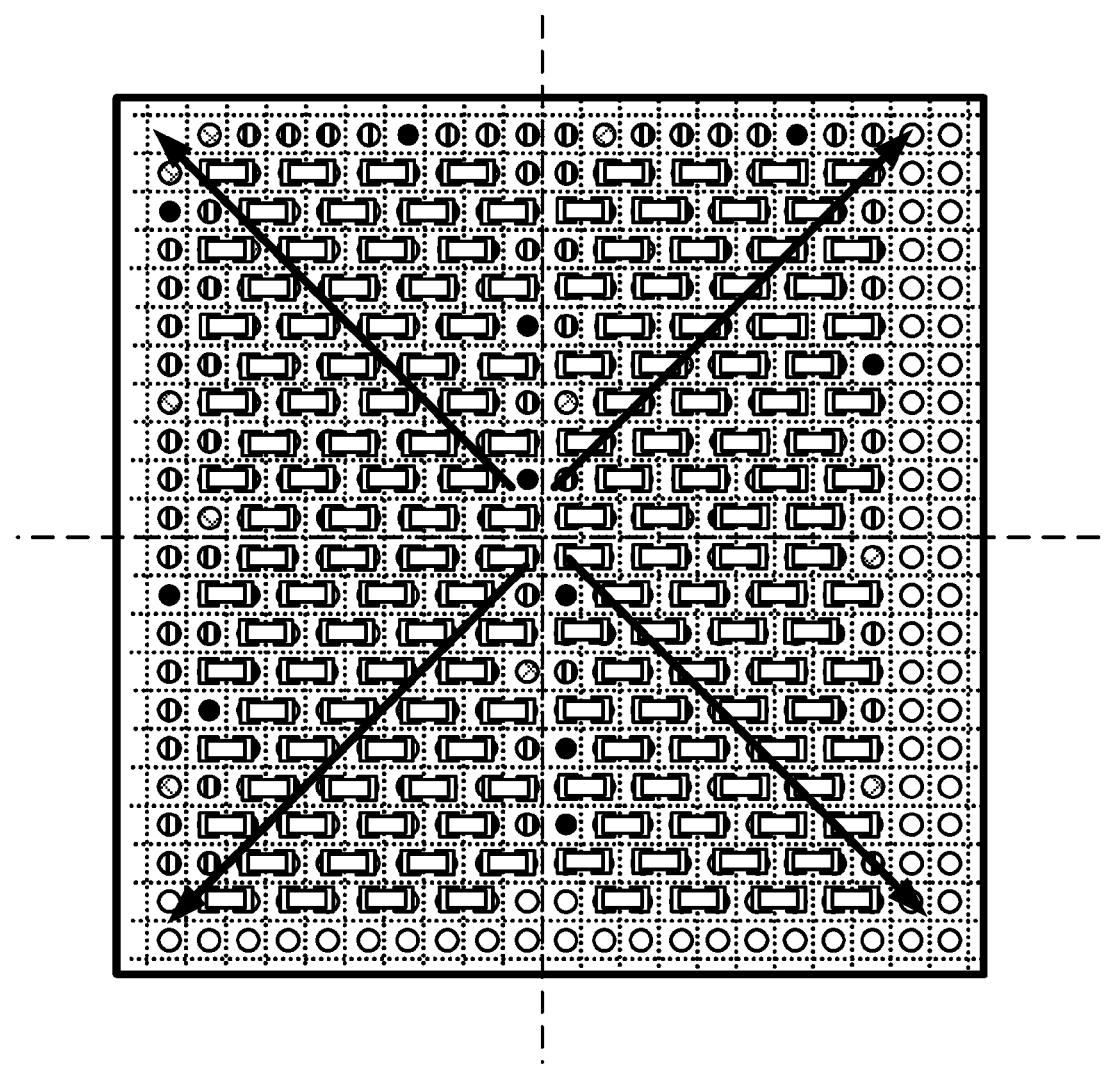
FIG. 22 illustrates an example of priority outline directions of wiring.

FIG. 22 illustrates an example of priority outline directions of wiring. Note that with the present embodiment, this is not perfectly radial, but the directions toward the four corners of the BGA part 210 from the center thereof, are the priority outline directions, as shown in FIG. 22. Unifying the wiring outline direction in this way allows the decoupling capacitors to be arrayed in an orderly manner, so a greater number of decoupling capacitors can be placed.

Figure 23A:
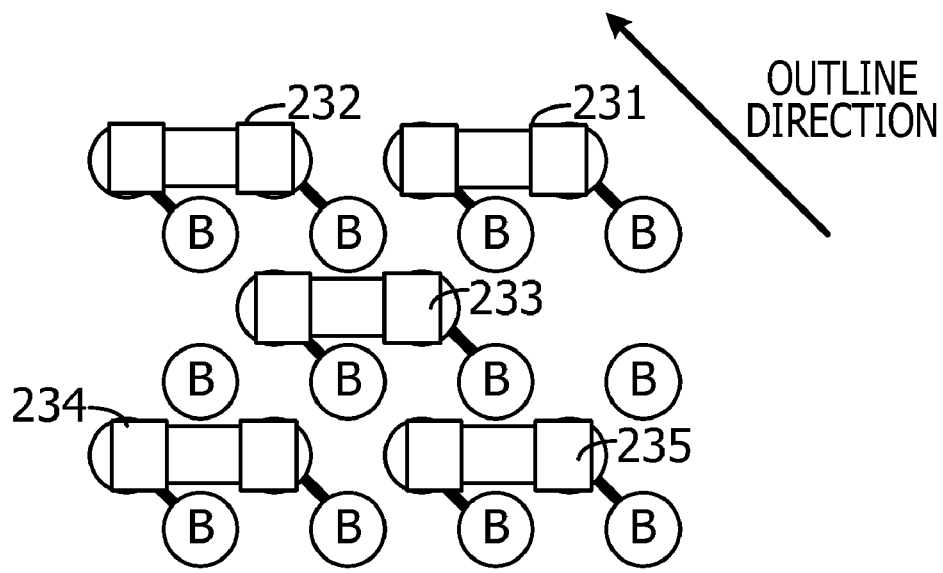
FIGS. 23A and 23B illustrate comparative examples radial wiring and random wiring.
Figure 23B:
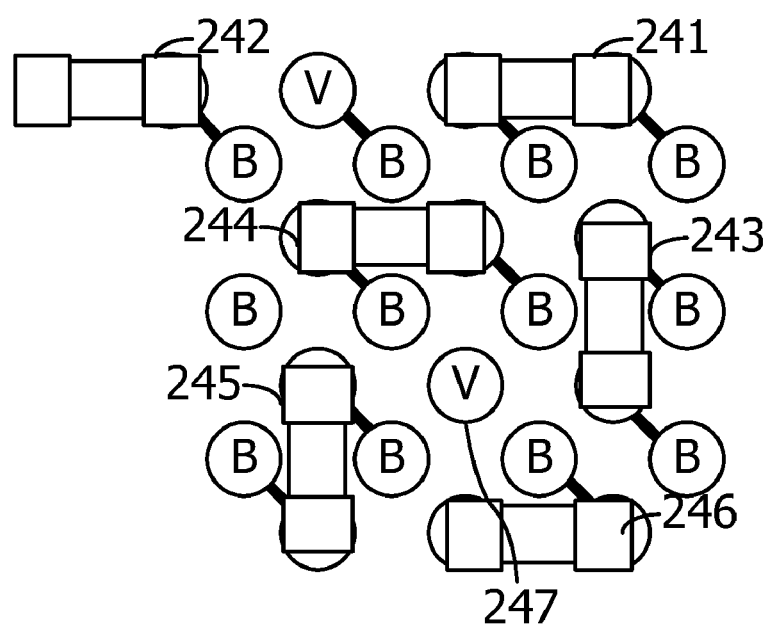

FIGS. 23A and 23B illustrate a comparative example between radial wiring and random wiring. FIG. 23A is an example where decoupling capacitors have been placed with radial wiring, and FIG. 23B is an example where decoupling capacitors have been placed with random wiring. In FIGS. 23A and 23B, "B" indicates terminals and "V" indicates vias.

With radial wiring, the wiring from terminals to vias where decoupling capacitors 231 through 235 are all unified in the direction toward the upper left. Thus, the decoupling capacitors 231 through 235 are all arrayed orderly, and there is no wasted space.

With radial wiring, the direction of wiring from terminals to the vias is not unified. Accordingly, the wiring from terminals to vias where decoupling capacitors 241 through 246 includes some in the direction toward the upper left and some in the direction toward the lower right. This leads to the mounting angles of the decoupling capacitors being random, and consequently, there are vias to which decoupling capacitors cannot be connected, as with the via 247. That is to say, dead space results, and the more dead space there is the fewer decoupling capacitors which can be connected.

Note that with the present embodiment, re-placement of decoupling capacitors is performed as appropriate. Accordingly, event in the event that random wiring is performed at the initial stage and there is dead space, re-placement of the decoupling capacitors reduces the dead space. However, if there is no dead space from the initial stage, the amount of time for the re-placement processing can be reduced. That is to say, the greater the number of decoupling capacitors which have to have their position shifted in the re-placement processing, the greater amount of time is required for the re-placement processing, so if there are not many decoupling capacitors which have to have their position shifted, the re-placement processing can be completed in a short time in the event that re-placement is necessary.

Figure 24:
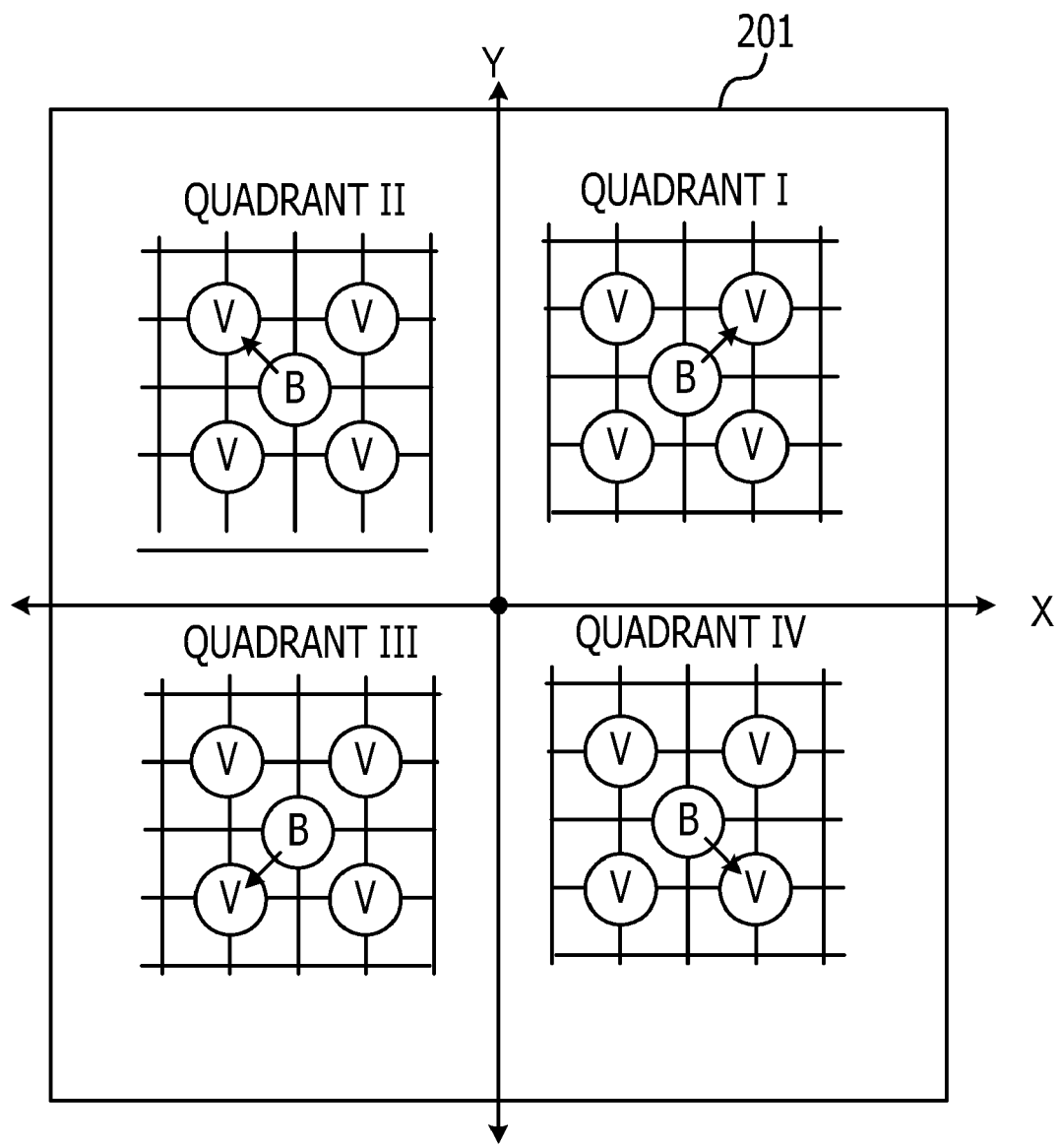
FIG. 24 illustrates difference in priority outline direction depending on the location of the terminal.

FIG. 24 illustrates the difference in priority outline directions for each location of the terminals. FIG. 24 illustrates a coordinates system with the center of the BGA part 210 as the origin. The X axis is in the horizontal direction, and the Y axis is in the vertical direction. With such a coordinates system in mind, the priority outline direction from the terminals to vias is decided according to the quadrant to which the terminal belongs.

In the event that the X coordinate of the terminal is positive and the Y coordinate is positive, the terminal belongs to quadrant I. Outline wiring from terminals belonging to quadrant I is to a via at the upper right direction from that terminal with priority. In the event that the X coordinate of the terminal is negative and the Y coordinate is positive, the terminal belongs to quadrant II. Outline wiring from terminals belonging to quadrant II is to a via at the upper left direction from that terminal with priority. In the event that the X coordinate of the terminal is negative and the Y coordinate is negative, the terminal belongs to quadrant III. Outline wiring from terminals belonging to quadrant III is to a via at the lower left direction from that terminal with priority. In the event that the X coordinate of the terminal is positive and the Y coordinate is negative, the terminal belongs to quadrant IV. Outline wiring from terminals belonging to quadrant IV is to a via at the lower right direction from that terminal with priority.

Figure 25:
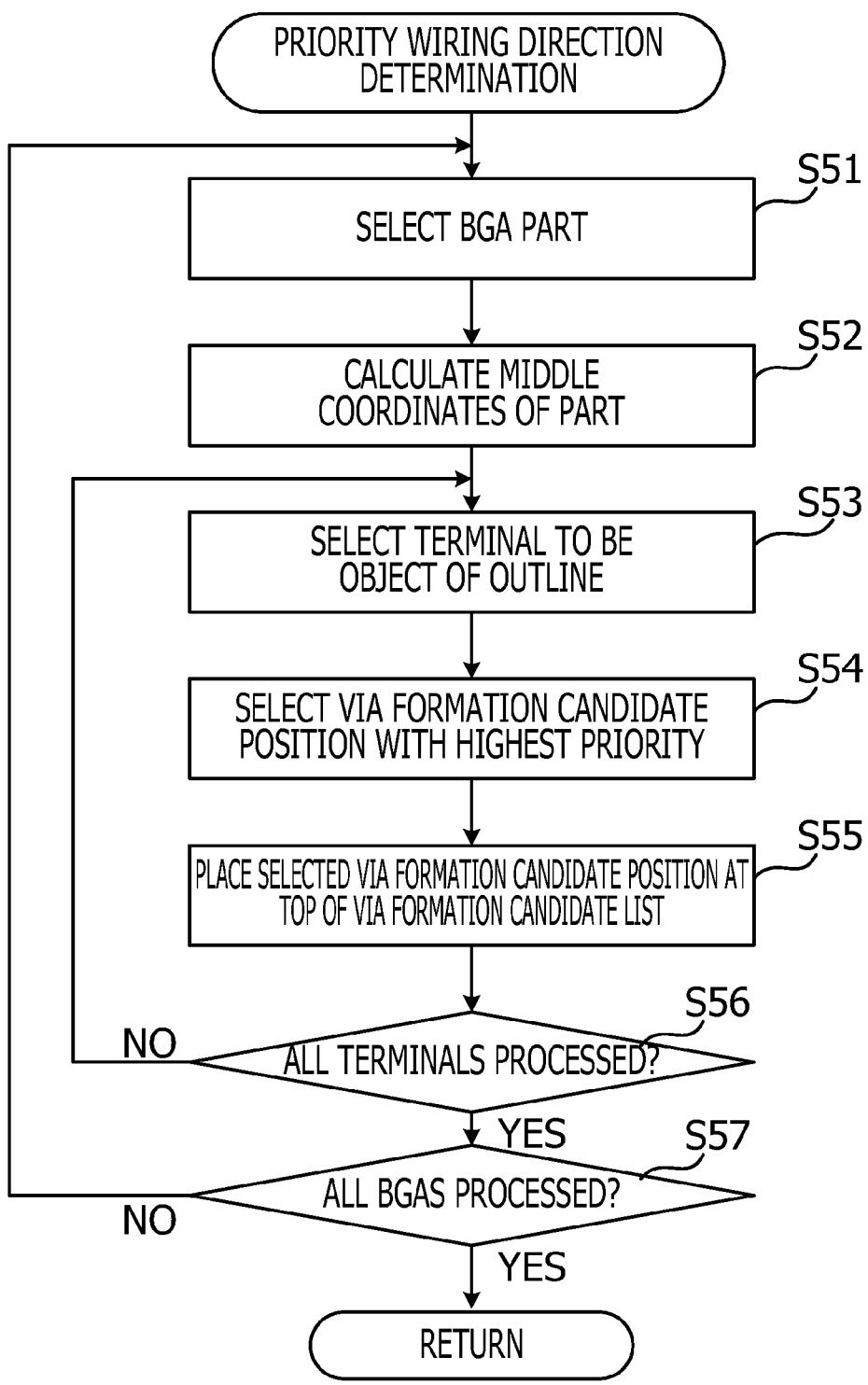
FIG. 25 is a flowchart illustrating procedures for priority outline method determining processing.

FIG. 25 is a flowchart for priority wiring direction determining processing. Description of the processing shown in FIG. 25 will now be made following the operation Nos. therein.

[Operation S51] The priority wiring direction determining unit 133 selects one BGA part.

[Operation S52] The priority wiring direction determining unit 133 calculates the part middle coordinates. Specifically, the priority wiring direction determining unit 133 makes reference to the information of the selected BGA part in the a part information 111 of the printed circuit board database 110. The a part information 111 includes the mounting information of the part and part shape information. The part mounting information indicates coordinates showing the position of a predetermined reference point of the part on the printed circuit board. The priority wiring direction determining unit 133 calculates the center of the part based on the shape of the part. The priority wiring direction determining unit 133 then calculates the part middle coordinates by adding the difference between the reference point of the part to the center, to the position of the part.

[Operation S53] The priority wiring direction determining unit 133 selects a terminal for outline wiring from the selected BGA part. Specifically, the priority wiring direction determining unit 133 selects terminals in order from the higher order of the BGA terminal list 131a, as terminals for outline wiring.

[Operation S54] The priority wiring direction determining unit 133 selects a highest-priority via formation candidate position. Specifically, the priority wiring direction determining unit 133 determines to which quadrant the position of the terminal for outline wiring beings to in the coordinate system of which the center of the BGA part is the origin. As shown in FIG. 24, the priority wiring direction determining unit 133 determines a via position in a direction away from the origin to be the highest-priority via formation candidate position.

[Operation S55] The priority wiring direction determining unit 133 places the selected via formation candidate position at the tip of a via formation candidate list. The via formation candidate list is registered in a manner correlated with the terminal No. of the BGA terminal selected form the BGA terminal list 131a.

[Operation S56] The priority wiring direction determining unit 133 determines whether all terminals of the selected BGA part have been processed. In the event that all terminals have been processed, the processing advances to operation S57. In the event that there are unprocessed terminals, the processing returns to operation S53.

[Operation S57] The priority wiring direction determining unit 133 determines whether all BGA parts have been processed. In the event that all BGA parts have been processed, the priority wiring direction determining processing ends. In the event that there are unprocessed BGA parts, the processing returns to operation S51.

Figure 26:
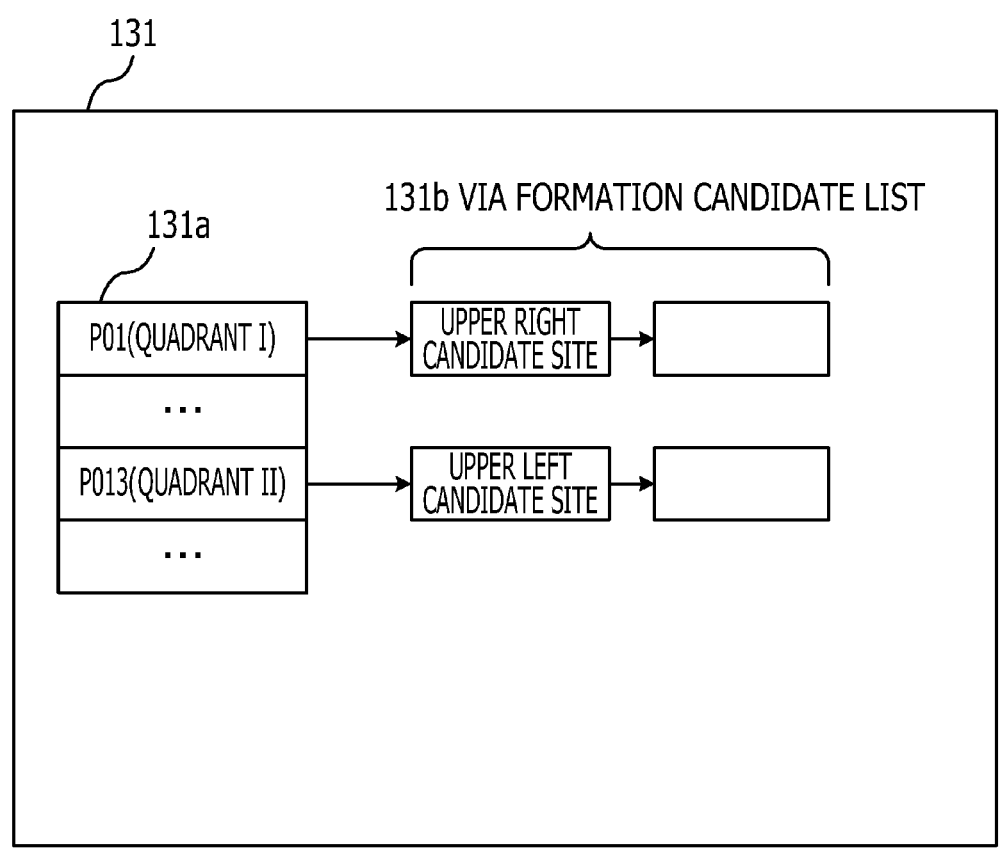
FIG. 26 illustrates an example of a via formation candidate list.

FIG. 26 illustrates in example of a via formation candidate list. The via formation candidate list 131b is provided in a correlated manner with the terminal Nos. in the BGA terminal list 131a. The via formation candidate list 131b is a list of information indicating via formation candidate positions around a corresponding terminal. In FIG. 26, the further to the left a via formation candidate position is shown, the higher the order of priority thereof is. That is to say, the via formation candidate position pointed to by a pointer from the terminal No. is the highest-priority via formation candidate position.

For example, in the event that the terminal is in quadrant I, the via formation candidate position to the upper right of the terminal (upper right candidate site) is the highest-priority via formation candidate position. Also, in the event that the terminal is in quadrant II, the via formation candidate position to the upper left of the terminal (upper left candidate site) is the highest-priority via formation candidate position.

Thus, outline wiring can be performed from terminals to vias with priority to radial wiring.

Next, cross-shaped boundary placement permissibility setting processing will be described. Permissibility of placement to the cross-shaped boundary is specified by operation input from the designer.

Figure 27:
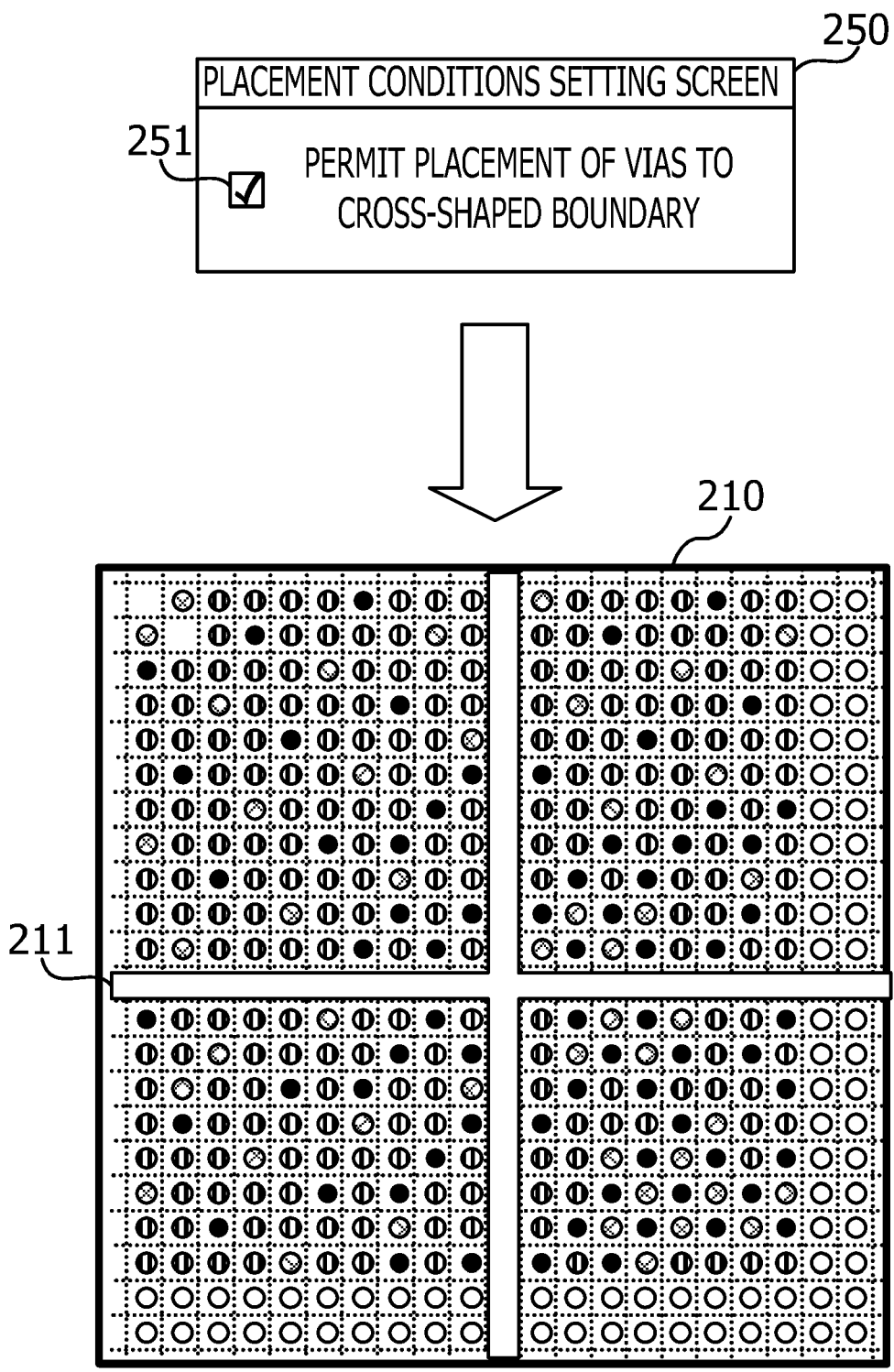
FIG. 27 illustrates a situation of settings regarding whether to place on a cross-shaped boundary portion.

FIG. 27 illustrates a situation of settings regarding whether to place on a cross-shaped boundary portion. The user interface unit 120 displays a placement conditions setting screen 250 on the monitor 71. The placement conditions setting screen 250 is provided with a checkbox 251 for specifying whether to permit placement to a cross-shaped boundary 211. In the event of permitting placement of decoupling capacitors to the cross-shaped boundary 211, the designer selects the checkbox 251 to display a checkmark. The specification of whether to permit placement to the cross-shaped boundary 211 is notified from the user interface unit 120 to the cross-shaped boundary placement permissibility setting unit 134 within the part placement computation unit 130. In the event that placement to the cross-shaped boundary 211 is permitted, the cross-shaped boundary placement permissibility setting unit 134 sets the via formation candidate positions within the cross-shaped boundary 211 to unresearched. Also, in the event that placement to the cross-shaped boundary 211 is not permitted, the cross-shaped boundary placement permissibility setting unit 134 sets the via formation candidate positions within the cross-shaped boundary 211 to researched.

In many cases, no vias are placed on the cross-shaped boundary 211 of the BGA terminal, in order to allow lines to be passed through there. Accordingly, in the event of the designer giving priority to wiring at the cross-shaped boundary 211, the designer must permit placement to the cross-shaped boundary 211. Also, in the event of giving priority to decoupling capacitors over wiring to the cross-shaped boundary 211, the designer can permit placing vias to the cross-shaped boundary 211. Thus, user instructions are enable in which disposing of vias to the cross-shaped boundary 211 is permitted in the event of giving priority to decoupling capacitors over wiring.

Figure 28:
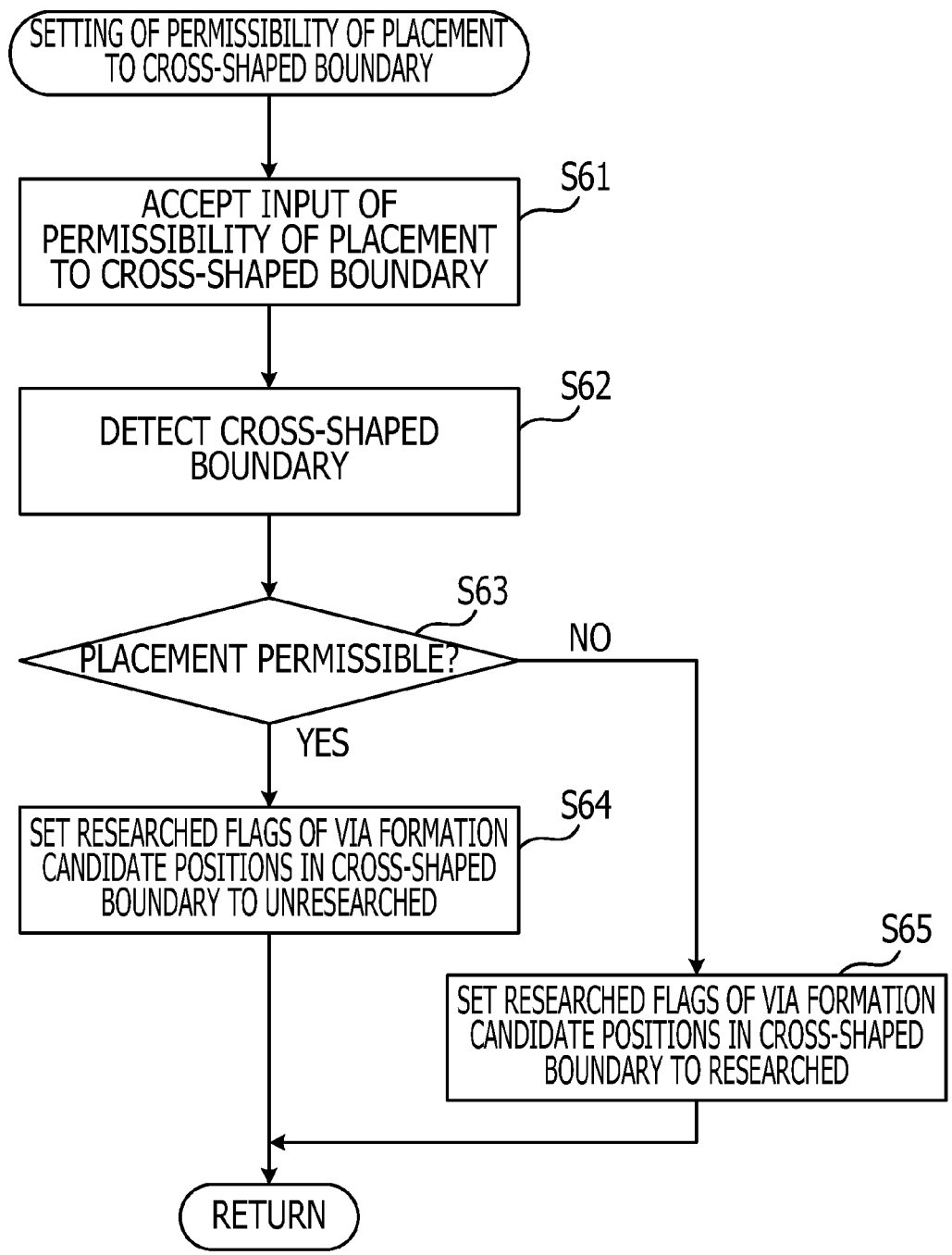
FIG. 28 is a flowchart illustrating procedures for setting regarding whether to place on a cross-shaped boundary portion.

FIG. 28 is a flowchart illustrating cross-shaped boundary placement permissibility setting processing. Description of the processing shown in FIG. 28 will now be made following the operation Nos. therein.

[Operation S61] The cross-shaped boundary placement permissibility setting unit 134 accepts input of whether to permit placement to the cross-shaped boundary. Specifically, the cross-shaped boundary placement permissibility setting unit 134 obtains the contents of instructions regarding whether to permit placement to the cross-shaped boundary on the placement conditions setting screen 250, by way of the user interface unit 120.

[Operation S62] The cross-shaped boundary placement permissibility setting unit 134 detects the cross-shaped boundary. Specifically, the cross-shaped boundary placement permissibility setting unit 134 obtains the middle cross-shaped line form the perimeter of the BGA part. For example, in the event that the BGA part is a square, the cross-shaped boundary placement permissibility setting unit 134 obtains the coordinates of the four vertices (vertex coordinates) form the perimeter. Next, the cross-shaped boundary placement permissibility setting unit 134 obtains the center point of neighboring vertices. The cross-shaped boundary placement permissibility setting unit 134 then recognizes two line segments connecting the center points of facing sides as the center cross-shaped lines.

Once the center cross-shaped lines have been obtained, the cross-shaped boundary placement permissibility setting unit 134 detects one row each, vertically and horizontally, of via formation candidate positions, closest to the center cross-shaped lines. The cross-shaped boundary placement permissibility setting unit 134 recognizes the one row each, vertically and horizontally, of via formation candidate positions, as the cross-shaped boundary.

[Operation S63] The cross-shaped boundary placement permissibility setting unit 134 determines whether the content of the input of whether to permit placement to the cross-shaped boundary is placement permitted, or placement not permitted. In the event that this is placement permitted, the flow advances to operation S64. In the event that this is placement not permitted, the flow advances to operation S65.

[Operation S64] In the event of placement permitted, the cross-shaped boundary placement permissibility setting unit 134 sets the via formation candidate position researched flags at the cross-shaped boundary to "unresearched". Subsequently, the processing ends.

[Operation S65] In the event of placement not permitted, the cross-shaped boundary placement permissibility setting unit 134 sets the via formation candidate position researched flags at the at the cross-shaped boundary to "researched". Subsequently, the processing ends.

Thus, in the event that placement of decoupling capacitors to the cross-shaped boundary is not permitted, "researched" flags are set to all of the via formation candidate positions within the cross-shaped boundary. A researched flag indicates that determination regarding whether via formation is permitted, performed at the time for searching for a via formation candidate position for a connection destination for outline wiring from a terminal, has already been completed. That is to say, when a researched flag is set, that via formation candidate position will not be selected as a outline wiring connection destination any more. No decoupling capacitors are placed at via formation candidate positions not used as outline wiring connection destinations, either.

On the other hand, in the event that placement of decoupling capacitors to the cross-shaped boundary is permitted, "unresearched" flags are set to all of the via formation candidate positions within the cross-shaped boundary. Thus, the via formation candidate positions within the cross-shaped boundary are also objects of research, an hence decoupling capacitors can be placed there, as well.

Thus, enabling decoupling capacitors to be placed within the cross-shaped boundary according to instructions by the designer allows even more decoupling capacitors to be placed.

Next, decoupling capacitor placement and wiring processing will be described.

Figure 29:
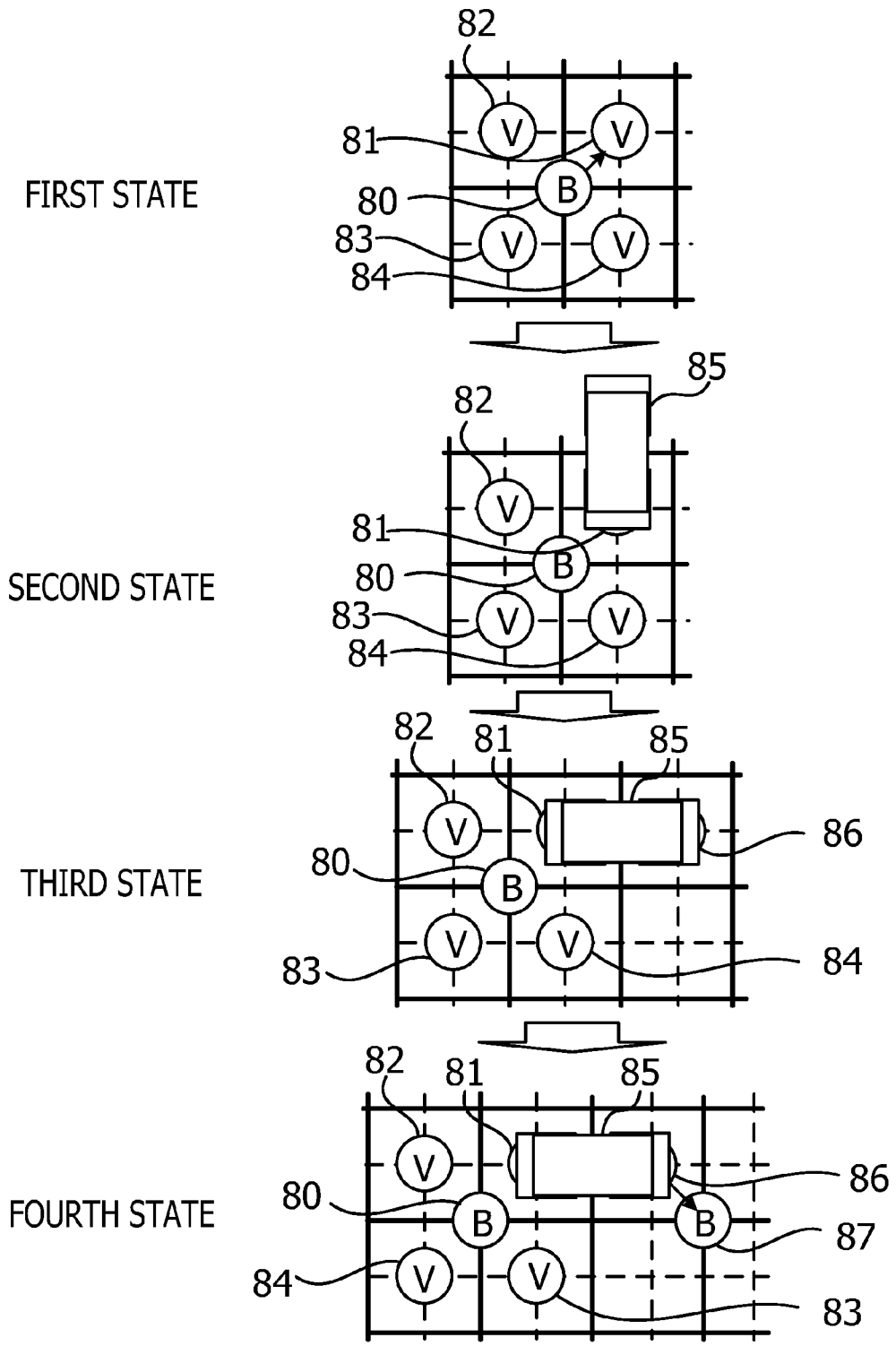
FIG. 29 illustrates procedures for decoupling capacitor placement in a case wherein vias are to be situated in a manner shifted half a grid from terminals.

FIG. 29 illustrates decoupling capacitor placement procedures in a case of placing vias shifted half-grid from the terminals. FIG. 29 illustrates the state transition at the time of placement of a decoupling capacitor with first through fourth states.

The first state illustrates a situation of searching for a via to connect the outline wring from a selected terminal 80. In this example, the position of a via 81 to the upper right of the terminal 80 is selected as the via formation candidate position.

The second state illustrates a situation of temporary connection of a decoupling capacitor 85 to the via 81 at the via formation candidate position.

The third state illustrates a situation of searching for a via to which the other terminal of the temporarily-connected decoupling capacitor 85 can be connected to. In this example, the upper right via 86 has been selected as the connection destination.

The fourth state illustrates a situation of searching for a terminal from which outline wiring can taken to the via selected as the connection destination of the decoupling capacitor 85. In this example, the via 87 has been selected. Note that in the event that the terminal 80 selected at first is a power source terminal or signal terminal, the via 87 has to be a ground terminal.

Figure 30:
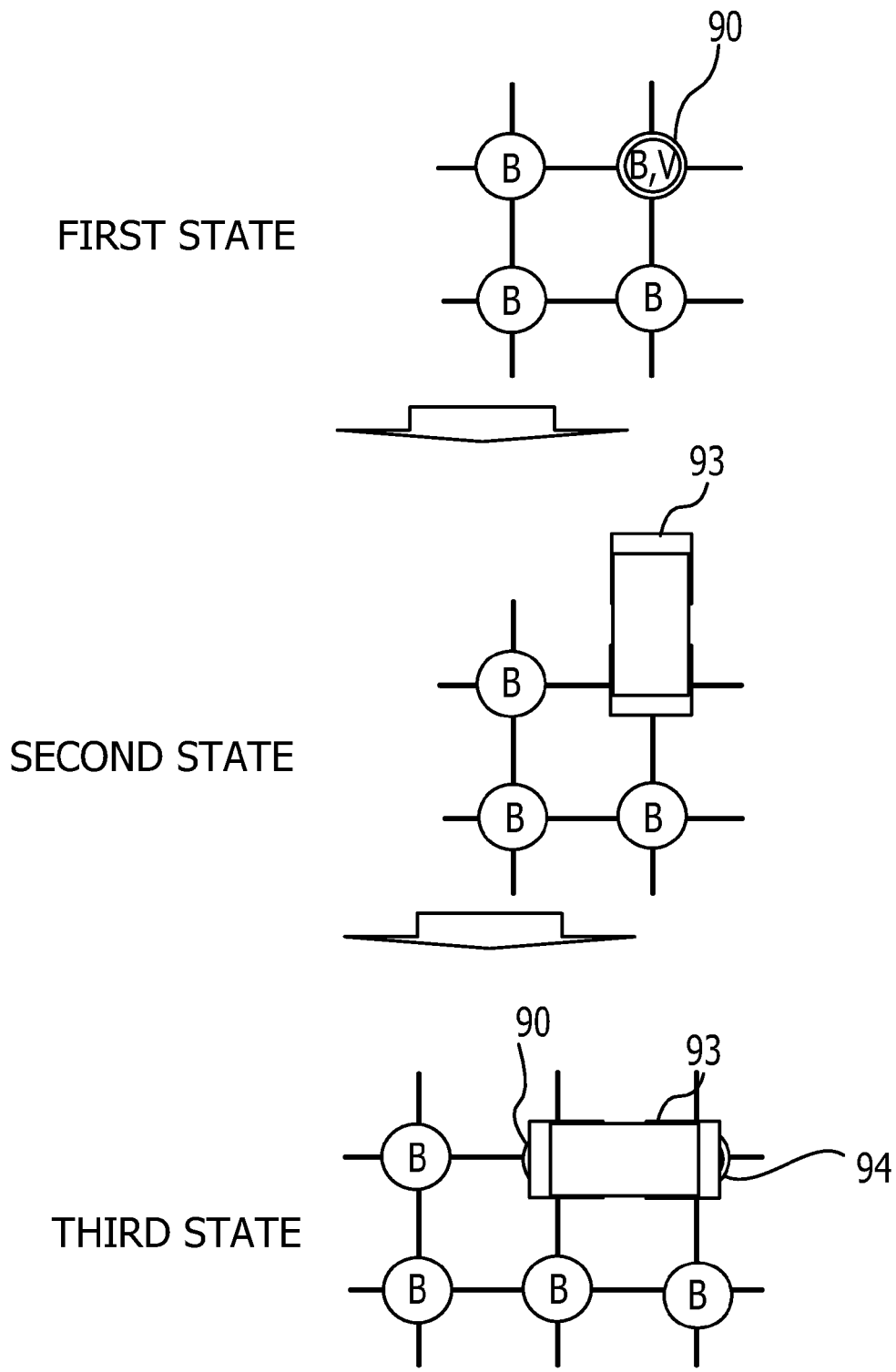
FIG. 30 illustrates procedures for decoupling capacitor placement in a case wherein vias are to be situated directly below terminals.

FIG. 30 illustrates decoupling capacitor placement procedures in a case of placing vias directly beneath the terminals. FIG. 30 illustrates the state transition at the time of placement of a decoupling capacitor with first through third states.

The first state illustrates a situation of determining placement of a via directly beneath a selected terminal 90. In FIG. 30, terminals with vias formed directly beneath are indicated by the reference symbol "B, V".

The second state illustrates a situation of temporary connection of a decoupling capacitor 93 to the via of the via formation candidate position.

The third state illustrates a situation of searching for a via which can be connected to the other terminal of the decoupling capacitor 93 which has been temporarily connected. In this example, the position of the terminal 94 to the right has been selected as the via formation candidate position to which to connect the decoupling capacitor 93.

Figure 31:
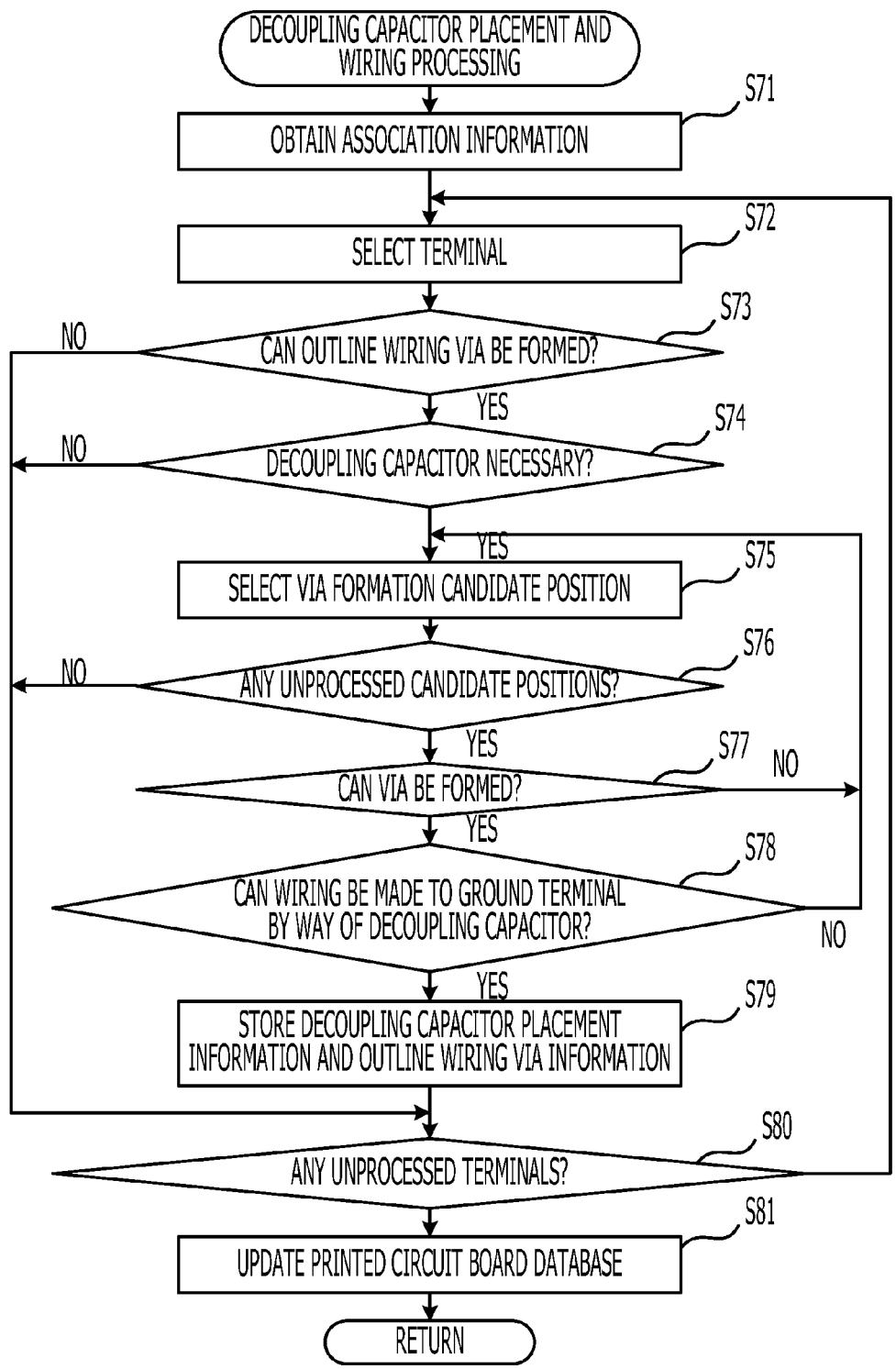
FIG. 31 is a flowchart illustrating procedures for decoupling capacitor placement and wiring processing.

FIG. 31 is a flowchart illustrating decoupling capacitor placement and wiring processing. Note that in the event that there are multiple BGA parts regarding which decoupling capacitor placement is to be performed, the processing shown in FIG. 31 is performed for each BGA part. Description of the processing shown in FIG. 31 will now be made following the operation Nos. therein.

[Operation S71] The connection relation determining unit 135 obtains association information 115 relating to the BGA part regarding which the decoupling capacitors are to be placed, from the printed circuit board database 110. Also, the connection relation determining unit 135 recognizes the order of priority of selection of the terminals of the BGA part by making reference to the connection information storage unit 131. That is to say, terminals having higher order in the BGA terminal list 131a shown in FIG. 21 are selected with priority.

[Operation S72] The connection relation determining unit 135 selects the terminals following the order of priority. That is to say, the connection relation determining unit 135 selects, of unselected terminals, the terminal which is of the highest order within the BGA terminal list 131a.

[Operation S73] The connection relation determining unit 135 determines whether an outline wiring via can be formed. In the event of placing vias shifted half-grid form the terminal, positions at which outline wiring vias can be formed are searched for from around the selected terminal.

In the event of placing vias directly beneath the terminals, determination is made regarding whether a via can be formed directly beneath the selected terminal. Note that in the following description, we will say that vias are placed shifted half-grid from the terminals.

In the event that outline wiring vias can be formed, the flow advances to operation S74. In the event that outline wiring vias cannot be formed, the flow advances to operation S80.

[Operation S74] The connection relation determining unit 135 determines whether the terminal is a terminal which needs connection of a decoupling capacitor. Specifically, in the event that the terminal is a terminal which has been correlated with a decoupling capacitor in the association information 115, the connection relation determining unit 135 determines that the terminal is a terminal which needs connection of a decoupling capacitor. Also, the connection relation determining unit 135 makes reference to the a part information 111, and determines that the selected terminal needs connection of a decoupling capacitor if a power source terminal. Note that an arrangement may be made wherein the connection relation determining unit 135 makes reference to the a part information 111 and determines that the selected terminal is a terminal which needs connection of a decoupling capacitor if a signal terminal, as well. In the event that the terminal is a terminal which needs connection of a decoupling capacitor, the flow advances to operation S75. In the event that the terminal is a terminal which does not need connection of a decoupling capacitor, the flow advances to operation S80.

[Operation S75] The connection relation determining unit 135 selects a via formation candidate position. Specifically, the connection relation determining unit 135 selects a via formation candidate position where wiring can be performed from around the terminal, according to the order of priority determined by the priority wiring direction determining unit 133.

[Operation S76] The connection relation determining unit 135 determines whether the selected via formation candidate position is an unprocessed candidate position. If an unprocessed candidate position, the flow advances to operation S77. If a processed candidate position, the flow advances to operation S80.

[Operation S77] The connection relation determining unit 135 determines whether a via can be formed at the selected via formation candidate position. Specifically, in the event that a researched flag has been set for the selected via formation candidate position, the connection relation determining unit 135 determines that placement cannot be performed. For example, determination is made that vias cannot be formed at via formation candidate positions within the cross-shaped boundary if formation of vias to the cross-shaped boundary has not been permitted.

[Operation S78] The connection relation determining unit 135 determines whether a decoupling capacitor can be connected by way of a via formed at the selected via formation candidate position and connection made to a ground terminal by way of the decoupling capacitor. Note that determination is made by the connection relation determining unit 135 that connection cannot be made, if connection cannot be made to a ground terminal via the selected terminal by way of the decoupling capacitor even though re-placement of already-placed decoupling capacitors and re-setting of outline wiring has been performed. In the event that re-placement of decoupling capacitors can be performed and connection can be realized, the flow advances to operation S79. In the event that connection cannot be made, the flow advances to operation S75.

[Operation S79] The connection relation determining unit 135 stores information indicating the wiring up to the ground terminal from the selected terminal by way of the decoupling capacitor, and the placement location of the decoupling capacitor, in the connection information storage unit 131.

[Operation S80] The connection relation determining unit 135 determines whether there are unprocessed terminals. In the event that there are unprocessed terminals, the flow returns to operation S72. In the event that processing has been completed for all terminals, the flow advances to operation S81.

[Operation S81] The connection relation determining unit 135 updates information relating to wiring and information relating to the placement locations of decoupling capacitors in the printed circuit board database 110. Subsequently, the processing ends.

Thus, placement of decoupling capacitors is attempted for all terminals of the BGA part needing placement of decoupling capacitors. Placement is determined for as many decoupling capacitors as possible. Automatically determining the placement of the decoupling capacitors alleviates the work burden on the designer of the printed circuit board.

Next, connection association display processing regarding the BGA part terminals and decoupling capacitors will be described in detail.

Figure 32:
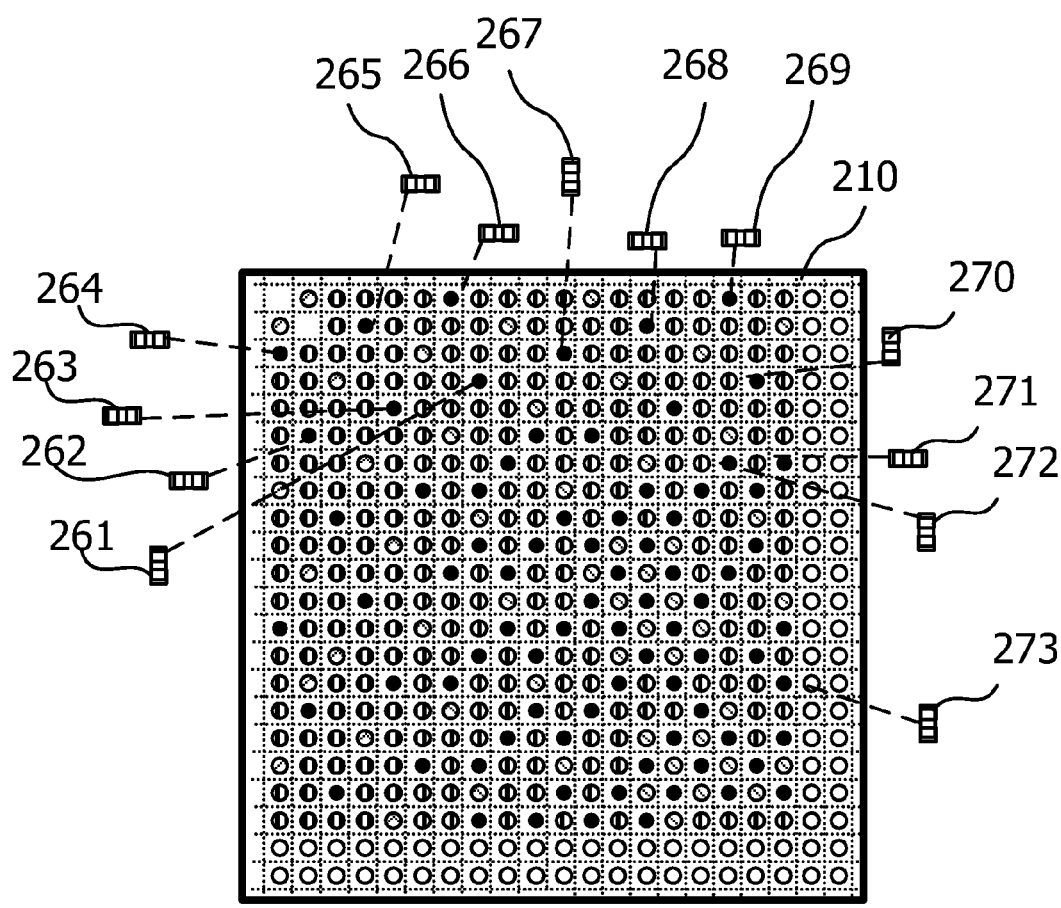
FIG. 32 illustrates an example of a association display screen for BGA part terminals and decoupling capacitors.

FIG. 32 illustrates the association between terminals of a BGA part and decoupling capacitors. The decoupling capacitor manual placement unit 122 of the user interface unit 120 displays association lines connecting between the terminals and decoupling capacitors 261 through 273, based on the association information of the BGA part 210 terminals and decoupling capacitors 261 through 273. Association lines are line segments of which the ends are the position of a terminal and the position of a decoupling capacitor. Accordingly, the association can be readily visually comprehended, and placement without error can be assisted when placing the decoupling capacitors manually.

Note that the decoupling capacitor manual placement unit 122 displays the association lines connecting decoupling capacitors and terminals not only when in a still state, but also while moving (dragging) a decoupling capacitor as well.

Figure 33:
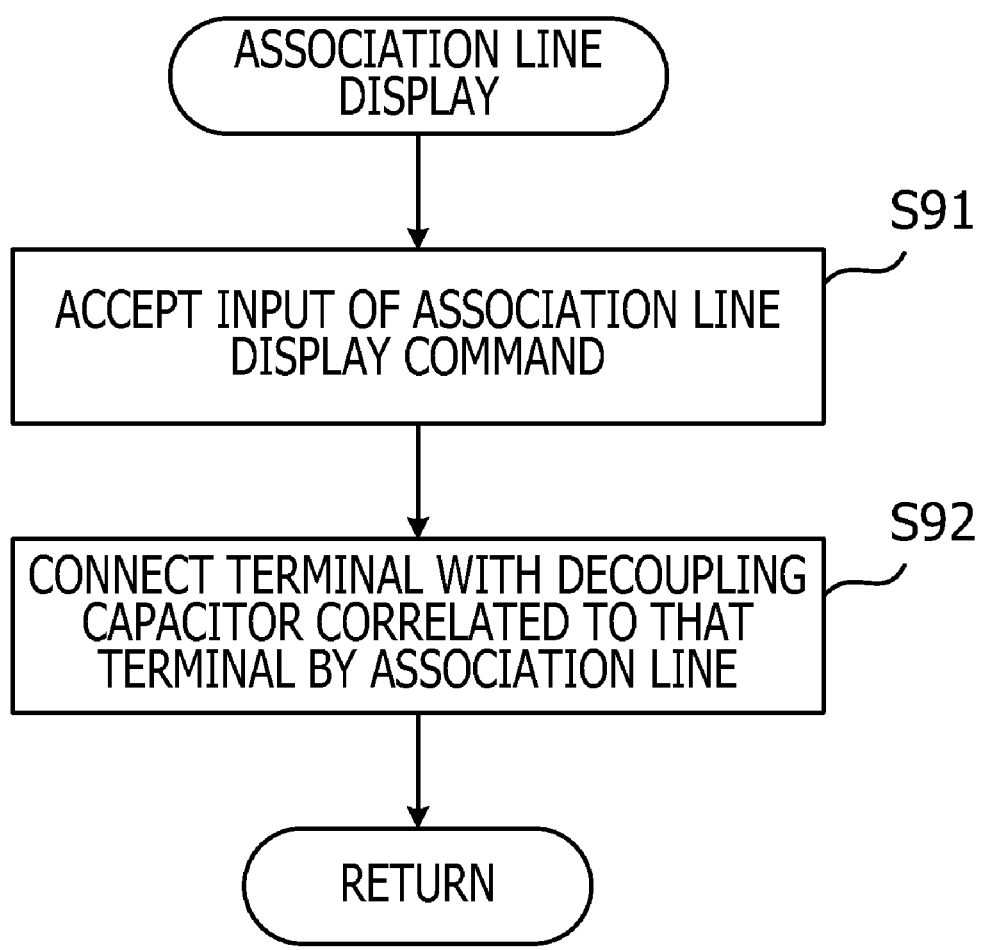
FIG. 33 is a flowchart illustrating procedures for related line display processing.

FIG. 33 is a flowchart illustrating association line display processing. Description of the processing shown in FIG. 33 will now be made following the operation Nos. therein.

[Operation S91] The decoupling capacitor manual placement unit 122 accepts operation input indicating an association line display command form the designer.

[Operation S92] The decoupling capacitor manual placement unit 122 makes reference to the association information 115, and connects the terminals of the BGA part 210 and decoupling capacitors correlated with the terminals, by association lines. Hereafter, the decoupling capacitor manual placement unit 122 updates the ends of the association lines even while decoupling capacitors are being moved, thereby generating association lines in real time.

The designer can make reference to association lines displayed in this way to perform operation input instructing placement of new decoupling capacitors, moving the position of decoupling capacitors already placed automatically, and so forth. The decoupling capacitor manual placement unit 122 moves the decoupling capacitors in accordance with operation input form the designer, and displays association lines. Upon a decoupling capacitor being moved to a position where a via can be formed, and operation input for finalization being performed, the decoupling capacitor manual placement unit 122 finalizes the position of the decoupling capacitor at that point in time, and updates the printed circuit board database 110.

Adequacy determining processing will be described in detail. In the event that the placement work of decoupling capacitors has been completed, or even partway through the decoupling capacitor placement processing, the designer can perform operation input to instruct adequacy determining. The adequacy determining instruction is sent to the adequacy determining unit 141 by way of the user interface unit 120. In response to the adequacy determining instruction, the adequacy determining unit 141 calculates the decoupling capacitor adequacy percentage for each power source type of the BGA part. The adequacy percentages are displayed on the monitor 71 by way of the user interface unit 120.

Figure 34:
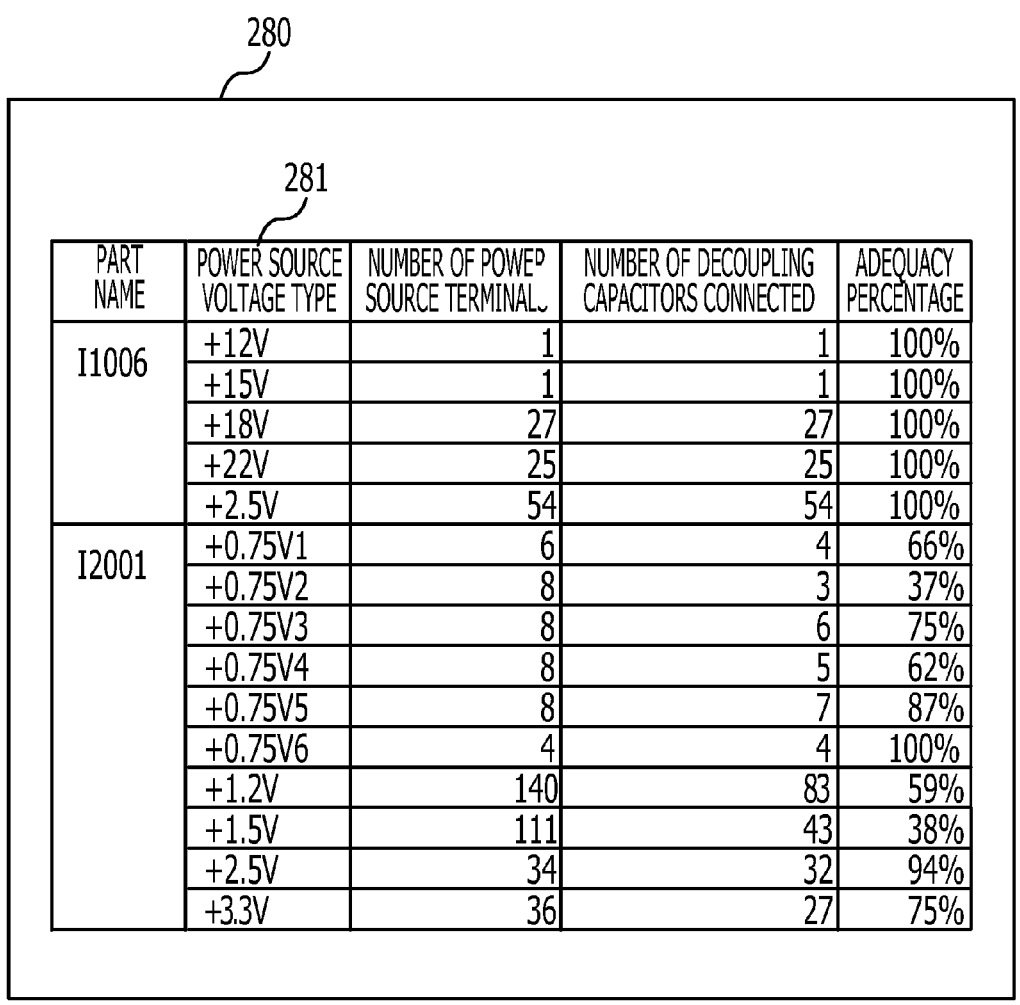
FIG. 34 illustrates an example of an adequacy display screen.

FIG. 34 illustrates an example of an adequacy display screen. An adequacy display screen 280 has the computation results of the adequacy percentages shown as an adequacy information table 281. The adequacy information table 281 is information which has been created by the adequacy determining unit 141 and stored in the RAM 102.

The adequacy information table has columns of "part name", "power source voltage type", "number of power source terminals", "number of decoupling capacitor connecting terminals", and "adequacy percentage". Under the "part name" column is displayed the part No. of the BGA part. Under the "power source voltage type" column are displayed the voltage types of the power source terminals of the BGA part. Under the "number of power source terminals" column are displayed the number of terminals of the corresponding voltage type. Under the "number of decoupling capacitor connecting terminals" column are displayed the number of terminals of the corresponding voltage type to which decoupling capacitors have been connected. Also, "adequacy percentage" shows the adequacy of the terminals of the corresponding voltage type, as a percentage obtained by the number of the terminals to which decoupling capacitors have been connected being divided by the number of power source terminals, and multiplied by 100.

Figure 35:
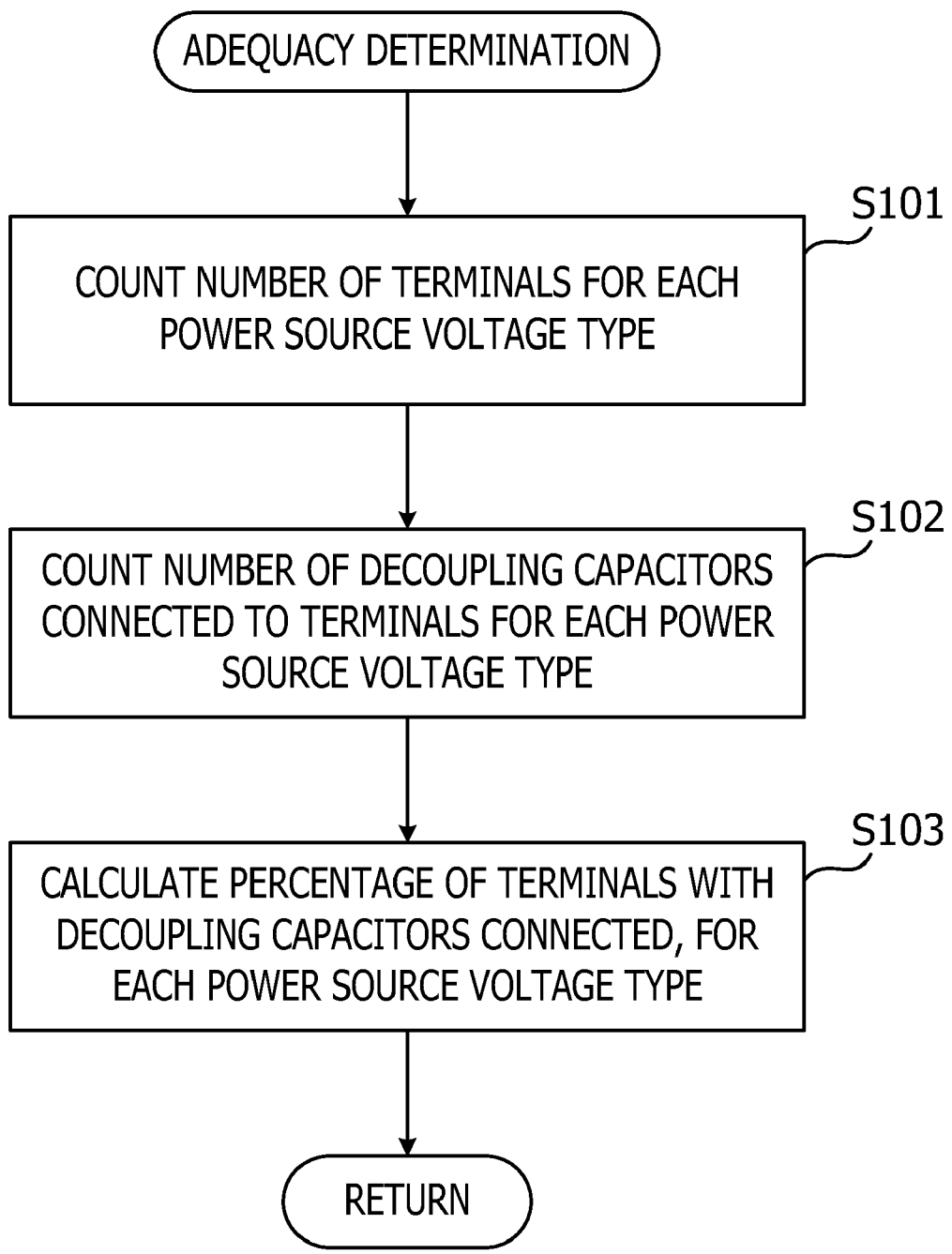
FIG. 35 is a flowchart illustrating procedures for adequacy determination processing.

FIG. 35 is a flowchart illustrating adequacy determination processing. Description of the processing shown in FIG. 35 will now be made following the operation Nos. therein.

[Operation S101] The adequacy determining unit 141 counts the number of terminals for each power source voltage type. For example, the adequacy determining unit 141 makes reference to the part terminal group information 111a within the a part information 111 and counts the number of terminal Nos. for each power source type.

[Operation S102] The adequacy determining unit 141 counts the number of decoupling capacitors connected to terminals, for each power source voltage type. For example, the adequacy determining unit 141 makes reference to the net information 114 and determines the vias which are the connection destinations of outline wiring of the terminals, and determines whether a decoupling capacitor has been placed at each via with reference to the a part information 111. Further, the adequacy determining unit 141 classifies the terminals to which decoupling capacitors have been connected, by power source type. The adequacy determining unit 141 then counts the number of terminals to which decoupling capacitors have been connected, by power source type.

[Operation S103] The adequacy determining unit 141 calculates the percentage of terminals to which decoupling capacitors have been connected, by each power source voltage type. The adequacy determining unit 141 then compiles the adequacy information table 281, and stores it in a storage medium such as the RAM 102. The adequacy information table 281 stored in the RAM 102 is displayed on the monitor 71 by way of the user interface unit 120.

Displaying the adequacy percentage in this way allows the situation of ensuring reliability of the printed circuit board by having placed decoupling capacitors. That is to say, due to the increased speed of signals as of recent, it is understood that having one or more decoupling capacitor connected per power source terminal should be a target to suppress power source noise, but visually confirming this with a BGA part which has a great number of parts is extremely difficult. An arrangement wherein the adequacy of connections between the terminals and decoupling capacitors for each power source voltage type grouped by BGA parts, as with the present embodiment, clarifies the existence of terminals to which decoupling capacitors are not connected, by power source type. If a terminal to which a decoupling capacitor is not connected is a low-voltage power source type terminal, the designer will instantly recognize this to be a placement defect with insufficient decoupling capacitors.

Next, connection condition violation detection processing will be described in detail. In the event that the placement work of decoupling capacitors has been completed, or even partway through the decoupling capacitor placement processing, the designer can perform operation input to instruct detection of connection condition violations.

Figure 36:
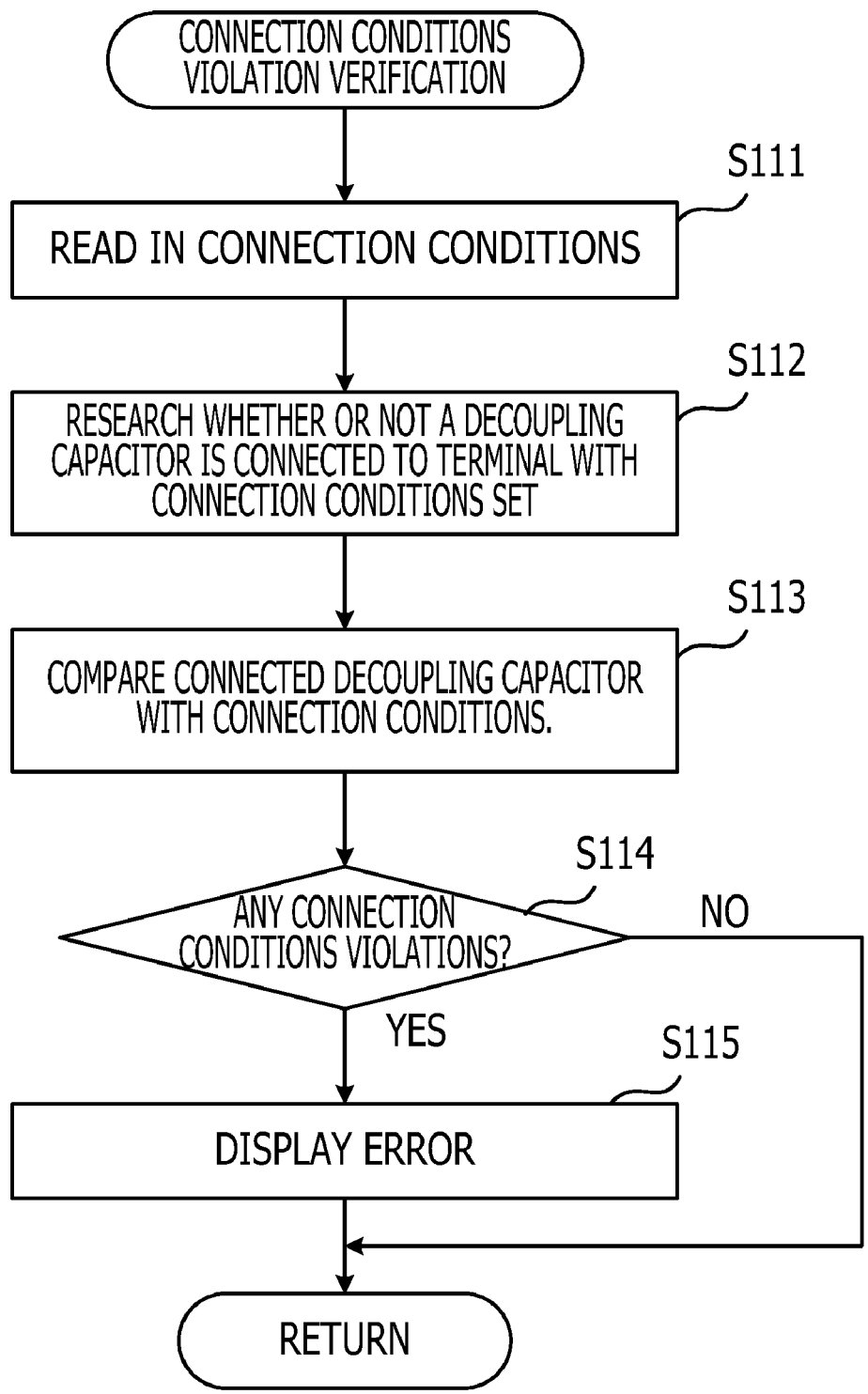
FIG. 36 is a flowchart illustrating procedures for connection condition violation detection processing.

FIG. 36 is a flowchart illustrating connection condition violation detection processing. Description of the processing shown in FIG. 36 will now be made following the operation Nos. therein.

[Operation S111] The connection condition verification unit 142 accepts instructions for detection of connection condition violations by way of user interface unit 120, and then reads in connection conditions for the BGA part from the association information 115 (shown in FIG. 13) from the printed circuit board database 110.

[Operation S112] The connection condition verification unit 142 researches whether there is a decoupling capacitor connected to a terminal regarding which a connection condition has been set. For example, in the case of following placement of a decoupling capacitor, the connection condition verification unit 142 makes reference to the printed circuit board database 110 and determines whether decoupling capacitors are connected to each of the terminals of the BGA part by way of vias. Also, in the case of during placement work of the decoupling capacitors, the connection condition verification unit 142 makes reference to information within the connection information storage unit 131, and recognizes the current placement situation of decoupling capacitors to the terminals of the BGA part.

[Operation S113] The connection condition verification unit 142 compares the decoupling capacitors connected to each of the terminals with the connection conditions. Specifically, the connection condition verification unit 142 compares with regard to the names of the connected decoupling capacitors, mounting face, distance from the terminals of the BGA part, and so on.

[Operation S114] The connection condition verification unit 142 determines whether there are decoupling capacitors not satisfying the connection conditions of the terminals. If there is such a decoupling capacitor, the flow advances to operation S115. If there is no such decoupling capacitor, the processing ends.

[Operation S115] The connection condition verification unit 142 outputs an error message including the part No. of a decoupling capacitor satisfying the connection conditions, contents of the connection conditions not satisfied, and so forth. The error message is displayed on the monitor 71 by way of the user interface unit 120. For example, the user interface unit 120 displays a list of connection conditions, and highlights connection conditions thereof not satisfied with red text, for example. Also, the user interface unit 120 can make an error display such as a text display of the error portion.

Thus, in the event that there is mounted a decoupling capacitor satisfying the connection conditions, an error message can be displayed. That is to say, by checking whether the decoupling capacitors are connected to the terminals in accordance with the connection conditions of the decoupling capacitors to the terminals of the BGA part, whether physical connections have been made according to the circuit diagram can be confirmed without human intervention. Consequently, the work load of the designer is alleviated.

A third exemplary embodiment realizes high-speed processing by expanding bipartite graph matching techniques for searching of placement positions of the decoupling capacitors. A bipartite graph is a graph wherein a set of vertices is divided into two, and sides are restricted to those connecting the two subsets. Performing matching between a set of terminals and a set of via formation candidate positions enables a pair of a terminal and a via formation candidate position to be created. Note that the components necessary for the printed circuit board design assisting device according to the third embodiment may be the same as with the case of the second embodiment shown in FIG. 10. However, with the third embodiment, the connection relation determining unit 135 determines decoupling capacitor placement and wiring using a bipartite graph. Accordingly, the third embodiment will be described using the reference numerals of the components shown in FIG. 10.

Note that in the following description, correlating a terminal with a via formation candidate position connected therefrom by outline wiring will be referred to as appropriating via the formation candidate position to the terminal. Also, correlating a terminal with a decoupling capacitor to be connected to the terminal by way of the via formation candidate position will be referred to as appropriating the decoupling capacitor to the terminal.

In the third embodiment, description of the information stored in the connection information storage unit 131 will first be described. The connection information storage unit 131 stores a BGA terminal list, via formation candidate position list, researched element list, temporary connection relation list, and appropriation-resolved terminal list.

Figure 37:
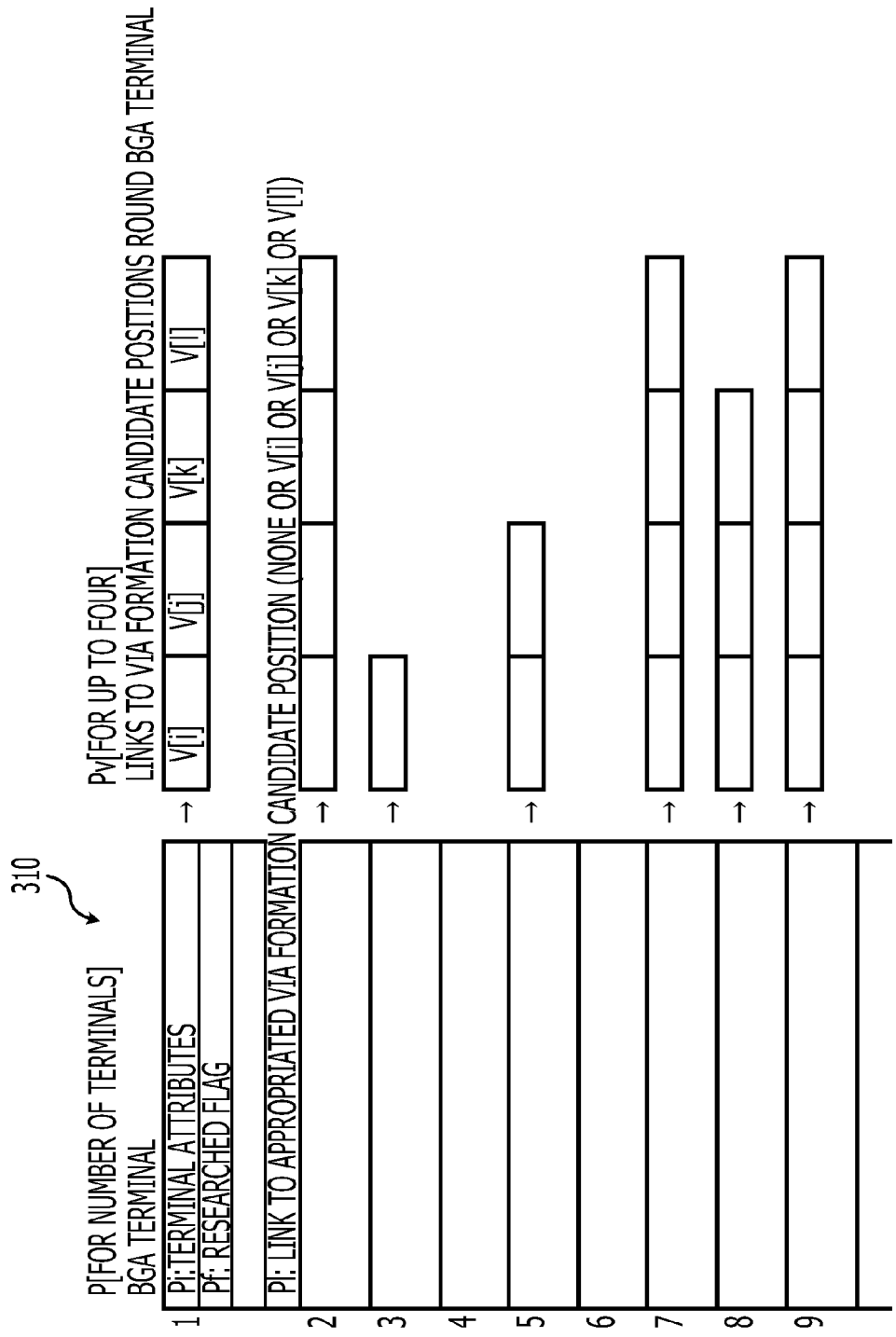
FIG. 37 illustrates an example of the data structure of a BGA terminal list.

First, the BGA terminal list will be described. FIG. 37 illustrates an example of the data structure of the BGA terminal list. The BGA terminal list 310 is a registration region of information indicating the research situation of the terminals of the BGA part. A BGA terminal list 310 is provided for each BGA part. Records of a number equivalent to the number of terminals provided to the BGA part can be registered in each BGA terminal list 310. Each record is represented as array $P[n_1]$. This $n_1$ is an index assuming a value of an integer that is one or greater, but not greater than the number of terminals.

Each record in the BGA terminal list includes data such as terminal attribute (Pi), researched flag (Pf), link to appropriated via formation candidate position (Pl), and so forth.

Note that "link" may be defined as information indicating correlating to predetermined data. In the event that the data which is correlated by the link is one element of the array, the array name and index value will indicate the data linked to.

The terminal attribute is an identifier indicating whether a power source terminal, signal terminal, or ground terminal.

The researched flag is flag information indicating whether research has been performed regarding whether a decoupling capacitor can be placed for the terminal. For example, if unresearched, "0" is set to the researched flag, and if researched, "1" is set to the researched flag.

Information indicating the via formation candidate position determined as the connection destination of the outline wiring is registered to the link to the appropriated via formation candidate position. The information indicating the via formation candidate position is an array V where an index value corresponding to the via formation candidate position has been set. Note that in the event that a via formation candidate position has not been appropriated to a terminal, there is no information linking to an appropriated via formation candidate position.

Also, a link to via formation candidate positions around the BGA terminal is correlated with each record in the BGA terminal list 310. Each link is represented as array $P[n_2]$. This $n_2$ is an index assuming a value of an integer from 1 to 4. Information indicating via formation candidates is registered in the link to the via formation candidate position. The information indicating a via formation candidate position is an array V in which an index value corresponding to the via formation candidate position has been set. The links to via formation candidate positions are arrayed in the order of priority of the via formation candidate positions when selecting as an object of searching. Note that the number of links to via formation candidate positions around BGA terminals differs depending on the terminal, and the maximum number is four.

Figure 38:
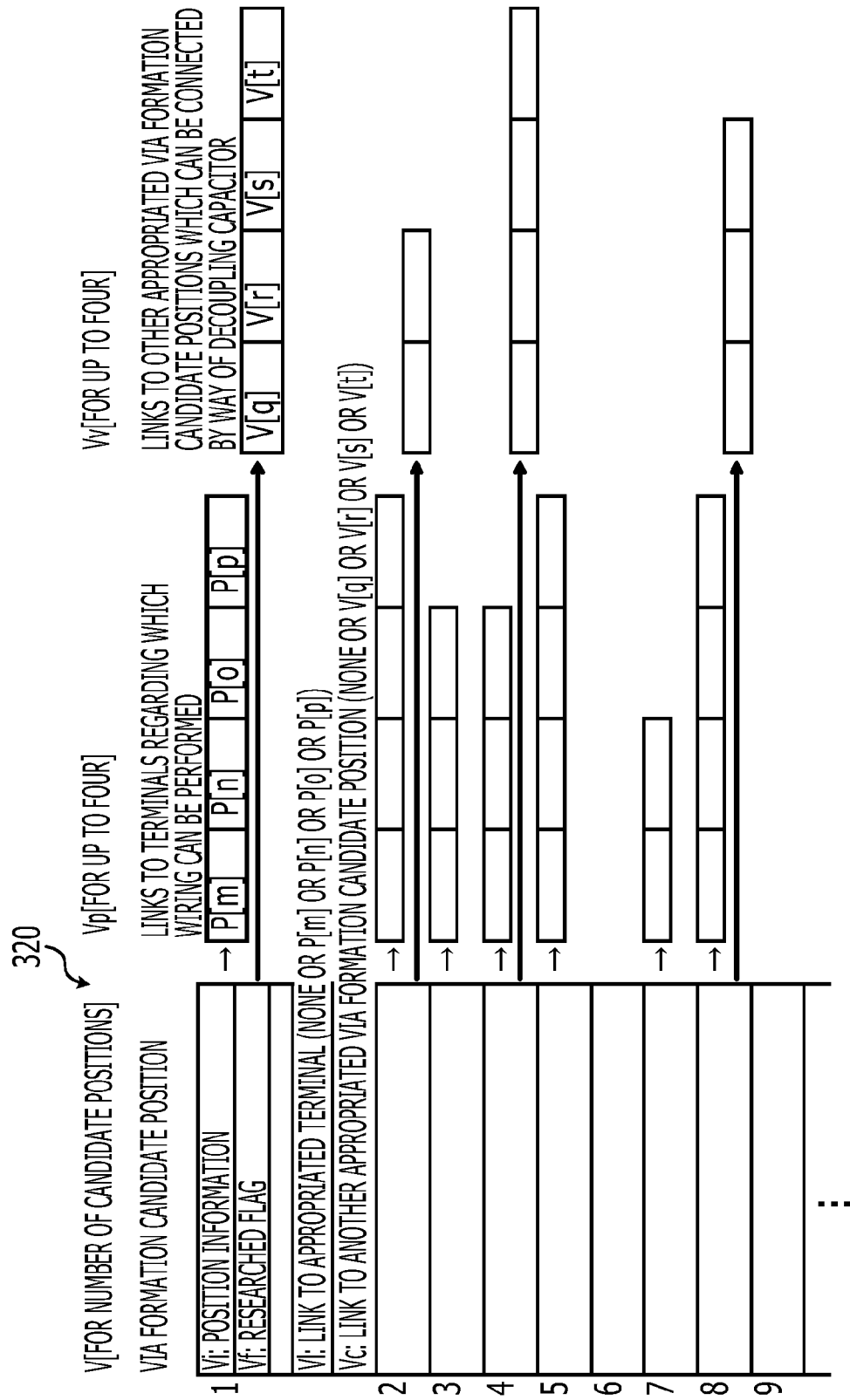
FIG. 38 illustrates an example of the data structure of a via formation candidate position list.

Next, the via formation candidate position list will be described. FIG. 38 illustrates an example of the data structure of a via formation candidate position list. The via formation candidate position list 320 is a registration region for information indicating the registered situation of BGA terminals relating to via formation candidate positions. A via formation candidate position list 320 is provided for each BGA terminal. For each via formation candidate position list 320, records can be registered of a number equivalent to the number of via formation candidate positions within the region where the BGA terminal is to be mounted on the printed circuit board. Each link is represented as array $V[n_3]$. This $n_3$ is an index assuming a value of an integer that is 1 or greater but not greater than the number of via formation candidate positions.

Included in each record of the via formation candidate position list 320 is data such as position information (Vi), registered flag (Vf), link to appropriated terminal (Vl), link to appropriated other via formation candidate position (Vc), and so forth.

Position information is coordinates indicating the via formation candidate position on the printed board. Position information is correlated with a link to terminals capable of outline wiring to the via formation candidate position. Each link is represented as array $Vp[n_4]$. This $n_4$ is an index assuming a value of an integer from 1 to 4. Note that the number of links to terminals capable of outline wiring to via formation candidate positions differs depending on the via formation candidate position, and the maximum number is four.

A registered flag is flag information indicating whether registration has been made as a connection destination of the terminal. For example, if unresearched, "0" is set to the researched flag, and if researched, "1" is set to the researched flag.

A registered flag is correlated with a link to another connectable via by way of a decoupling capacitor. Each link is represented as array Vv[$n_5$]. This $n_5$ is an index assuming a value of an integer from 1 to 4.

Information indicating the terminal to connect to the via formation candidate position by outline wiring is registered in the link to the appropriated terminal. The terminal is identified by the array P and index value corresponding to the terminal. Note that in the event that the via formation candidate position has not been appropriated to any terminal, there is no information of a link to an appropriated terminal.

An array V indicating another via formation candidate position to be connected by way of a decoupling capacitor is set in a link to another appropriated via.

Figure 39:
FIG. 39 illustrates an example of the data structure of a researched element list.

Next, the registered element list will be described. FIG. 39 illustrates an example of the data structure of a researched element list. The researched element list 330 is a registration region for information indicating the terminal of the BGA part regarding which research relating to connection of a decoupling capacitor has been performed, and the via formation candidate position. The BGA part regarding which research has been performed and the via formation candidate position are a terminal and via formation candidate position set with the research flag on (value indicating researched).

The number of records which can be registered in the researched element list 330 is obtained by adding the number of BGA terminals to the number of via formation candidate positions within the region of the printed circuit board where the BGA terminals are to be mounted (number of research elements). Each record is represented as array F[$n_6$]. This $n_6$ is an index assuming a value of an integer that is 1 or greater but not greater than the number of research elements.

Each record in the researched element list 330 has information set indicating a researched element (terminal or via formation candidate position). In the event that the researched element is a terminal, the researched element is specified by the array P in which is set an index value corresponding to a researched terminal. In the event that the researched element is a via formation candidate position, the researched element is specified by the array V in which is set an index value corresponding to a researched via formation candidate position.

Figure 40:
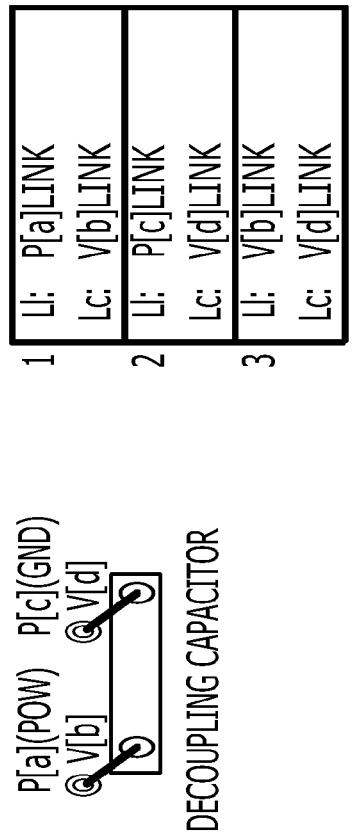
FIG. 40 illustrates an example of the data structure of a temporary connection relation list.

Next, the temporary connection relation list will be described. FIG. 40 illustrates an example of the data structure of the temporary connection relation list. The temporary connection relation list 340 is a registration region for information indicating the temporary connection relation between a terminal and a via formation candidate position, and between two via formation candidate positions. The number of records which can be registered in the temporary connection relation list 340 is a number obtained by adding the number of power source terminals to the entire number of terminals. Each record is represented as array L[$n_7$]. This $n_7$ is an index assuming a value of an integer that is 1 or greater but not greater than the number of records which can be registered.

A registered temporary connection relation is one of the following three connection relations. A first is a connection relation by wiring between a power source terminal (POW) and via formation candidate position. A second is a connection relation between a ground (GND) and via formation candidate position. A third is a connection relation between two via formation candidate positions by way of a decoupling capacitor.

Each record in the temporary connection relation list 340 has registered therein a pair of links indicating the positions of both ends of the connection relation. If a connection relation by wiring between a power terminal (POW) and via formation candidate position, a link to the terminal and a link to the via formation candidate position are registered within the record.

If a connection relation by wiring between a ground terminal (GND) and via formation candidate position, a link to the terminal and a link to the via formation candidate position are registered within the record in this case as well. If a connection relation between two via formation candidate positions by way of a decoupling capacitor, two links to the via formation candidate positions are registered within the record.

Figure 41:
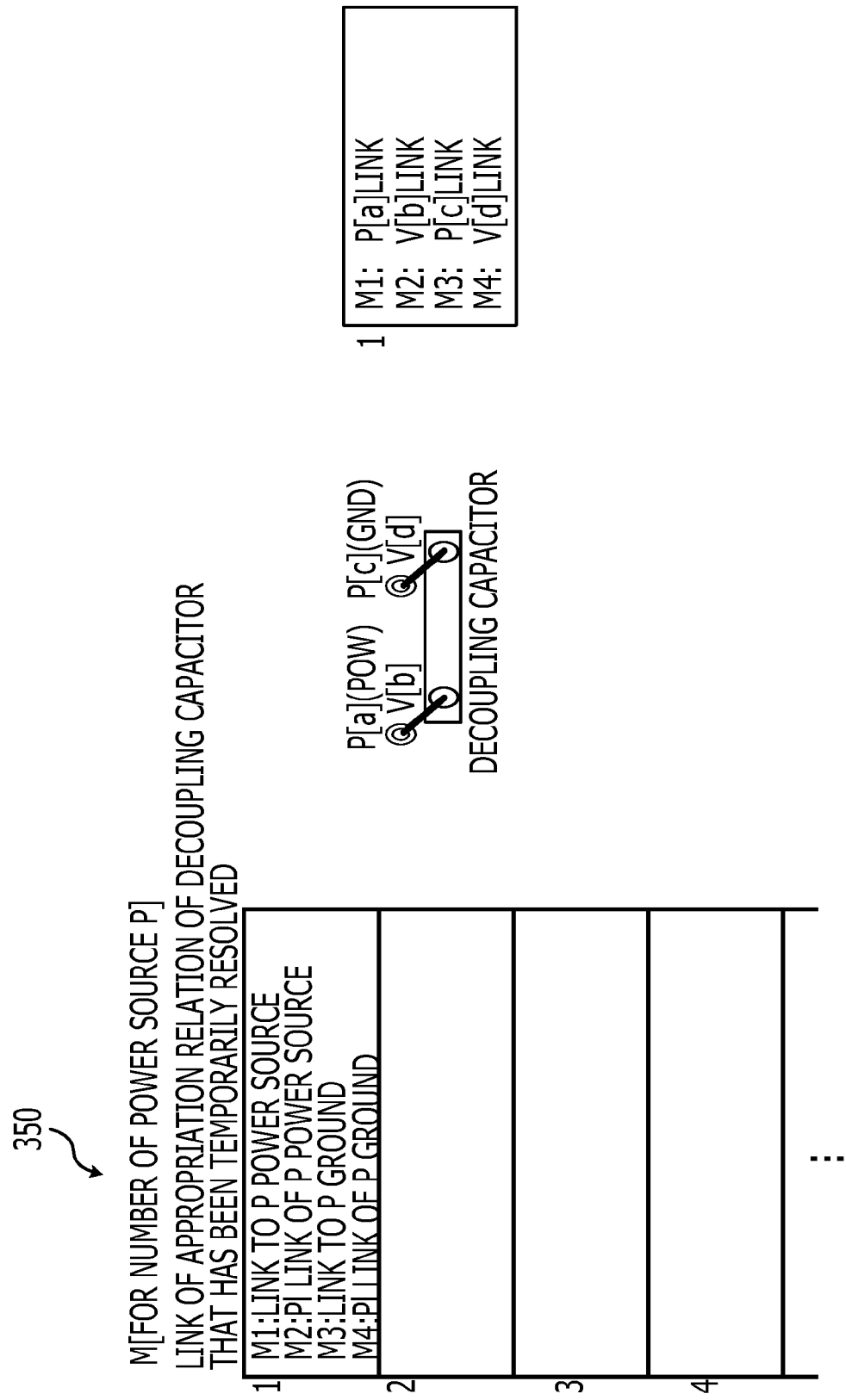
FIG. 41 illustrates an example of the data structure of an appropriation-resolved terminal list.

FIG. 41 illustrates an example of the data structure of an appropriation-resolved terminal list. The appropriation-resolved terminal list 350 is a registration region for information indicating an appropriation region before resolution in a case of having temporarily resolved appropriation of a decoupling capacitor which had been appropriated to a terminal. The number of records which can be registered in the appropriation-resolved terminal list 350 is the number of power source terminals. Each record is represented as array M[$n_8$]. This $n_8$ is an index assuming a value of an integer that is 1 or greater but not greater than the number of records which can be registered.

Four links are registered in each record of the appropriation-resolved terminal list 350. The first is a link to the power source terminal (M1). The second is a link to the via formation candidate position appropriated to the power source terminal (M2). The third is a link to the ground (GND) terminal connected with the power source terminal by way of a decoupling capacitor (M3). The fourth is a link to the via formation candidate position appropriated to the ground terminal (M4).

Via formation candidate position searching processing is performed by the connection relation determining unit 135 using each data described above. Note that the researched element list 330, temporary connection relation list 340, and appropriation-resolved terminal list 350 are information used as computation work regions in the decoupling capacitor placement searching processing, and can be deleted from the RAM 102 following processing.

Figure 42:
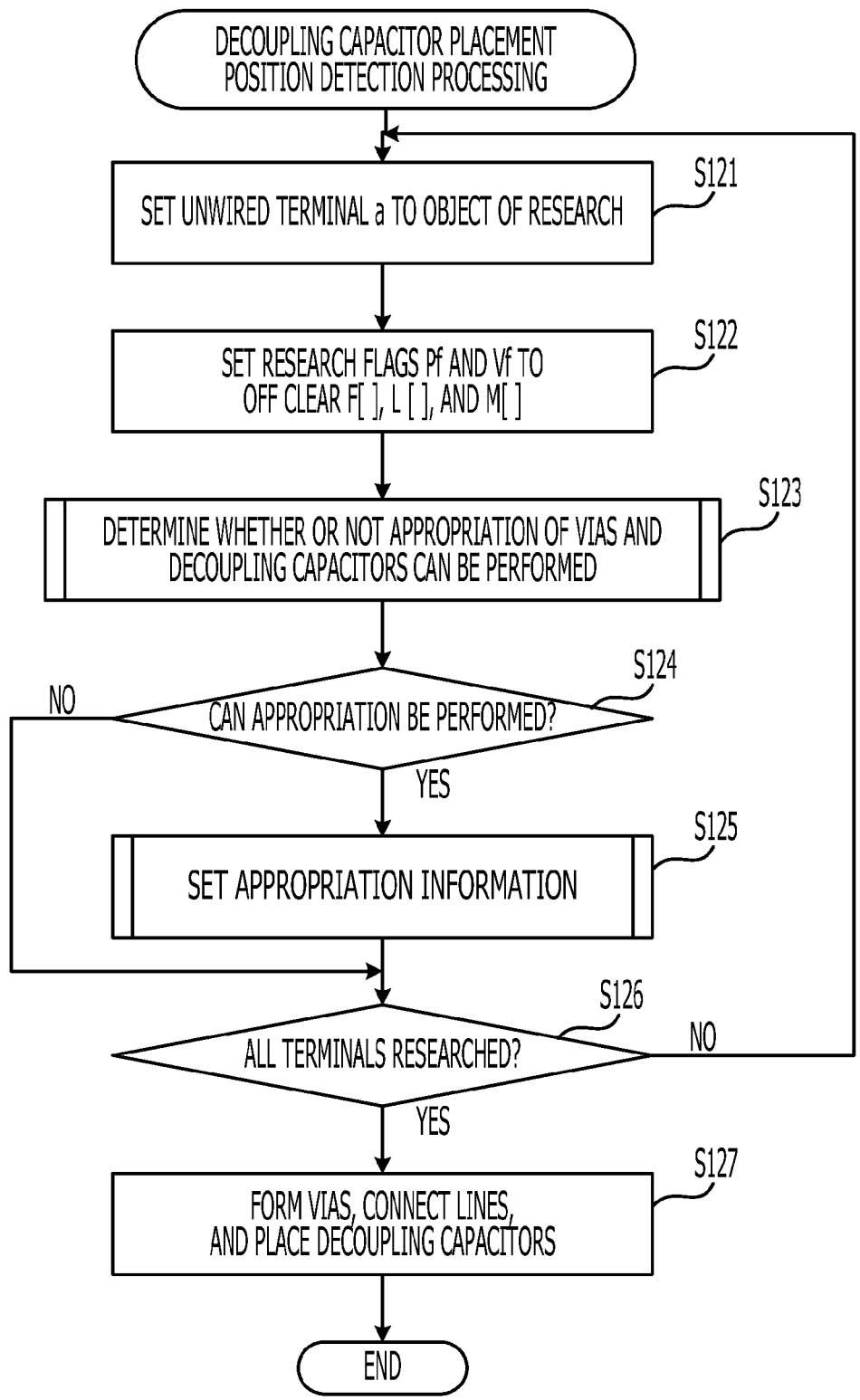
FIG. 42 is a flowchart of decoupling capacitor placement position searching processing.

Next, the decoupling capacitor placement position searching processing will be described in detail. FIG. 42 is a flowchart of the decoupling capacitor placement position searching processing. Description of the processing shown in FIG. 42 will now be made following the operation Nos. therein. Note that while FIG. 42 illustrates the decoupling capacitor placement position searching processing for a single BGA part, the same processing may be executed for all BGA parts mounted on the printed circuit board.

[Operation S121] The connection relation determining unit 135 selects an unwired terminal as a research object. At this time, the connection relation determining unit 135 selects in order from the top of the BGA terminal list 310. Note that the BGA terminal list 310 can be rearranged beforehand so that terminals with low power source voltage are in higher order. When selecting a terminal as the object of research, terminals which have already had via formation candidate positions appropriated thereto are excluded from being an object of selection. Terminals which have already had via formation candidate position appropriated thereto are terminals to which a link (Pl) to an appropriated via formation candidate position has been set in the BGA terminal list 310. That is to say, with the BGA terminal list 310, if a link (Pl) to an appropriated via formation candidate position has been set to the next record in order in the BGA terminal list 310, that record is skipped, and the subsequent record is selected.

[Operation S122] The connection relation determining unit 135 sets the researched flag (Pf, Vf) off for all terminals of the BGA part and all via formation candidate positions. The connection relation determining unit 135 also clears all element data of the array F, array L, and array M.

[Operation S123] The connection relation determining unit 135 performs processing for determining whether a via and decoupling capacitor can be appropriated to the terminal which is the object of research. Details of this processing will be described later.

[Operation S124] In the event that determination is made that a via and decoupling capacitor can be appropriated, the connection relation determining unit 135 advances the flow to operation S125. In the event that determination is made that a via and decoupling capacitor cannot be appropriated, the connection relation determining unit 135 advances the flow to operation S126.

[Operation S125] The connection relation determining unit 135 sets appropriation information. Details of this processing will be described later.

[Operation S126] The connection relation determining unit 135 determines whether all terminals have been researched. In the event that the terminal which is currently the object of research is the terminal shown as the lowest order record in the BGA terminal list 310, determination is made that all terminals have been researched. In the event that all terminals have been researched, the flow advances to operation S127. In the event that there are unresearched terminals, the flow returns to operation S121.

[Operation S127] The connection relation determining unit 135 determines formation of vias to via formation candidate positions associated with terminals, line connections from the terminals, and placement of decoupling capacitors, based on the BGA terminal list 310 and via formation candidate position list 320. Specifically, the connection relation determining unit 135 takes, as via formation positions, positions indicated by links (Pl) to appropriated via formation candidate positions in the BGA terminal list 310. Also, the connection relation determining unit 135 determines wiring connections from the terminals to the vias. Further, the connection relation determining unit 135 determines placement of vias illustrated by position information (Vi) in each record within the via formation candidate position list 320, and placement of decoupling capacitors connected to the position of vias indicated by the link V[$n_3$] to other vias appropriated. The connection relation determining unit 135 then updates the printed circuit board database 110 with the determined contents.

Next, the processing for determining whether a via and decoupling capacitor can be appropriated to the terminal which is the object of research will be described. Note that the following processing is an example wherein vias are formed at positions shifted half-grid from the BGA part terminals, horizontally and vertically.

Figure 43:
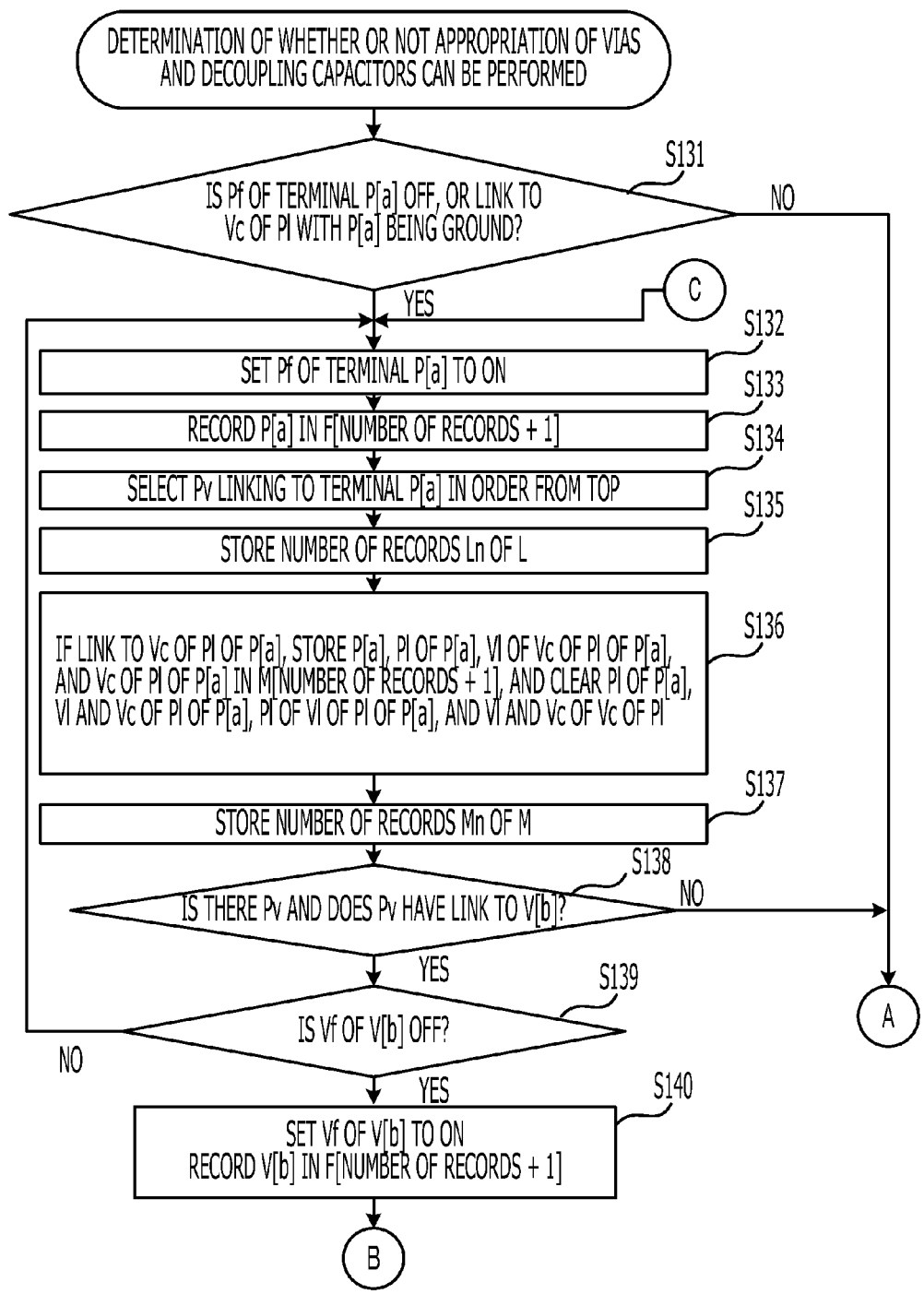
FIG. 43 is a flowchart of processing for determining whether appropriating of vias and decoupling capacitors can be performed (part 1)

FIG. 43 is a flowchart of processing for determining whether appropriating of vias and decoupling capacitors can be performed (part 1). Description of the processing shown in FIG. 43 will now be made following the operation Nos. therein. We will say that the records within the BGA terminal list 310 corresponding to the terminal selected in operation S121 is represented by array P[a] (where a is an index value indicated the selected terminal).

[Operation S131] The connection relation determining unit 135 determines whether one of the following two conditions is satisfied. The first condition is that the researched flag for the array P[a] of the terminal selected as the object of research is off. The second condition is that the selected terminal is a ground (GND) terminal, and that there is a link Pl to an appropriated via formation candidate position in the record in array P[a]. In the event that either condition is satisfied, the flow skips to operation S132. In the event that neither condition is satisfied, the flow advances to operation S186 (see FIG. 46).

[Operation S132] The connection relation determining unit 135 sets the researched flag Pf within the record in array P[a] of the selected terminal to on.

[Operation S133] The connection relation determining unit 135 records the link to array P[a] in the array F[number of records+1] in the researched element list 330.

[Operation S134] The connection relation determining unit 135 selects links to via formation candidate positions in the record in array P[a] for the terminal (each data of array Pv), in order from the top.

[Operation S135] The connection relation determining unit 135 stores in the number of records Ln to the array L of the temporary connection relation list 340 (stores in the RAM 102).

[Operation S136] In the event that there is a link Pl to an appropriated via formation candidate position in the record in array P[a], the connection relation determining unit 135 stores information indicating the appropriation relation of the decoupling capacitor by way of this link in the record in array M[number of records+1]. The stored information is the selected terminal, the via formation candidate position appropriated to the terminal, another via formation candidate position appropriated to the via formation candidate position appropriated to the terminal, and the terminal appropriated to the other via formation candidate position. The selected information is indicated by the array P[a] in the BGA terminal list. The via formation candidate position to which to connect the terminal is shown by Pl in the record in array P[a]. The other via formation candidate position appropriated to the via formation candidate position appropriated to the terminal is Vc in the record within the via formation candidate position list 320 shown by Pl in the record in array P[a]. The Vl in the record in the via formation candidate position list 320 shown by Vc indicates the terminal appropriated to the other via formation candidate position. The connection relation determining unit 135 clears the information stored in the record of array M[number of records+1] in the appropriation-resolved terminal list 350, from the source.

[Operation S137] The connection relation determining unit 135 stores the number of records Mn of records, in the array M in the appropriation-resolved terminal list 350 (stores in the RAM 102).

[Operation S138] The connection relation determining unit 135 determines whether a link destination has been successfully selected in operation S134. In the event that the array Pv is correlated with the record of the selected terminal, and an unprocessed link is registered to the array Pv, an array V[b] (where b represents the index value of the selected array) in the via formation candidate position list 320 indicated by that link is selected. If a link destination has been selected, the flow advances to operation S139. If a link destination has not been selected, the flow advances to operation S186 (see FIG. 46).

[Operation S139] The connection relation determining unit 135 determines whether the researched flag Vf in the record of the array V[b] of the selected link destination is off. In the event that the researched flag is off, the flow advances to operation S140. In the event that the researched flag is on, the flow returns to operation S132.

[Operation S140] The connection relation determining unit 135 sets the researched flag Vf in the record of the array V[b] to on. Also, the connection relation determining unit 135 records the link to the array V[b] in the array F[number of records+1] in the researched element list 330. Subsequently, the flow advances to operation S151 (see FIG. 44).

Figure 44:
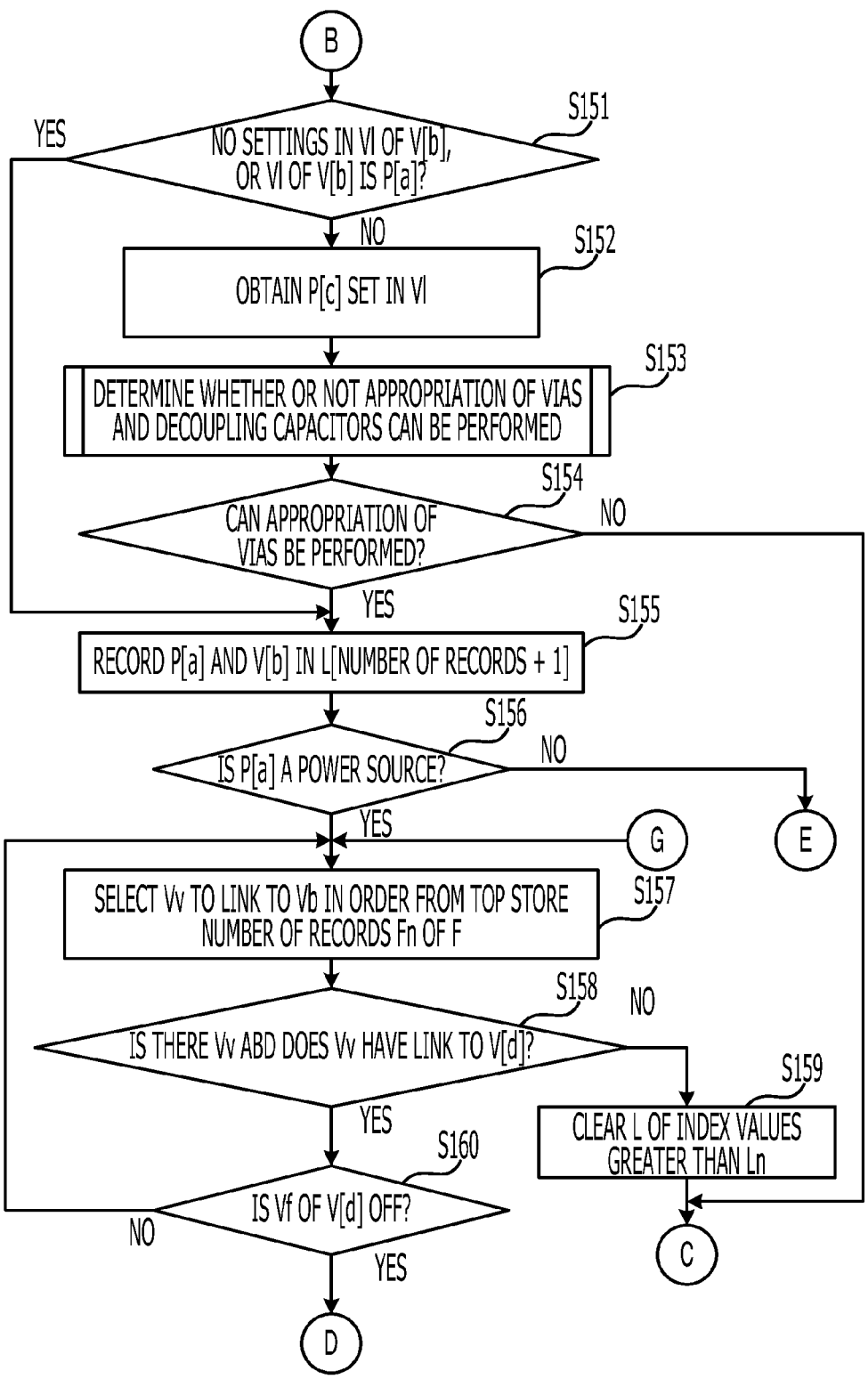
FIG. 44 is a flowchart of processing for determining whether appropriating of vias and decoupling capacitors can be performed (part 2)

FIG. 44 is a flowchart of processing for determining whether appropriating of vias and decoupling capacitors can be performed (part 2). Description of the processing shown in FIG. 44 will now be made following the operation Nos. therein.

[Operation S151] The connection relation determining unit 135 determines whether there is no link destination set in the link Vl to the appropriated terminal in the array V[b], or, whether the link destination indicated by Vl is the array P[a] indicating the selected terminal. In the event that one of these conditions is satisfied, the flow advances to operation S155. In the event that neither of these conditions is satisfied, the flow advances to operation S152.

[Operation S152] The connection relation determining unit 135 obtains an array P[c] (where c is an index value of the relevant array) set to the link Vl to the appropriated terminal in the record in array V[b] from the via formation candidate position list 320.

[Operation S153] The connection relation determining unit 135 recursively executes processing for determining whether appropriating of vias and decoupling capacitors can be performed, regarding the terminal of the array P[c] that has been obtained.

[Operation S154] The connection relation determining unit 135 determines, as a result of executing operation S153, whether appropriation of a via formation candidate position to the selected array P[a] can now be made. In the event that appropriation is possible, the flow advances to operation S155. In the event that appropriation is not possible, the flow goes to operation S132 (see FIG. 43).

[Operation S155] The connection relation determining unit 135 records the link to the array P[a] and the link to the array V[b] in the record of the array ([number of records+1] in the temporary connection relation list 340.

[Operation S156] The connection relation determining unit 135 determines whether the terminal corresponding to the array P[a] is a power source terminal. Whether a power source terminal is indicated in the terminal attribute Pi in the record in array P[a]. If a power source terminal, the flow advances to operation S157. If not a power source terminal, the flow advances to operation S185 (see FIG. 46).

[Operation S157] The connection relation determining unit 135 selects, in order from the top, a link of the other via formation candidate position (array V[d] (where d represents the index value of the via formation candidate position)) set in the array Vv correlated with the record in array V[b]. At this time, the connection relation determining unit 135 stores the number of records Fn of the array F in the researched element list 330.

[Operation S158] The connection relation determining unit 135 determines whether the array Vv has been correlated with the record in array V[b], and a link has been successfully selected to the other via formation candidate position indicated by Vv in operation S157. In the event that a link has been successfully selected, the flow advances to operation S160. In the event that a link has not been successfully selected, the flow advances to operation S159.

[Operation S159] Of the records in array L in the temporary connection relation list 340, the connection relation determining unit 135 clears records of which the index value is greater than the number of records Ln. Subsequently, the flow advances to operation S132 (see FIG. 43).

[Operation S160] The connection relation determining unit 135 determines whether the researched flag Vf in the record in array V[d] is off. In the event that the researched flag Vf is off, the flow advances to operation S171 (see FIG. 45). In the event that the researched flag Vf is on, the flow returns to operation S157.

Figure 45:
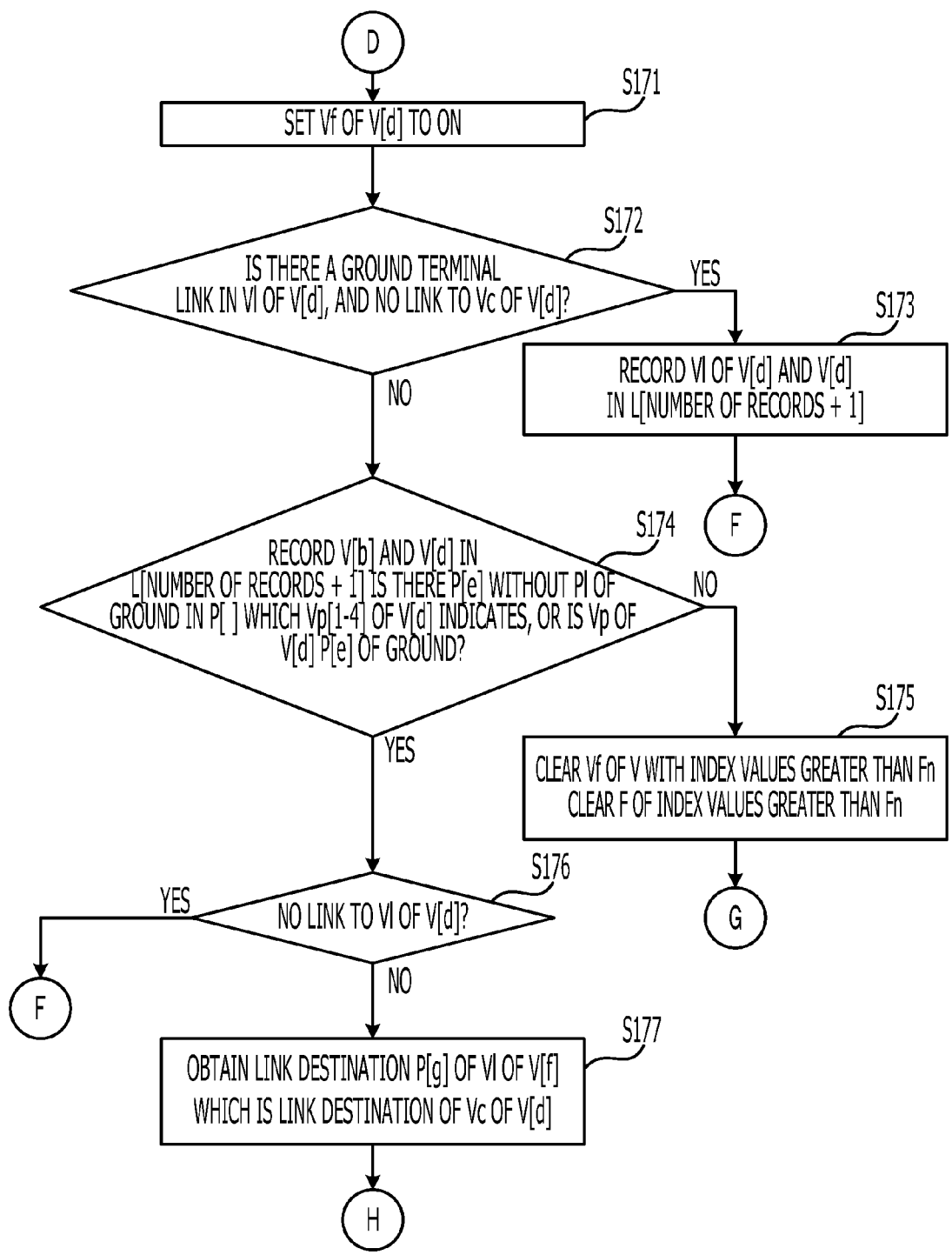
FIG. 45 is a flowchart of processing for determining whether appropriating of vias and decoupling capacitors can be performed (part 3)

FIG. 45 is a flowchart of processing for determining whether appropriating of vias and decoupling capacitors can be performed (part 3). Description of the processing shown in FIG. 45 will now be made following the operation Nos. therein.

[Operation S171] The connection relation determining unit 135 sets the researched flag Vf in the record in array V[d] to on. The connection relation determining unit 135 records the link to the array V[d] in the array F[number of records+1] in the researched element list 330.

[Operation S172] The connection relation determining unit 135 determines whether both of the following conditions have been satisfied. The first condition is that there is a link to a ground (GND) terminal as the link Vl to the appropriated terminal in the record in array V[d]. The second condition is that no link has been set to the link Vc to the other via formation candidate position that has been appropriated in the record in array V[d]. In the event that both conditions are satisfied, the flow advances to operation S173. Otherwise, the flow advances to operation S174.

[Operation S173] The connection relation determining unit 135 records the link indicated by Vl in array V[d] and the link to V[d] to the record in the array L[number of records+ 1] in the temporary connection relation list 340. This recording increments the number of records in the array L. Further, the connection relation determining unit 135 records the link to array V[d] and the link to V[b] to the record in the array L[number of records+1]. Subsequently, the flow advances to operation S184 (see FIG. 46).

[Operation S174] The connection relation determining unit 135 researches the terminals of the array P linked to by Vp [1-4] in the record in array V[d]. In the event that there is any of the researched terminals regarding which a link Pl to a via formation candidate position appropriated for ground (GND) connection has not been set, the connection relation determining unit 135 obtains an array P[e] (where e is the index value of the terminal). Also, in the event that there is a ground (GND) terminal in any of the researched terminals, the connection relation determining unit 135 obtains the array P[e] thereof. In the event that an array P[e] has been obtained, the connection relation determining unit 135 advances the flow to operation S176, and in the event that an array P[e] is not obtained, the flow advances to operation S175.

[Operation S175] The connection relation determining unit 135 accesses the array V of the via formation candidate position indicated in each record with an index value greater than the number of records Fn in the array F in the researched element list 330. The connection relation determining unit 135 then clears (sets to off) the researched flag Vf in the record of the accessed array V. The connection relation determining unit 135 clears each record with an index value greater than the number of records Fn in the array F in the researched element list 330. Subsequently, the flow advances to operation S157 (see FIG. 44).

[Operation S176] The connection relation determining unit 135 determines whether a link Vl has to be set to the appropriated terminal in the record in array V[d]. In the event that the link has not been set, the flow advances to operation S184 (see FIG. 46). In the event that the link has been set, the flow advances to operation S177.

[Operation S177] The connection relation determining unit 135 makes reference to an array V[f] (where f is the index value of the via formation candidate position at the link destination) set to the link Vc of the other via formation candidate position that has been appropriated in the record in array V[d]. The connection relation determining unit 135 then obtains an array P[g] (where g is the index value of the terminal at the link destination) specified by link Vl to the appropriated terminal in the record in the array V[f]. The purpose of this is to research whether the array P[g] can be paired with a ground terminal other than the array P[e]. Subsequently, the flow advances to operation S181 (see FIG. 46).

Figure 46:
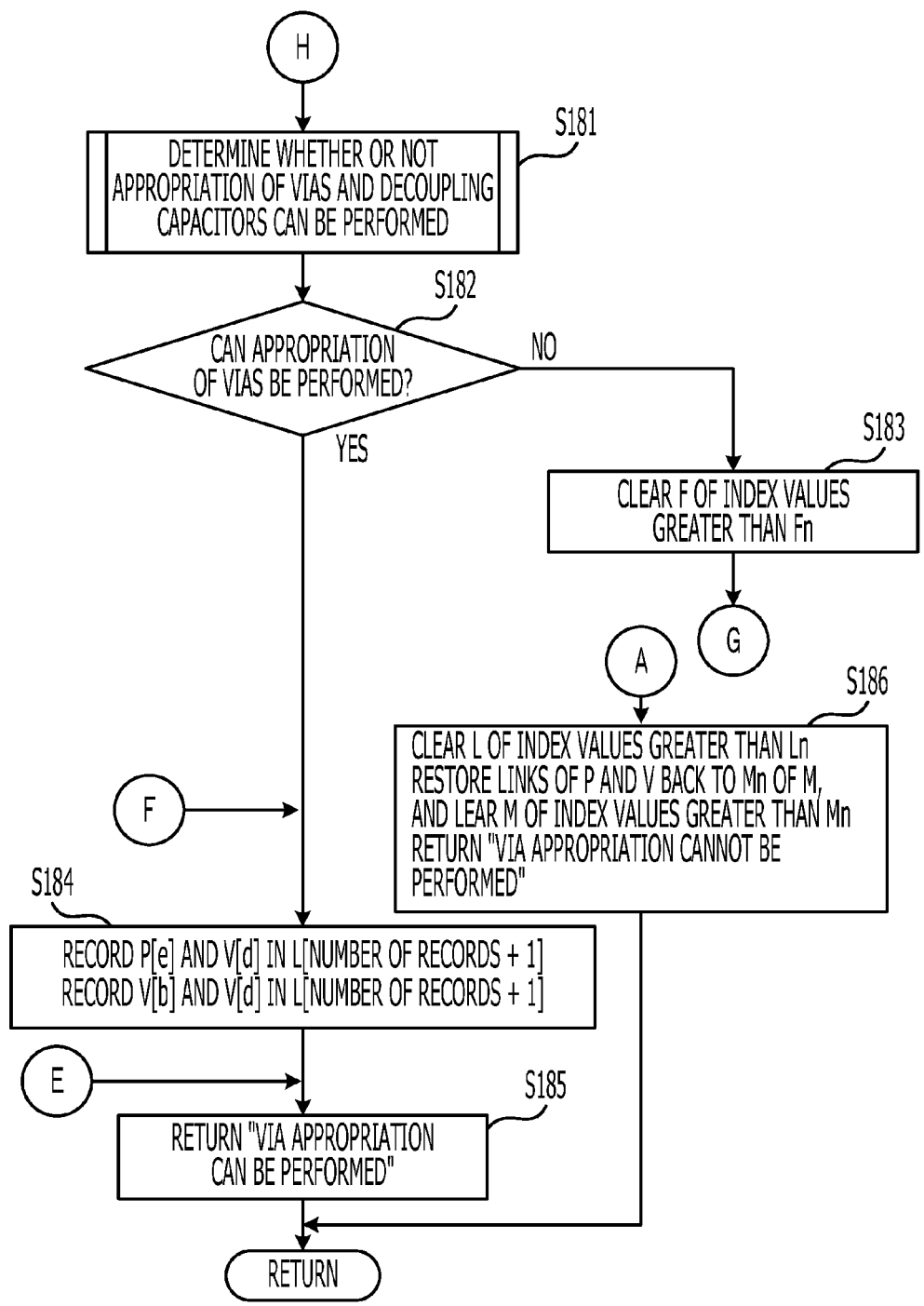
FIG. 46 is a flowchart of processing for determining whether appropriating of vias and decoupling capacitors can be performed (part 4)

FIG. 46 is a flowchart of processing for determining whether appropriating of vias and decoupling capacitors can be performed (part 4). Description of the processing shown in FIG. 46 will now be made following the operation Nos. therein.

[Operation S181] The connection relation determining unit 135 recursively executes processing for determining whether appropriating of vias and decoupling capacitors can be performed, for the terminal indicated by array P[g] obtained in operation S177.

[Operation S182] In the event that determination is made as the result of the processing in operation S181 that via appropriation to the array P[g] can be performed, the flow advances to operation S184. In the event that via appropriation is not possible, the processing advances to operation S183.

[Operation S183] The connection relation determining unit 135 clears records of the array F with index values greater than the number of records Fn. Subsequently, the processing goes to operation S157 (see FIG. 44).

[Operation S184] The connection relation determining unit 135 records the link to the array P[e] and the link to the array V[d] to the record in the array L[number of records+1] in the temporary connection relation list 340. This recording increments the number of records in the array L. Further, the connection relation determining unit 135 records the link to array V[b] and the link to V[d] to the record in the array L[number of records+1].

[Operation S185] The connection relation determining unit 135 returns "via appropriation possible" as the results of processing for determining whether appropriating of vias and decoupling capacitors can be performed. Subsequently, the processing ends.

[Operation S186] The connection relation determining unit 135 clears records of the array L of which the index value is greater than the number of records Ln. Also, the connection relation determining unit 135 restores the links of the array P and array V indicated in the array M of which the index value is greater than the number of records Mn. Further, the connection relation determining unit 135 clears the records of the array M of which the index value is greater than the number of records Mn. The connection relation determining unit 135 returns "via appropriation not possible" as the results of processing for determining whether appropriating of vias and decoupling capacitors can be performed. Subsequently, the processing ends.

Figure 47:
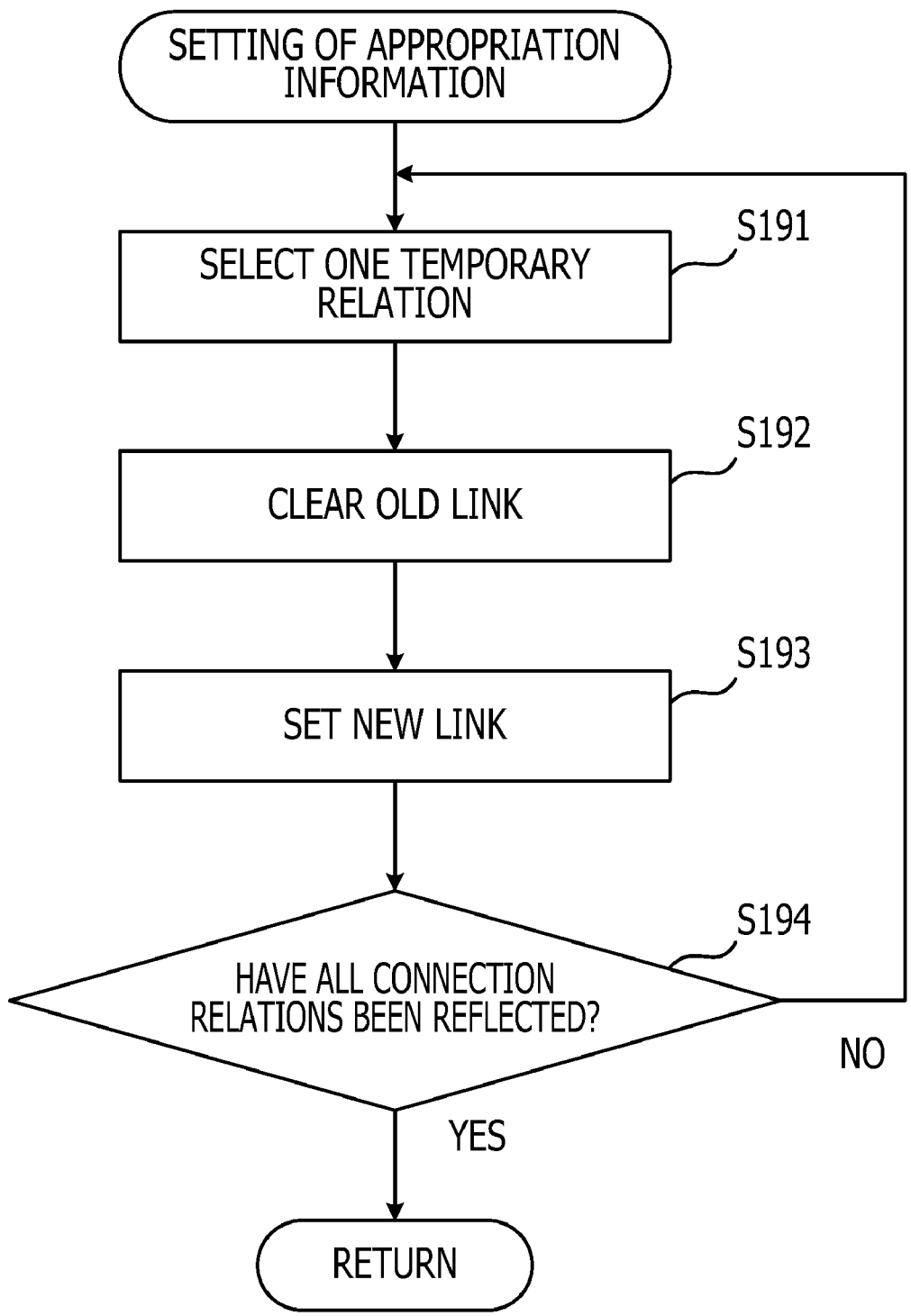
FIG. 47 is a flowchart for appropriation information setting processing.

Appropriation information setting processing will be described. FIG. 47 is a flowchart of appropriation information setting processing. Description of the processing shown in FIG. 47 will now be made following the operation Nos. therein.

[Operation S191] The connection relation determining unit 135 selects a set of links representing the temporary connection relation of a decoupling capacitor indicated in array L in the temporary connection relation list 340, in order from the higher order.

[Operation S192] In the event that there is a link from another (old link) to the link destination of the selected link, the connection relation determining unit 135 clears the link source of the old link. Specifically, the connection relation determining unit 135 makes reference to records for the link destinations for each of the link Ll and Lc to which the array L of the temporary connection relation list 340 has been appropriated. The link destination is either an array P[j] (where j represents the index value of the relevant terminal) indicating terminals within the BGA terminal list 310, or an array V[k] (where k represents the index value of the relevant terminal) indicating via formation candidate positions within the via formation candidate position list 320.

Next, the connection relation determining unit 135 makes reference to the array V[l] (where l is the index value of the relevant via formation candidate position) at the link destination of the link Pl to the via formation candidate position that has been appropriated in the record in array P[j]. Further, the connection relation determining unit 135 makes reference to the record in array V[l] at the link destination and confirms the link Vl to the terminal that has been appropriated. In the event that the array P[j] has been set to Vl, the connection relation determining unit 135 clears the array P[j] from Vl within the record of array V[l].

Also, the connection relation determining unit 135 makes reference to the array P[m] (where m is the index value of the relevant terminal) at the link destination of the link Vl to the via formation candidate position that has been appropriated in the record in array V[k]. Further, the connection relation determining unit 135 makes reference to the record in array P[m] at the link destination and confirms the link Pl to the terminal that has been appropriated. In the event that the array V[k] has been set to Pl, the connection relation determining unit 135 clears the array V[k] from Pl within the record of array P[m].

[Operation S193] The connection relation determining unit 135 sets the selected link as a new link. Specifically, the connection relation determining unit 135 makes reference to the records at the link destinations of each of the link Ll and link Lc to which the array L of the temporary connection list 340 has been appropriated.

In the event that the link Ll is the array P[a], the connection relation determining unit 135 first sets the link destination set for the link Lc to the Pl in the record in array P[a] in the BGA terminal list 310. Next, the connection relation determining unit 135 accesses the relevant record of array V in the via formation candidate position list 320 at the link destination indicated by link Lc, and sets the array P[a] to Vl of that record.

In the event that the link Ll is the array V[b] and Lc is P[a], the connection relation determining unit 135 first sets the array P[a] to Vl in the record of array V[b] in the via formation candidate position list 320. Next, the connection relation determining unit 135 sets the array V[b] to Pl in the record of array P[a] in the BGA terminal list 310.

In the event that the link Ll is the array V[b] and Lc is V[c], the connection relation determining unit 135 first sets the array V[c] to Vc in the record of array V[b] in the via formation candidate position list 320. Next, the connection relation determining unit 135 sets the array V[b] to Vc in the record of array V[c] in the BGA terminal list 310.

[Operation S194] The connection relation determining unit 135 determines whether all temporary connection relations indicated by the array L in the temporary connection relation list 340 have been reflected. In the event that there are temporary connection relations that have not been reflected, the flow advances to operation S191. In the event that all temporary connection relations have been reflected, the processing ends.

Thus, processing for determining whether appropriation of vias and decoupling capacitors can be performed is recursively performed as necessary, and upon having reorganized via placements and wiring, determination is made regarding whether to appropriate a via for outline wiring to the terminal.

A specific example of the decoupling capacitor placement position searching processing will be described.

Figure 48:
FIG. 48 illustrates an example of a decoupling capacitor table following sorting in order of priority.

First, decoupling capacitors are sorted according to order of priority. FIG. 48 illustrates an example of a decoupling capacitor table following sorting according to the order of priority. The part placement computation unit 130 stores the decoupling capacitor table 360 in the connection information storage unit 131 at the time of performing decoupling capacitor placement position searching processing. As shown in FIG. 48, the decoupling capacitor table 360 is provided with columns of "decoupling capacitor name" and "voltage value". Under the column of "decoupling capacitor name" are set identification names of the decoupling capacitors. Under the "voltage value" column are set voltage values.

In actual practice, decoupling capacitors with low voltage values are used in places with little margin in voltage fluctuation, and accordingly, the order of priority is high. Accordingly, the connection relation determining unit 135 arrays the decoupling capacitors within the decoupling capacitor table 360 in order of low voltage values. The connection relation determining unit 135 then places the decoupling capacitors in order from the top of the decoupling capacitor table 360.

Next, the part placement computation unit 130 stores the BGA terminal list 310 and the via formation candidate position list 320 in the connection information storage unit 131.

FIG. 49 illustrates an example of a BGA terminal list. In the BGA terminal list 311 are registered the terminals of the BGA part, and records having links to outline via formation candidate positions around each of the terminals.

The BGA terminal information includes coordinates, types, voltage values, and so forth. The coordinates are of a system wherein the region of the BGA part is sectioned in a grid fashion, and the positions of the sectioned unit regions are expressed in terms of alphabetical letters and numerals. In this example, the positions in the horizontal direction are expressed by alphabetical letters and the positions in the vertical direction are expressed by numerals. We will say that pitch of the grid is twice as fine the pitch of terminals. Accordingly, the coordinates of the terminals are every other value in the alphabetical letters in the horizontal direction (e.g., B, D, F, and so on), and every other value in the numerals in the vertical direction (e.g., 2, 4, and so on).

The voltage value is the power source voltage of terminals, and is set only for power source terminals.

Links to via formation candidate positions have one to four data fields provided to each record. The number of via formation candidate positions will be any one of one through four, depending on the position of the terminal. For example, a terminal at a corner of the BGA part only has one via formation candidate position, so the number of fields for registering a link to a via formation candidate position will also be just one.

Links to via formation candidate positions have an order of priority for researching set. In the example in FIG. 49, the farther to the left the links are, the higher the priority in researching. Note that the links to via formation candidate positions are rearranged by the priority wiring direction determining unit 133 so that outline wiring from the middle of the BGA part in the radial direction has high priority. That is to say, the priority wiring direction determining unit 133 sets a link from a terminal to a via formation candidate position in the direction toward the closest corner with highest priority (at the head of the array of links), so that wiring from the middle of the BGA part toward the four corners is selected with priority.

Note that the records within the BGA terminal list 311 can be rearranged according to order of priority. However, in the following description, we will say that the order of records will not be rearranged, and that the voltage values are referenced at the time of selecting terminals to research, so as to select in order from terminals with low voltage value.

In the example in FIG. 49, the coordinates for the via formation candidate positions are shown in the links to the via formation candidate positions, but we will say that in the actual RAM 102, the array V in which is set the index value of the via formation candidate position at the link destination is recorded.

FIG. 50 illustrates an example of a via formation candidate position list. Registered in the via formation candidate position list 321 are records including links to via formation candidate positions, links to BGA part terminals, and links to other via formation candidate positions capable of connecting by way of a decoupling capacitor.

In the link to via formation candidate position are set coordinates indicating the via formation candidate position. The via formation candidate position is shifted half-grid in the vertical and horizontal directions as to the terminal. Accordingly, the coordinates of the via formation candidate position are every other value in the alphabetical letters in the horizontal direction (e.g., A, C, E, and so on), and every other value in the numerals in the vertical direction (e.g., 1, 3, and so on).

Coordinates of terminals around the via formation candidate position are set to the link to the terminal. Note that the array P in which is set the index value of the terminal which is the link destination may also be used as a link to the terminal.

Coordinates of surrounding via formation candidate positions are set to a link to the other via formation candidate position capable of connecting by way of a decoupling capacitor. Note that the array V in which is set the index value of the via formation candidate position which is the link destination may also be used as a link to the other via formation candidate positions.

In the event that the cross-shaped portion at the middle of the BGA part is not used, links to the cross-shaped portion are eliminated form the via formation candidate position list 321 by the cross-shaped boundary placement permissibility setting unit 134. In the example in FIG. 50, the via formation candidate positions of which the horizontal-direction coordinates are "G", and the via formation candidate positions of which the vertical-direction coordinates are "7", are via formation candidate positions included in the cross-shaped portion. These via formation candidate positions are excluded from being an object of registration in records.

Note that, with links to terminals, the further left the link is set, the higher the actual order of priority at the time of researching is set. That is to say, the element set in the column under "first" in the links to the terminal is researched first at the time of searching for a ground terminal. In this example, elements leading in the direction toward the middle are set to the highest priority. Selecting wiring to a terminal from the via formation candidate position in the direction toward the middle with priority will result in radial direction wiring being given priority as viewed from the terminal.

Also, with links to other via formation candidate positions capable of connecting by way of a decoupling capacitor, the further left the link is set, the higher the order of priority for researching is set. That is to say, the element set in the column under "first" in the links to another via formation candidate position is researched with highest priority at the time of searching for another via formation candidate position for the decoupling capacitor. With the present embodiment a placement is give priority wherein the decoupling capacitor is placed parallel to the X axis and also such that, of the two terminals of the decoupling capacitor, the terminal to be connected to the power source terminal of the BGA part is closer to the middle of the BGA part. In this case, links to another via formation candidate position adjacent in the direction parallel to the X axis on the side thereof that the absolute value of the X coordinate value is greater, are set in the in the column under "first" for links to another via formation candidate position. This facilitates placement wherein the wiring is radial. Note that while sideways (parallel to the X axis) placement of the decoupling capacitors is given priority with this example, vertical (parallel to the Y axis) placement of the decoupling capacitors may given priority as long as the direction of priority is unified.

Figure 51:
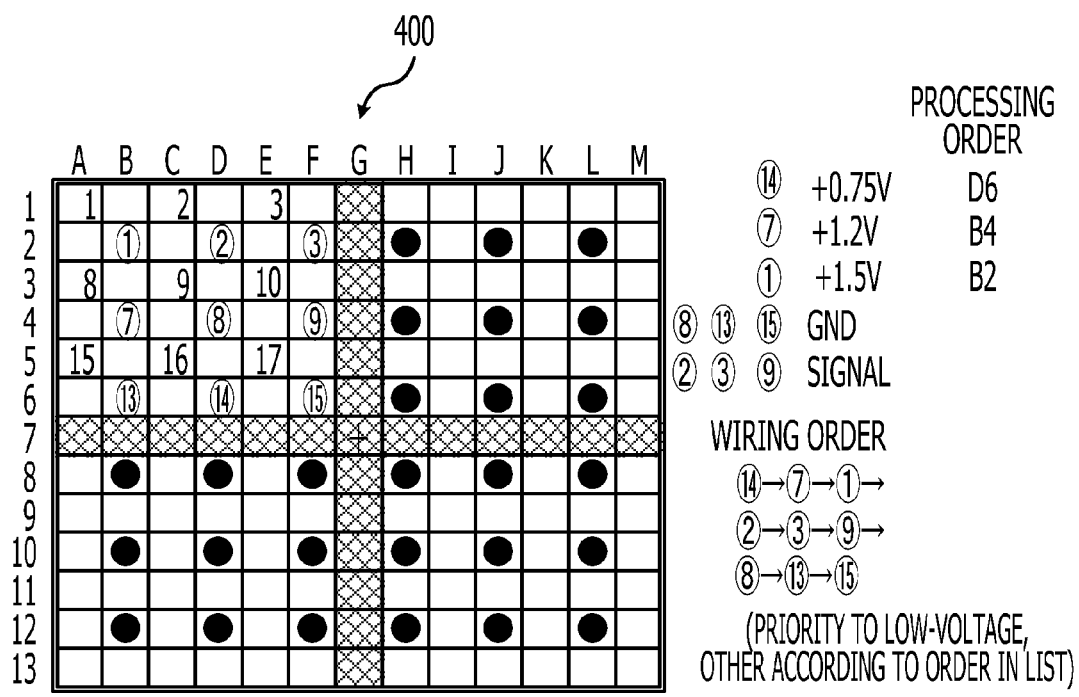
FIG. 51 illustrates an example of a BGA part regarding which decoupling capacitors are to be placed.

FIG. 51 illustrates an example of a BGA part to which decoupling capacitors are to be placed. 6×6 terminals, for a total of 36 terminals, are provided to the BGA part 400. Note that the example shown in FIG. 51 has a reduced number of terminals to facilitate description of the processing, but an actual BGA part has far more terminals.

In this example, the middle cross-shaped portion of column G and row 7 when sectioning the region of the BGA part 400 into a grid are excluded from wiring. In this case, the region is divided into four by the middle cross-shaped portion, and the divided regions do note interfere one with another regarding decoupling capacitor placement. Accordingly, an example of placement of decoupling capacitors to a representative region of A to F×1 to 6 (quadrant II) will be described.

The positions of terminals of the BGA part 400 in quadrant II are represented by numerals inside circles. Other numerals are via formation candidate positions. Positions of terminals in quadrants I, III, and IV, are indicated by solid circles.

The terminal indicated by "14" inside a circle in quadrant II has voltage "+0.75 V". The terminal indicated by "7" inside a circle has voltage "+1.2 V". The terminal indicated by "1" inside a circle has voltage "+1.5 V". The terminals indicated by "8, 13, 15" inside circles are ground (GND) terminals. The terminals indicated by "2, 3, 9" inside circles are signal terminals.

In this case, the order of terminals for performing wiring processing is "14, 7, 1, 2, 3, 9, 8, 13, 15" of the numerals in circles. This order is an arrangement wherein priority has been given to terminals with low voltage, and terminals of the same voltage have been processed according the order of array in the list.

The following is a description of the situation of researching via formation candidate positions and the like at the time of placing decoupling capacitors in quadrant II of the BGA part 400, with reference to the flowcharts shown in FIGS. 42 through 47. Note that the terminals and via formation candidate positions will be expressed with coordinate values.

<Decoupling Capacitor Placement Position Searching Processing>
(See FIG. 42)

No. 1 (operation S121): Low voltage is given priority, P[14] indicating a +0.75 V terminal "D6" is selected, and research is started. Subsequently, research is performed in the order of D6→B4→B2 signal terminals.

No. 2 (operation S122): The researched flags of array P and array V are cleared, and the contents of array F, array L, and array M are cleared.

No. 3 (operation S123): Processing is performed for determining whether appropriation of vias and decoupling capacitors can be performed.

<Processing for Determining Whether Appropriating of Vias and Decoupling Capacitors can be Performed (Part 1)>
(See FIG. 43)

No. 4 (operation S131): A determination of "Yes" is made in this operation.

No. 5 (operations S132 through S137): The researched flag Pf in the record in array P[14] of the terminal [D6] is set to on. P[14] is set to the record in array F[1]. The array V[16] which indicates the via formation candidate position [C5] is selected from the array Pv[1] in the record in the array P[14]. The number of records in the array L is set to Ln=0.

No. 6 (operation S138): The array V[16] which indicates the via formation candidate position [C5] has been selected from the array Pv[1] of the array P[14] corresponding to the terminal "D6", so a determination of "Yes" is made in this operation.

No. 7 (operation S139): A determination of "Yes" is made in this operation.

No. 8 (operation S140): The researched flag Vf within the record in array V[16] is set to on. V[16] is set to the record in array F[2] (array F[2]=V[16]).

(See FIG. 44)

No. 9 (operation S151): A determination of "Yes" is made in this operation.

No. 10 (operation S155): P[14] is set to Ll in the record in array L[1] (Ll=P[14]). Also, array V[16] is set to Lc (Lc=V[16]).

No. 11 (operation S156): A determination of "Yes" is made in this operation.

No. 12 (operation S157): Array V[15] indicating the via formation candidate position [A5] of the array Vv[1] in the record in array V[16] is selected. At this time, 2 is set to the number of records Fn for the array F (Fn=2).

No. 13 (operation S158): A determination of "Yes" is made in this operation.

No. 14 (operation S160): A determination of "Yes" is made in this operation.

(See FIG. 45)

No. 15 (operation S171): The researched flag Vf within the record in array V[15] is set to on. At this time, V[15] is set to the record in array F[3] (F[3]=V[15]).

No. 16 (operation S172): A determination of "No" is made in this operation.

No. 17 (operation S174): The Vp[1] within the record in array V[15] is array P[13] indicating terminal "B6". Since this terminal is a ground terminal, a determination of "Yes" is made in this operation.

No. 18 (operation S176): A determination of "Yes" is made in this operation.

(See FIG. 46)

No. 19 (operation S184): P[13] is set to Ll in the record in array L[2] (Ll=P[13]), and V[15] is set to Lc (Lc=V[15]). V[16] is set to Ll in the record in array L[3] (Ll=V[16]), and V[15] is set to Lc (Lc=V[15]).

No. 20 (operation S185): "Via appropriation can be performed" is returned as the processing result.

<Processing for Determining Whether Appropriating of Vias and Decoupling Capacitors can be Performed (Part 1) Ends>
<Decoupling Capacitor Placement Position Searching Processing>
(See FIG. 42)

No. 21 (operation S124): A determination of "Yes" is made in this operation.

No. 22 (operation S125): Information is set indicating wiring from the terminal "D6" to the via formation candidate position "C5", wiring from the via formation candidate position "C5" to the via formation candidate position "A5", and from the via formation candidate position "A5" to the terminal "B6" (D6→C5→A5→B6).

Also, V[16] is set to Pl in the record in array P[15] (Pl=V[16]). P[14] is set to Vl in the record in array V[16] (Vl=P[14]), and V[15] is set to Vc (Vc=V[15]).

Further, V[15] is set to Pl in the record in array P[13] (Pl=V[15]). P[13] is set to Vl in the record in array V[15] (Vl=P[13]), and V[16] is set to Vc (Vc=V[16]).

No. 23 (operation S126): A determination of "No" is made in this operation.

No. 24 (operation S121): Low voltage is given priority, and array P[7] indicating the terminal "B4" having +1.2 V is selected.

No. 25 (operation S122): The researched flags of array P and array V are cleared, and the contents of array F, array L, and array M are cleared.

No. 26 (operation S123): Processing is performed for determining whether appropriation of vias and decoupling capacitors can be performed.

<Processing for Determining Whether Appropriating of Vias and Decoupling Capacitors can be Performed (Part 1)>
(See FIG. 43)

No. 27 (operation S131): A determination of "Yes" is made in this operation.

No. 28 (operations S132 through S137): The researched flag Pf in the record in array P[7] of the terminal [B4] is set to on. P[7] is set to the record in array F[1]. The array V[8] which indicates the via formation candidate position [A3] is selected from the array Pv[1] in the record in the array P[7]. The number of records in the array L is set to Ln=0.

No. 29 (operation S138): A determination of "Yes" is made in this operation.

No. 30 (operation S139): A determination of "Yes" is made in this operation.

No. 31 (operation S140): The researched flag Vf within the record in array V[8] is set to on. V[8] is set to the record in array F[2] (array F[2]=V[8]).

(See FIG. 44)

No. 32 (operation S151): A determination of "Yes" is made in this operation.

No. 33 (operation S155): P[7] is set to Ll in the record in array L[1] (Ll=P[7]). Also, array V[8] is set to Lc (Lc=V[8].

No. 34 (operation S156): A determination of "Yes" is made in this operation.

No. 35 (operation S157): Array V[9] indicating the via formation candidate position [C3] of the array Vv[1] in the record in array V[8] is selected. At this time, 2 is set to the number of records Fn for the array F (Fn=2).

No. 36 (operation S158): A determination of "Yes" is made in this operation.

No. 37 (operation S160): A determination of "Yes" is made in this operation.

(See FIG. 45)

No. 38 (operation S171): The researched flag Vf within the record in array V[9] is set to on. At this time, V[9] is set to the record in array F[3] (F[3]=V[9]).

No. 39 (operation S172): A determination of "No" is made in this operation.

No. 40 (operation S174): The Vp[1] within the record in array V[9] is array P[8] indicating terminal "D4". Since this terminal is a ground terminal, a determination of "Yes" is made in this operation.

No. 41 (operation S176): A determination of "Yes" is made in this operation.

(See FIG. 46)

No. 42 (operation S184): P[8] is set to Ll in the record in array L[2] (Ll=P[8]), and V[9] is set to Lc (Lc=V[9]). V[8] is set to Ll in the record in array L[3] (Ll=V[8]), and V[9] is set to Lc (Lc=V[9]).

No. 43 (operation S185): "Via appropriation can be performed" is returned as the processing result.

<Processing for Determining Whether Appropriating of Vias and Decoupling Capacitors can be Performed (Part 1) Ends>
<Decoupling Capacitor Placement Position Searching Processing>
(See FIG. 42)

No. 44 (operation S124): A determination of "Yes" is made in this operation.

No. 45 (operation S125): Information is set indicating wiring from the terminal "B4" to the via formation candidate position "A3", wiring from the via formation candidate position "A3" to the via formation candidate position "C3", and from the via formation candidate position "C3" to the terminal "D4" (B4→A3→C3→D4).

Also, V[8] is set to Pl in the record in array P[7] (Pl=V[8]). P[7] is set to Vl in the record in array V[8] (Vl=P[7]), and V[9] is set to Vc (Vc=V[9]).

Further, V[9] is set to Pl in the record in array P[8] (Pl=V[9]). P[8] is set to Vl in the record in array V[9] (Vl=P[8]), and V[8] is set to Vc (Vc=V[8]).

No. 46 (operation S126): A determination of "No" is made in this operation.

Figure 52:
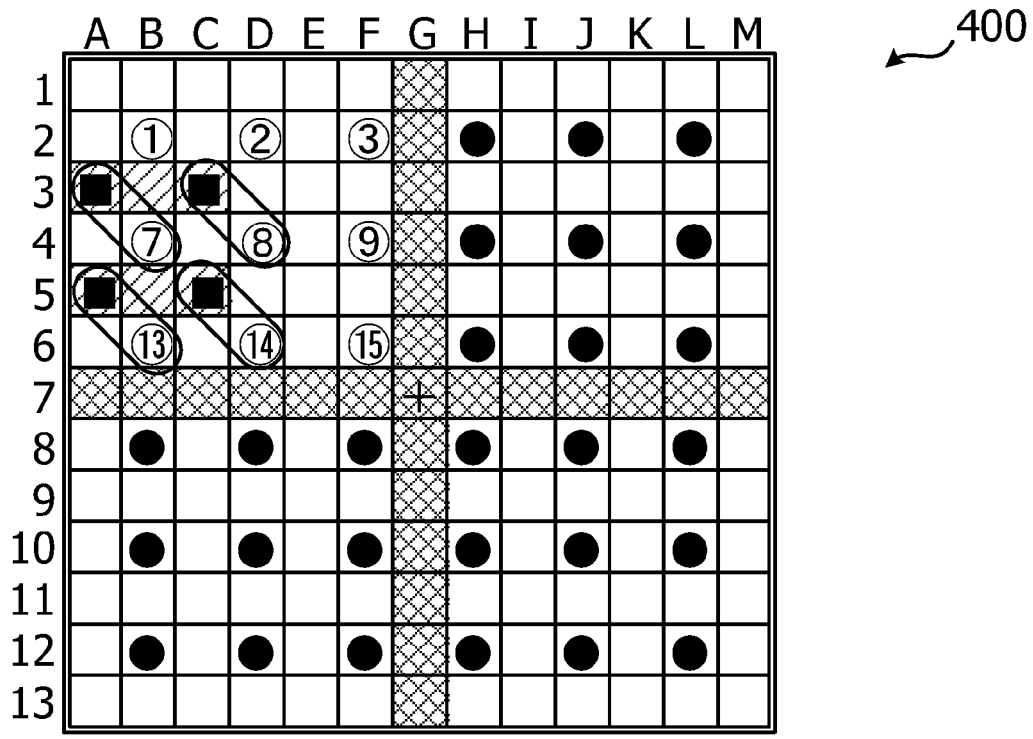
FIG. 52 illustrates a situation of decoupling capacitor placement processing (part 1)

FIG. 52 illustrates the situation of decoupling capacitor placement processing. In FIG. 52, via formation candidate positions appropriated to terminals are indicated by solid squares. Terminals and via formation candidate positions appropriated to the respective terminals are surrounded by elongated circles. Also, the grids between via formation candidate positions connected by decoupling capacitors are hatched. As shown in FIG. 52, and the current stage, two decoupling capacitors have been placed.

(See FIG. 42)

No. 47 (operation S121): P[1] indicating a +1.5 V terminal "B2" is selected, and research is started.

No. 48 (operation S122): The researched flags of array P and array V are cleared, and the contents of array F, array L, and array M are cleared.

<Processing for Determining Whether Appropriating of Vias and Decoupling Capacitors can be Performed (Part 1)>
(See FIG. 43)

No. 49 (operation S131): A determination of "Yes" is made in this operation.

No. 50 (S132 through S137): The researched flag Pf in the record in array P[1] is set to on. P[1] is set to the record in array F[1]. The array V[1] which indicates the via formation candidate position [A1] is selected from the array Pv[1] in the record in the array P[1]. The number of records in the array L is set to Ln=0.

No. 51 (operation S138): A determination of "Yes" is made in this operation.

No. 52 (operation S139): A determination of "Yes" is made in this operation.

No. 53 (operation S140): The researched flag Vf within the record in array V[1] is set to on. V[1] is set to the record in array F[2] (array F[2]=V[1]).

(See FIG. 44)

No. 54 (operation S151): A determination of "Yes" is made in this operation.

No. 55 (operation S155): P[1] is set to L1 in the record in array L[1] (L1=P[1]). Also, array V[1] is set to Lc (Lc=V[1].

No. 56 (operation S156): A determination of "Yes" is made in this operation.

No. 57 (operation S157): Array V[1] indicating the via formation candidate position [C1] of the array Vv[1] in the record in array V[1] is selected. At this time, 2 is set to the number of records Fn for the array F (Fn=2).

No. 58 (operation S158): A determination of "Yes" is made in this operation.

No. 59 (operation S160): A determination of "Yes" is made in this operation.

(See FIG. 45)

No. 60 (operation S171): The researched flag Vf within the record in array V[2] is set to on. At this time, V[2] is set to the record in array F[3] (F[3]=V[2]).

No. 61 (operation S172): A determination of "No" is made in this operation.

No. 62 (operation S174): Since there is no ground terminal around the via formation candidate position "C2" indicated by array V[2], a determination of "No" is made in this operation.

No. 63 (operation S175): Reference is made to the array V[2] stored in the record in array F[3], and the registered flag Vf within the record in the array V[2] is cleared. Also, the record in array F[3] is cleared.

(See FIG. 44)

No. 64 (operation S157): Array V[8] indicating the via formation candidate position [A3] of the array Vv[2] in the record in array V[1] is selected. At this time, 2 is set to the number of records Fn for the array F (Fn=2).

No. 65 (operation S158): A determination of "Yes" is made in this operation.

No. 66 (operation S160): A determination of "Yes" is made in this operation.

(See FIG. 45)

No. 67 (operation S171): The researched flag Vf within the record in array V[8] is set to on. At this time, V[8] is set to the record in array F[3] (F[3]=V[8]).

No. 68 (operation S172): A determination of "No" is made in this operation.

No. 69 (operation S174): Since there is no ground terminal around the via formation candidate position "A3" indicated by array V[8], a determination of "No" is made in this operation.

No. 70 (operation S175): Reference is made to the array V[8] stored in the record in array F[3], and the registered flag Vf within the record in the array V[8] is cleared. Also, the record in array F[3] is cleared.

(See FIG. 44)

No. 71 (operation S157): 2 is set to the number of records Fn for the array F (Fn=2).

No. 72 (operation S158): There is no other unresearched via formation candidate position, so a determination of "No" is made in this operation.

No. 73 (operation S159): Records in the array L having an index value greater than Ln (Ln=0) are cleared.

(See FIG. 43)

No. 74 (S132 through S137): The array V[2] which indicates the via formation candidate position [C1] is selected from the array Pv[2] in the record in the array P[1]. The number of records in the array L is set to Ln=0.

No. 75 (operation S138): A determination of "Yes" is made in this operation.

No. 76 (operation S139): A determination of "Yes" is made in this operation.

No. 77 (operation S140): The researched flag Vf within the record in array V[2] is set to on. V[2] is set to the record in array F[3] (F[3]=V[2]).

(See FIG. 44)

No. 78 (operation S151): A determination of "Yes" is made in this operation.

No. 79 (operation S155): P[1] is set to L1 in the record in array L[1] (L1=P[1]). Also, array V[2] is set to Lc (Lc=V[2].

No. 80 (operation S156): A determination of "Yes" is made in this operation.

No. 81 (operation S157): Array V[1] indicating the via formation candidate position [A1] of the array Vv[1] in the record in array V[2] is selected. At this time, 3 is set to the number of records Fn for the array F (Fn=3).

No. 82 (operation S158): A determination of "Yes" is made in this operation.

No. 83 (operation S160): The researched flag Vf within the record in array V[1] is set to on. Accordingly, a determination of "No" is made in this operation.

No. 84 (operation S157): Array V[3] indicating the via formation candidate position [E1] of the array Vv[2] in the record in array V[2] is selected. At this time, 3 is set to the number of records Fn for the array F (Fn=3).

No. 85 (operation S158): A determination of "Yes" is made in this operation.

No. 86 (operation S160): A determination of "Yes" is made in this operation.

(See FIG. 45)

No. 87 (operation S171): The researched flag Vf in the record in array V[3] is set to on. At this time, V[3] is set to the record in array F[4] (F[4]=V[3]).

No. 88 (operation S172): A determination of "No" is made in this operation.

No. 89 (operation S174): Since there is no ground terminal around the via formation candidate position "E1" indicated by array V[3], a determination of "No" is made in this operation.

No. 90 (operation S175): Reference is made to the array V[3] stored in the record in array F[4], and the registered flag Vf within the record in the array V[83] is cleared. Also, the record in array F[4] is cleared.

(See FIG. 44)

No. 91 (operation S157): Array V[9] indicating the via formation candidate position [C3] of the array Vv[3] in the record in array V[2] is selected. At this time, 3 is set to the number of records Fn for the array F (Fn=3).

No. 92 (operation S158): A determination of "Yes" is made in this operation.

No. 93 (operation S160): A determination of "Yes" is made in this operation.

(See FIG. 45)

No. 94 (operation S171): The researched flag Vf within the record in array V[9] is set to on. At this time, V[9] is set to the record in array F[4] (F[4]=V[9]).

No. 95 (operation S172): A determination of "No" is made in this operation.

No. 96 (operation S174): The Vp[1] within the record in array V[9] is array P[8] indicating terminal "D4". Since this terminal is a ground terminal, a determination of "Yes" is made in this operation.

No. 97 (operation S176): Since the link for P[8] is set in V1 in the record in array V[9], a determination of "No" is made in this operation.

No. 98 (operation S177): Reference is made to the array V[8] stored in the record in array F[9], and the array P[7] set to V1 in the record is obtained.

(See FIG. 46)

No. 99 (operation S181): Processing for determining whether appropriating of vias and decoupling capacitors can be performed is recursively performed with regard to the terminal "B4" indicated by the array P[7].

<Processing for Determining Whether Appropriating of Vias and Decoupling Capacitors can be Performed (Part 2)>

(See FIG. 43)

No. 100 (operation S131): A determination of "Yes" is made in this operation.

No. 101 (operations S132 through S137): The researched flag Pf in the record in array P[7] indicating the terminal "B4" is set to on. P[7] is set to the record in array F[5]. The array V[8] which indicates the via formation candidate position [A3] is selected from the array Pv[1] in the record in the array P[7]. The number of records in the array L is set to Ln=1. The link relation of B4→A3→C3→D4 is set in the array M[1], and the relevant link relation in the BGA terminal list 311 and via formation candidate position list 321 is cleared. 1 is set to the number of records Mn of the array M (Mn=1).

No. 102 (operation S138): A determination of "Yes" is made in this operation.

No. 103 (operation S139): A determination of "Yes" is made in this operation.

No. 104 (operation S140): The researched flag Vf within the record in array V[8] is set to on. V[8] is set to the record in array F[6] (array F[6]=V[8]).

(See FIG. 44)

No. 105 (operation S151): A determination of "Yes" is made in this operation.

No. 106 (operation S155): P[7] is set to L1 in the record in array L[2] (L1=P[7]). Also, array V[8] is set to Lc (Lc=V[8].

No. 107 (operation S156): A determination of "Yes" is made in this operation.

No. 108 (operation S157): Array V[9] indicating the via formation candidate position [C3] of the array Vv[1] in the record in array V[8] is selected. At this time, 6 is set to the number of records Fn for the array F (Fn=6).

No. 109 (operation S158): A determination of "Yes" is made in this operation.

No. 110 (operation S160): The researched flag Vf within the record in array V[9] has been set to on, so a determination of "No" is made in this operation.

No. 111 (operation S157): Array V[1] indicating the via formation candidate position [A1] of the array Vv[2] in the record in array V[8] is selected. At this time, 6 is set to the number of records Fn for the array F (Fn=6).

No. 112 (operation S158): A determination of "Yes" is made in this operation.

No. 113 (operation S160): The researched flag Vf within the record in array V[1] has been set to on, so a determination of "No" is made in this operation.

No. 114 (operation S157): Array V[15] indicating the via formation candidate position [A5] of the array Vv[3] in the record in array V[8] is selected. At this time, 6 is set to the number of records Fn for the array F (Fn=6).

No. 115 (operation S158): A determination of "Yes" is made in this operation.

No. 116 (operation S160): A determination of "Yes" is made in this operation.

(See FIG. 45)

No. 117 (operation S171): The researched flag Vf within the record in array V[15] is set to on. At this time, V[15] is set to the record in array F[7] (F[7]=V[15]).

No. 118 (operation S172): A determination of "No" is made in this operation.

No. 119 (operation S174): The Vp[1] within the record in array V[15] is array P[13] indicating terminal "B6". Since this terminal is a ground terminal, a determination of "Yes" is made in this operation.

No. 120 (operation S176): Since the link for P[13] is set in V1 in the record in array V[15], a determination of "No" is made in this operation.

No. 121 (operation S177): Reference is made to the record of the array V[16] set within the record in array F[15], and the array P[14] set to V1 in the record is obtained.

(See FIG. 46)

No. 122 (operation S181): Processing for determining whether appropriating of vias and decoupling capacitors can be performed is recursively performed with regard to the terminal "D6" indicated by the array P[14].

<Processing for Determining Whether Appropriating of Vias and Decoupling Capacitors can be Performed (Part 3)>

(See FIG. 43)

No. 123 (operation S131): A determination of "Yes" is made in this operation.

No. 124 (operations S132 through S137): The researched flag Pf in the record in array P[14] indicating the terminal "D6" is set to on. P[14] is set to the record in array F[8]. The array V[16] which indicates the via formation candidate position [C5] is selected from the array Pv[1] in the record in the array P[14]. The number of records in the array L is set to Ln=2. The link relation of D6→C5→A5→B6 is set in the array M[2], and the relevant link relation in the BGA terminal list 311 and via formation candidate position list 321 is cleared. 2 is set to the number of records Mn of the array M (Mn=2).

No. 125 (operation S138): A determination of "Yes" is made in this operation.

No. 126 (operation S139): A determination of "Yes" is made in this operation.

No. 127 (operation S140): The researched flag Vf within the record in array V[16] is set to on. V[16] is set to the record in array F[9] (array F[9]=V[16]).

(See FIG. 44)

No. 128 (operation S151): A determination of "Yes" is made in this operation.

No. 129 (operation S155): P[14] is set to L1 in the record in array L[3] (L1=P[14]). Also, array V[16] is set to Lc (Lc=V[16].

No. 130 (operation S156): A determination of "Yes" is made in this operation.

No. 131 (operation S157): Array V[15] indicating the via formation candidate position [A5] of the array Vv[1] in the record in array V[16] is selected. At this time, 9 is set to the number of records Fn for the array F (Fn=9).

No. 132 (operation S158): A determination of "Yes" is made in this operation.

No. 133 (operation S160): The researched flag Vf within the record in array V[15] has been set to on, so a determination of "No" is made in this operation.

No. 134 (operation S157): Array V[17] indicating the via formation candidate position [E5] of the array Vv[2] in the record in array V[16] is selected. At this time, 9 is set to the number of records Fn for the array F (Fn=9).

No. 135 (operation S158): A determination of "Yes" is made in this operation.

No. 136 (operation S160): A determination of "Yes" is made in this operation.

(See FIG. 45)

No. 137 (operation S171): The researched flag Vf within the record in array V[17] is set to on. At this time, V[17] is set to the record in array F[10] (F[10]=V[17]).

No. 138 (operation S172): A determination of "No" is made in this operation.

No. 139 (operation S174): The Vp[1] within the record in array V[17] is array P[15] indicating terminal "F6". Since this terminal is a ground terminal, a determination of "Yes" is made in this operation.

No. 140 (operation S176): A determination of "Yes" is made in this operation.

(See FIG. 46)

No. 141 (operation S184): P[15] is set to L1 in the record in array L[4] (L1=P[15]), and V[17] is set to Lc (Lc=V[17]). V[16] is set to L1 in the record in array L[5] (L1=V[16]), and V[17] is set to Lc (Lc=V[17]).

No. 142 (operation S185): "Via appropriation can be performed" is returned as the processing result.

<Processing for Determining Whether Appropriating of Vias and Decoupling Capacitors can be Performed (Part 3) Ends>

No. 143 (operation S182): A determination of "Yes" is made in this operation.

No. 144 (operation S184): P[16] is set to L1 in the record in array L[6] (L1=P[16]), and V[15] is set to Lc (Lc=V[15]). V[8] is set to L1 in the record in array L[7] (L1=V[8]), and V[15] is set to Lc (Lc=V[15]).

No. 145 (operation S185): "Via appropriation can be performed" is returned as the processing result.

<Processing for Determining Whether Appropriating of Vias and Decoupling Capacitors can be Performed (Part 2) Ends>

No. 146 (operation S182): A determination of "Yes" is made in this operation.

No. 147 (operation S184): P[8] is set to L1 in the record in array L[8] (L1=P[8]), and V[9] is set to Lc (Lc=V[9]). V[2] is set to L1 in the record in array L[9] (L1=V[2]), and V[9] is set to Lc (Lc=V[9]).

No. 148 (operation S185): "Via appropriation can be performed" is returned as the processing result.

<Processing for Determining Whether Appropriating of Vias and Decoupling Capacitors can be Performed (Part 1) Ends>

<Decoupling Capacitor Placement Position Searching Processing>

(See FIG. 42)

No. 149 (operation S124): A determination of "Yes" is made in this operation.

No. 150 (operation S125): Information is set indicating wiring from the terminal "B2" to the via formation candidate position "C1", wiring from the via formation candidate position "C1" to the via formation candidate position "C3", and the via formation candidate position "C3" to the terminal "D4" (B2→C1→C3→D4).

Also, V[2] is set to Pl in the record in array P[1] (Vl=P[1]). P[1] is set to the record in array V[2] (Vl=P[1]), and V[9] is set to Vc (Vc=V[9]).

Further, V[9] is set to Pl in the record in array P[9] (Vl=P[9]). P[9] is set to the record in array V[9] (Vl=P[9]), and V[1] is set to Vc (Vc=V[1]).

Information indicating wiring from the terminal "B4" to the via formation candidate position "A3", wiring from the via formation candidate position "A3" to the via formation candidate position "A5", and wiring from the via formation candidate position "A5" to the terminal "B6" are set (B4→A3→A5→B6).

Also, V[8] is set to Pl in the record in array P[7] (Pl=V[8]). P[7] is set to the record in array V[8] (Vl=P[7]), and V[15] is set to Vc (Vc=V[15]).

Further, V[15] is set to Pl in the record in array P[13] (Vl=P[15]). P[13] is set to the record in array V[15] (Vl=P[13]), and V[7] is set to Vc (Vc=V[7]).

Information indicating wiring from the terminal "D6" to the via formation candidate position "C5", wiring from the via formation candidate position "C5" to the via formation candidate position "D5", and wiring from the via formation candidate position "D5" to the terminal "F6" are set (D6→C5→D5→F6).

Also, V[16] is set to Pl in the record in array P[14] (Pl=V[16]). P[15] is set to the record in array V[17] (Vl=P[15]), and V[14] is set to Vc (Vc=V[14]).

Further, V[17] is set to Pl in the record in array P[15] (Vl=P[17]). P[14] is set to the record in array V[16] (Vl=P[14]), and V[17] is set to Vc (Vc=V[17]).

Figure 53:
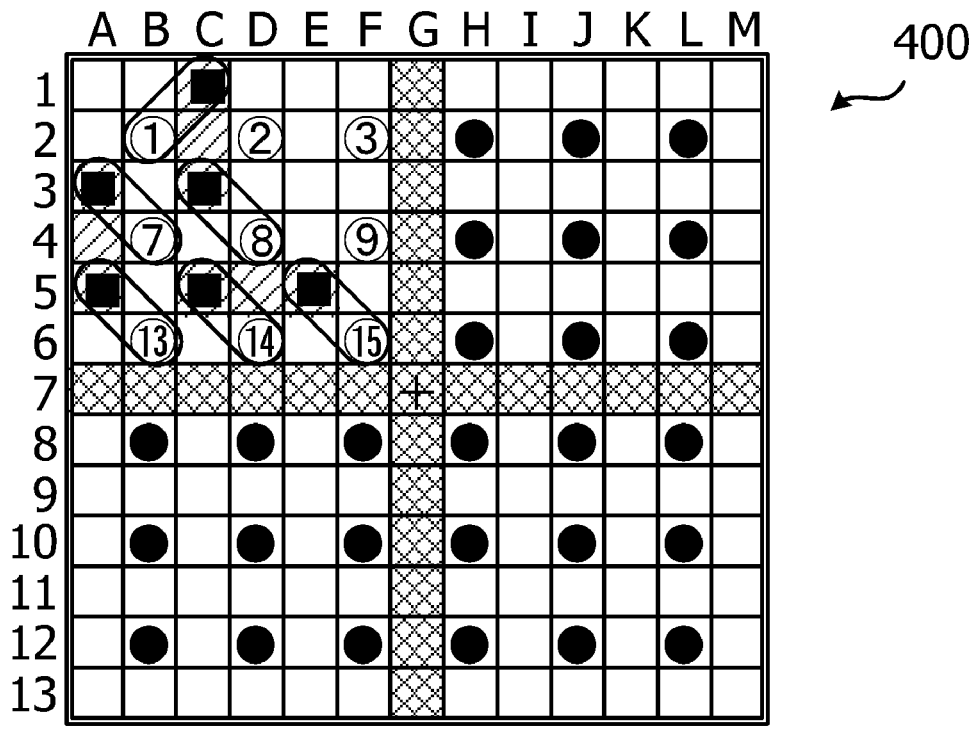
FIG. 53 illustrates a situation of decoupling capacitor placement processing (part 2)

FIG. 53 illustrates the situation of decoupling capacitor placement processing. As can be understood from comparison with FIG. 52, the placement of the decoupling capacitors has been changed, so that a decoupling capacitor can be connected to the terminal "B2" as well. At the current stage, three decoupling capacitors have been placed.

(See FIG. 42)

No. 151 (operation S126): A determination of "No" is made in this operation.

No. 152 (operation S121): Placement of decoupling capacitors to the power source terminals has ended, so an array P[2] indicating the terminal "D2" which is a signal terminal is selected.

No. 153 (operation S122): The researched flags of array P and array V are cleared, and the contents of array F, array L, and array M are cleared.

No. 154 (operation S123): Processing is performed for determining whether appropriating of vias and decoupling capacitors can be performed.

<Processing for Determining Whether Appropriating of Vias and Decoupling Capacitors can be Performed (Part 1)>

(See FIG. 43)

No. 155 (operation S131): A determination of "Yes" is made in this operation.

No. 156 (operations S132 through S137): The researched flag Pf in the record in array P[2] indicating the terminal "D2" is set to on. P[2] is set to the record in array F[1]. The array V[2] which indicates the via formation candidate position [C1] is selected from the array Pv[1] in the record in the array P[2]. The number of records in the array L is set to Ln=0.

No. 157 (operation S138): A determination of "Yes" is made in this operation.

No. 158 (operation S139): A determination of "Yes" is made in this operation.

No. 159 (operation S140): The researched flag Vf within the record in array V[2] is set to on. V[2] is set to the record in array F[2] (array F[2]=V[2]).

(See FIG. 44)

No. 160 (operation S151): P[1] is set to Vl within the record in array V[2], differing from the object of research P[2]. Accordingly, a determination of "No" is made in this operation.

No. 161 (operation S152): P[1] set in Vl in the record in array V[2] is obtained.

No. 162 (operation S153): Processing is performed for determining whether appropriating of vias and decoupling capacitors can be performed, in order to research whether the terminal of array P[1] can use other than the via formation candidate position of array V[2].

<Processing for Determining Whether Appropriating of Vias and Decoupling Capacitors can be Performed (Part 2)>
(See FIG. 43)

No. 163 (operation S131): A determination of "Yes" is made in this operation.

No. 164 (operations S132 through S137): The researched flag Pf in the record in array P[1] indicating the terminal "B2" is set to on. P[1] is set to the record in array F[3]. The array V[1] which indicates the via formation candidate position [A1] is selected from the array Pv[1] in the record in the array P[1]. The number of records in the array L is set to Ln=0. The link relation of B2→C1→C3→D4 is set in the array M[1], and the relevant link relation in the BGA terminal list 311 and via formation candidate position list 321 is cleared. 1 is set to the number of records Mn of the array M (Mn=1).

No. 165 (operation S138): A determination of "Yes" is made in this operation.

No. 166 (operation S139): A determination of "Yes" is made in this operation.

No. 167 (operation S140): The researched flag Vf within the record in array V[1] is set to on. V[1] is set to the record in array F[4] (array F[4]=V[1]).
(See FIG. 44)

No. 168 (operation S151): A determination of "Yes" is made in this operation.

No. 169 (operation S155): P[1] is set to Ll in the record in array L[1] (Ll=P[1]). Also, array V[1] is set to Lc (Lc=V[1]).

No. 170 (operation S156): A determination of "Yes" is made in this operation.

No. 171 (operation S157): Array V[2] indicating the via formation candidate position [C1] of the array Vv[1] in the record in array V[1] is selected. At this time, 4 is set to the number of records Fn for the array F (Fn=4).

No. 172 (operation S158): A determination of "Yes" is made in this operation.

No. 173 (operation S160): The researched flag Vf within the record in array V[2] has been set to on, so a determination of "No" is made in this operation.

No. 174 (operation S157): Array V[8] indicating the via formation candidate position [A3] of the array Vv[2] in the record in array V[1] is selected. At this time, 4 is set to the number of records Fn for the array F (Fn=4).

No. 175 (operation S158): A determination of "Yes" is made in this operation.

No. 176 (operation S160): A determination of "Yes" is made in this operation.
(See FIG. 45)

No. 177 (operation S171): The researched flag Vf within the record in array V[8] is set to on. At this time, V[8] is set to the record in array F[5] (F[5]=V[8]).

No. 178 (operation S172): A determination of "No" is made in this operation.

No. 179 (operation S174): Since there is no ground terminal around the via formation candidate position "A3" indicated by array V[8], a determination of "No" is made in this operation.

No. 180 (operation S175): Reference is made to the array V[8] stored in the record in array F[5], and the registered flag Vf within the record in the array V[8] is cleared. Also, the record in array F[5] is cleared.
(See FIG. 44)

No. 181 (operation S157): Selection of the via formation candidate position of the array Vv[3] within the record in array V[1] is attempted, but cannot be selected since there is no relevant link. At this time, 4 is set to the number of records Fn for the array F (Fn=4).

No. 182 (operation S158): The array Vv cannot be selected, so a determination of "No" is made in this operation.

No. 183 (operation S159): Records (L[1]) in the array L having an index value greater than Ln (Ln=0) are cleared.
(See FIG. 43)

No. 184 (operations S132 through S137): The array V[2] which indicates the via formation candidate position [C1] is selected from the array Pv[2] in the record in the array P[1]. The number of records in the array L is set to Ln=0.

No. 185 (operation S138): A determination of "Yes" is made in this operation.

No. 186 (operation S139): The researched flag Vf within the record in array V[2] has been set to on, so a determination of "No" is made in this operation.

No. 187 (operations S132 through S137): The array V[8] which indicates the via formation candidate position [A3] is selected from the array Pv[3] in the record in the array P[1]. The number of records in the array L is set to Ln=0.

No. 188 (operation S138): A determination of "Yes" is made in this operation.

No. 189 (operation S139): A determination of "Yes" is made in this operation.

No. 190 (operation S140): The researched flag Vf within the record in array V[8] is set to on. V[8] is set to the record in array F[5] (array F[5]=V[8]).
(See FIG. 44)

No. 191 (operation S151): P[7] is set to Vl within the record in array V[8], differing from the object of research P[1]. Accordingly, a determination of "No" is made in this operation.

No. 192 (operation S152): P[7] set in Vl in the record in array V[8] is obtained.

No. 193 (operation S153): Processing is performed for determining whether appropriating of vias and decoupling capacitors can be performed, in order to research whether the terminal of array P[7] can use other than the via formation candidate position of array V[8].

<Processing for Determining Whether Appropriating of Vias and Decoupling Capacitors can be Performed (Part 3)>
(See FIG. 43)

No. 194 (operation S131): A determination of "Yes" is made in this operation.

No. 195 (operations S132 through S137): The researched flag Pf in the record in array P[7] indicating the terminal "B4" is set to on. P[7] is set to the record in array F[6]. The array V[8] which indicates the via formation candidate position [A3] is selected from the array Pv[1] in the record in the array P[7]. The number of records in the array L is set to Ln=0. The link relation of B4→A3→A5→B6 is set in the array M[2], and the relevant link relation in the BGA terminal list 311 and via formation candidate position list 321 is cleared. 2 is set to the number of records Mn of the array M (Mn=2).

No. 196 (operation S138): A determination of "Yes" is made in this operation.

No. 197 (operation S139): The researched flag Vf within the record in array V[8] has been set to on, so a determination of "No" is made in this operation.

No. 198 (ooperations S132 through S137): The array V[9] which indicates the via formation candidate position [C3] is selected from the array Pv[2] in the record in the array P[7]. The number of records in the array L is set to Ln=0.

No. 199 (operation S138): A determination of "Yes" is made in this operation.

No. 200 (operation S139): A determination of "Yes" is made in this operation.

No. 201 (operation S140): The researched flag Vf within the record in array V[9] is set to on. V[9] is set to the record in array F[7] (array F[7]=V[9]).

(See FIG. 44)

No. 202 (operation S151): A determination of "Yes" is made in this operation.

No. 203 (operation S155): P[7] is set to Ll in the record in array L[1] (Ll=P[7]). Also, array V[9] is set to Lc (Lc=V[9].

No. 204 (operation S156): A determination of "Yes" is made in this operation.

No. 205 (operation S157): Array V[8] indicating the via formation candidate position [A3] of the array Vv[1] in the record in array V[9] is selected. At this time, 7 is set to the number of records Fn for the array F (Fn=7).

No. 206 (operation S158): A determination of "Yes" is made in this operation.

No. 207 (operation S160): The researched flag Vf within the record in array V[8] has been set to on, so a determination of "No" is made in this operation.

No. 208 (operation S157): Array V[10] indicating the via formation candidate position [E3] of the array Vv[2] in the record in array V[9] is selected. At this time, 7 is set to the number of records Fn for the array F (Fn=7).

No. 209 (operation S158): A determination of "Yes" is made in this operation.

No. 210 (operation S160): A determination of "Yes" is made in this operation.

(See FIG. 45)

No. 211 (operation S171): The researched flag Vf within the record in array V[10] is set to on. At this time, V[10] is set to the record in array F[8] (F[8]=V[10]).

No. 212 (operation S172): A determination of "No" is made in this operation.

No. 213 (operation S174): The Vp[2] within the record in array V[10] is array P[8] indicating terminal "D4". Since this terminal is a ground terminal, a determination of "Yes" is made in this operation.

No. 214 (operation S176): A determination of "Yes" is made in this operation.

(See FIG. 46)

No. 215 (operation S184): P[8] is set to Ll in the record in array L[2] (Ll=P[8]), and V[10] is set to Lc (Lc=V[10]). V[9] is set to Ll in the record in array L[3] (Ll=V[9]), and V[10] is set to Lc (Lc=V[10]).

No. 216 (operation S185): "Via appropriation can be performed" is returned as the processing result.

<Processing for Determining Whether Appropriating of Vias and Decoupling Capacitors can be Performed (Part 3) Ends>
(See FIG. 44)

No. 217 (operation S154): A determination of "Yes" is made in this operation.

No. 218 (operation S155): P[1] is set to Ll in the record in array L[4] (Ll=P[1]). Also, array V[8] is set to Lc (Lc=V[8].

No. 219 (operation S156): A determination of "Yes" is made in this operation.

No. 220 (operation S157): Array V[9] indicating the via formation candidate position [C3] of the array Vv[1] in the record in array V[8] is selected. At this time, 8 is set to the number of records Fn for the array F (Fn=8).

No. 221 (operation S158): A determination of "Yes" is made in this operation.

No. 222 (operation S160): The researched flag Vf within the record in array V[9] has been set to on, so a determination of "No" is made in this operation.

No. 223 (operation S157): Array V[1] indicating the via formation candidate position [A1] of the array Vv[2] in the record in array V[8] is selected. At this time, 8 is set to the number of records Fn for the array F (Fn=8).

No. 224 (operation S158): A determination of "Yes" is made in this operation.

No. 225 (operation S160): The researched flag Vf within the record in array V[1] has been set to on, so a determination of "No" is made in this operation.

No. 226 (operation S157): Array V[15] indicating the via formation candidate position [A5] of the array Vv[3] in the record in array V[8] is selected. At this time, 8 is set to the number of records Fn for the array F (Fn=8).

No. 227 (operation S158): A determination of "Yes" is made in this operation.

No. 228 (operation S160): A determination of "Yes" is made in this operation.

(See FIG. 45)

No. 229 (operation S171): The researched flag Vf within the record in array V[15] is set to on. At this time, V[15] is set to the record in array F[9] (F[9]=V[15]).

No. 230 (operation S172): A determination of "No" is made in this operation.

No. 231 (operation S174): The Vp[1] within the record in array V[15] is array P[13] indicating terminal "B6". Since this terminal is a ground terminal, a determination of "Yes" is made in this operation.

No. 232 (operation S176): A determination of "Yes" is made in this operation.

(See FIG. 46)

No. 233 (operation S184): P[13] is set to Ll in the record in array L[5] (Ll=P[13]), and V[15] is set to Lc (Lc=V[15]). V[8] is set to Ll in the record in array L[6] (Ll=V[8]), and V[15] is set to Lc (Lc=V[15]).

No. 234 (operation S185): "Via appropriation can be performed" is returned as the processing result.

<Processing for Determining Whether Appropriating of Vias and Decoupling Capacitors can be Performed (Part 2) Ends>
(See FIG. 44)

No. 235 (operation S154): A determination of "Yes" is made in this operation.

No. 236 (operation S155): P[2] is set to Ll in the record in array L[7] (Ll=P[2]). Also, array V[2] is set to Lc (Lc=V[2]).

No. 237 (operation S156): The terminal D2 indicated by array P[2] is a signal terminal, so a determination of "No" is made in this operation.

(See FIG. 46)

No. 238 (operation S185): "Via appropriation can be performed" is returned as the processing result.

<Processing for Determining Whether Appropriating of Vias and Decoupling Capacitors can be Performed (Part 1) Ends>
<Decoupling Capacitor Placement Position Searching Processing>
(See FIG. 42)

No. 239 (operation S124): A determination of "Yes" is made in this operation.

No. 240 (operation S125): Information is set indicating wiring from the terminal "B2" to the via formation candidate position "A3", wiring from the via formation candidate position "A3" to the via formation candidate position "A5", and the via formation candidate position "A5" to the terminal "B6" (B2→A3→A5→B6).

Also, information indicating wiring from the terminal "B4" to the via formation candidate position "C3", wiring from the via formation candidate position "C3" to the via formation candidate position "E3", and wiring from the via formation candidate position "E3" to the terminal "D4" are set (B4→C3→E3→D4).

Further, information indicating wiring from the terminal "D2" to the via formation candidate position "C1" is set (D2→C1).

Figure 54:
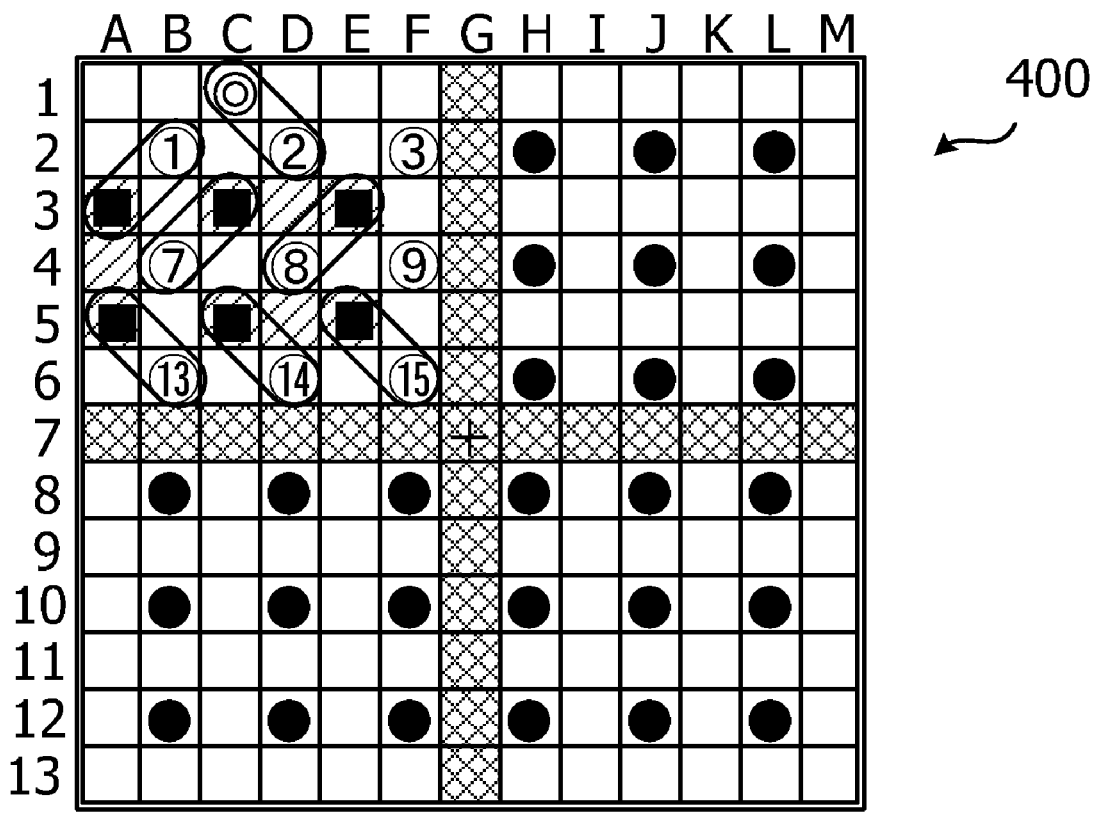
FIG. 54 illustrates a situation of decoupling capacitor placement processing (part 3)

FIG. 54 is a third diagram illustrating the situation of decoupling capacitor placement processing. As can be understood from comparison with FIG. 53, the placement of the decoupling capacitors has been changed, and outline wiring in the radial direction from the terminal "D2" which is a signal terminal, is newly set. Note that in FIG. 54, the via formation candidate position for connection of outline wiring from the signal terminal is represented with a double circle.

(See FIG. 42)

No. 241 (operation S126): A determination of "No" is made in this operation.

No. 242 (operation S121): The array P[3] indicating the terminal "F2" is selected.

No. 243 (operation S122): The researched flags of array P and array V are cleared, and the contents of array F, array L, and array M are cleared.

<Processing for Determining Whether Appropriating of Vias and Decoupling Capacitors can be Performed (Part 1)>

(See FIG. 43)

No. 244 (operation S131): A determination of "Yes" is made in this operation.

No. 245 (operations S132 through S137): The researched flag Pf in the record in array P[3] indicating the terminal "F2" is set to on. P[3] is set to the record in array F[1]. The array V[3] which indicates the via formation candidate position [E1] is selected from the array Pv[1] in the record in the array P[3]. The number of records in the array L is set to Ln=0.

No. 246 (operation S138): A determination of "Yes" is made in this operation.

No. 247 (operation S139): A determination of "Yes" is made in this operation.

No. 248 (operation S140): The researched flag Vf within the record in array V[3] is set to on. V[3] is set to the record in array F[2] (array F[2]=V[3]).

(See FIG. 44)

No. 249 (operation S151): A determination of "Yes" is made in this operation.

No. 250 (operation S155): P[3] is set to Ll in the record in array L[1] (Ll=P[3]). Also, array V[3] is set to Lc (Lc=V[3].

No. 251 (operation S156): The terminal D2 indicated by array P[2] is a signal terminal, so a determination of "No" is made in this operation.

(See FIG. 46)

No. 252 (operation S185): "Via appropriation can be performed" is returned as the processing result.

<Processing for Determining Whether Appropriating of Vias and Decoupling Capacitors can be Performed (Part 1) Ends>

<Decoupling Capacitor Placement Position Searching Processing>

(See FIG. 42)

No. 253 (operation S124): A determination of "Yes" is made in this operation.

No. 254 (operation S125): Wiring is set from the terminal "F2" to the via formation candidate position "E1" (F2→E1).

Figure 55:
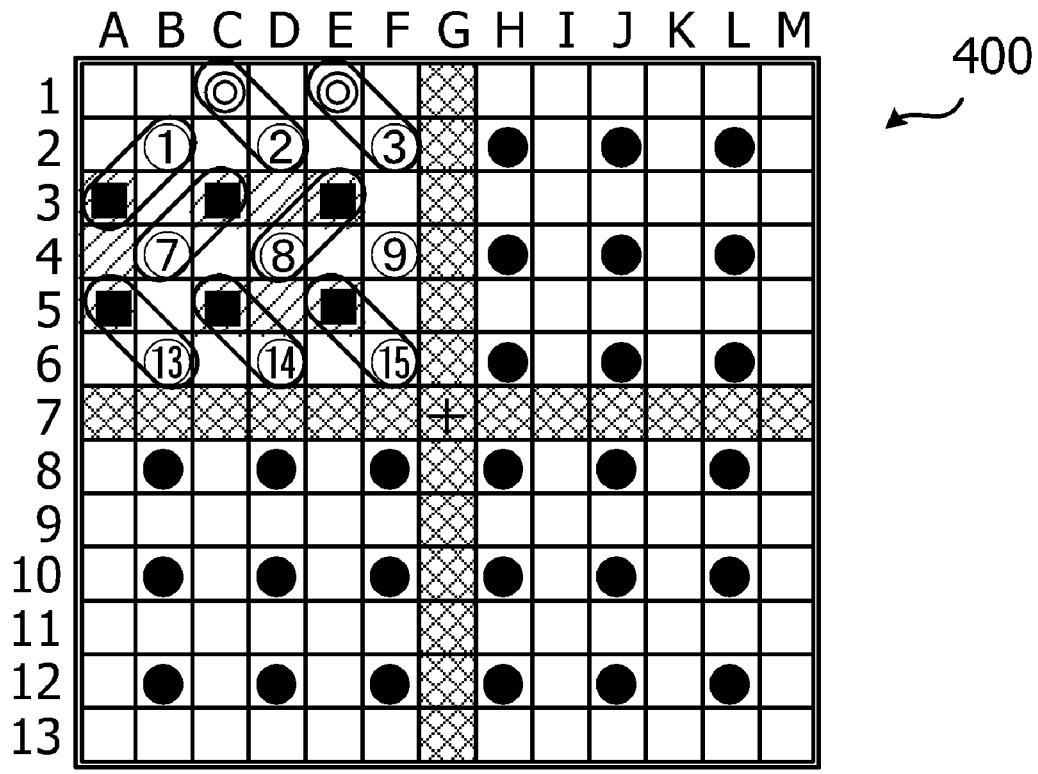
FIG. 55 illustrates a situation of decoupling capacitor placement processing (part 4)

FIG. 55 is a fourth diagram illustrating the situation of decoupling capacitor placement processing. As can be understood from comparison with FIG. 54, outline wiring in the radial direction from the terminal "F2" which is a signal terminal, is newly set.

(See FIG. 42)

No. 255 (operation S126): A determination of "No" is made in this operation.

No. 256 (operation S121): A link to Pl is set in the record in array P[8] indicating the terminal "D4". Accordingly, the processing regarding the array P[8] is skipped, and the array P[9] indicating the terminal "F4" is selected.

No. 257 (operation S122): The researched flags of array P and array V are cleared, and the contents of array F, array L, and array M are cleared.

<Processing for Determining Whether Appropriating of Vias and Decoupling Capacitors can be Performed (Part 1)>

(See FIG. 43)

No. 258 (operation S131): A determination of "Yes" is made in this operation.

No. 259 (operations S132 through S137): The researched flag Pf in the record in array P[9] indicating the terminal "F4" is set to on. P[9] is set to the record in array F[1]. The array V[10] which indicates the via formation candidate position [E3] is selected from the array Pv[1] in the record in the array P[9]. The number of records in the array L is set to Ln=0.

No. 260 (operation S138): A determination of "Yes" is made in this operation.

No. 261 (operation S139): A determination of "Yes" is made in this operation.

No. 262 (operation S140): The researched flag Vf within the record in array V[10] is set to on. V[10] is set to the record in array F[2] (array F[2]=V[10]).

(See FIG. 44)

No. 263 (operation S151): P[8] has been set to Vl within the record in array V[10], differing from the object of research P[9]. Accordingly, a determination of "No" is made in this operation.

No. 264 (operation S152): P[8] set in Vl in the record in array V[10] is obtained.

No. 265 (operation S153): Processing is performed for determining whether appropriating of vias and decoupling capacitors can be performed.

<Processing for Determining Whether Appropriating of Vias and Decoupling Capacitors can be Performed (Part 2)>

(See FIG. 43)

No. 266 (operation S131): A determination of "No" is made in this operation.

(See FIG. 46)

No. 267 (operation S186): Information to be processed in this operation has not yet been set, so this operation is skipped.

<Processing for Determining Whether Appropriating of Vias and Decoupling Capacitors can be Performed (Part 2) Ends>

(See FIG. 44)

No. 268 (operation S154): A determination of "No" is made in this operation.

(See FIG. 43)

No. 269 (operations S132 through S137): The array V[17] which indicates the via formation candidate position [E5] is selected from the array Pv[2] in the record in the array P[9]. The number of records in the array L is set to Ln=0.

No. 270 (operation S138): A determination of "Yes" is made in this operation.

No. 271 (operation S139): A determination of "Yes" is made in this operation.

No. 272 (operation S140): The researched flag Vf within the record in array V[17] is set to on. V[17] is set to the record in array F[3] (array F[3]=V[17]).

(See FIG. 44)

No. 273 (operation S151): A determination of "No" is made in this operation.

No. 274 (operation S152): P[15] set in Vl in the record in array V[17] is obtained.

No. 275 (operation S153): Processing is performed for determining whether appropriating of vias and decoupling capacitors can be performed.

<Processing for Determining Whether Appropriating of Vias and Decoupling Capacitors can be Performed (Part 2)>
(See FIG. 43)

No. 276 (operation S131): A determination of "No" is made in this operation.
(See FIG. 46)

No. 277 (operation S186): Information to be processed in this operation has not yet been set, so this operation is skipped.

<Processing for Determining Whether Appropriating of Vias and Decoupling Capacitors can be Performed (Part 2) Ends>
(See FIG. 44)

No. 278 (operation S154): A determination of "No" is made in this operation.
(See FIG. 43)

No. 297 (operations S132 through S137): Selection of the array Pv[3] within the record in array P[9] is attempted, but fails since there is no relevant link. The number of records in the array L is set to Ln=0.

No. 280 (operation S138): A determination of "No" is made in this operation.
(See FIG. 46)

No. 281 (operation S186): Information to be processed in this operation has not yet been set, so this operation is skipped.

<Decoupling Capacitor Placement Position Searching Processing>
(See FIG. 42)

No. 282 (operation S124): A determination of "No" is made in this operation.

No. 283 (operation S126): Array P[13] and array [15] are already linked, and are not the object of processing. Accordingly, a determination of "Yes" is made in this operation.

No. 284 (operation S127): Formation of vias a via formation candidate positions, line connections from terminals to vias, and placement of decoupling capacitors, are determined in accordance with the appropriation information indicated in the BGA terminal list 311 and via formation candidate position list 321. What is determined is the wiring situation shown in FIG. 55, with no changes. That is to say, vias a reformed at the following positions: E1, C1, A3, C3, E3, A5, C5, and E5. Outline wiring is formed as follows: F2-E1, D2-C1, B2-A3, B4-C3, D4-E3, B6-A5, D6-C5, and F6-E5. Decoupling capacitors are placed at the positions A3-A5, C3-E3, and C5-E5. Outline from the signal terminal at the position F4 has failed.

This example is a case wherein generating of outline wiring fails for one signal terminal, since research was performed in the order of power source terminals→signal terminals. If research is performed in the order of signal terminals→power source terminals, the signal terminals would be in the way and generating of outline wiring would fail for a power source terminal.

Note that even in the event that generating of outline wiring to a signal terminal fails as shown in FIG. 55, there is the possibility that outline wiring can be connected to all terminals if formation of vias to the cross-shaped region is permitted.

Processing such as described above prevents contradictory searching and ensures that there will be no infinite loops, due to having effectively used researched flags.

Figure 56:
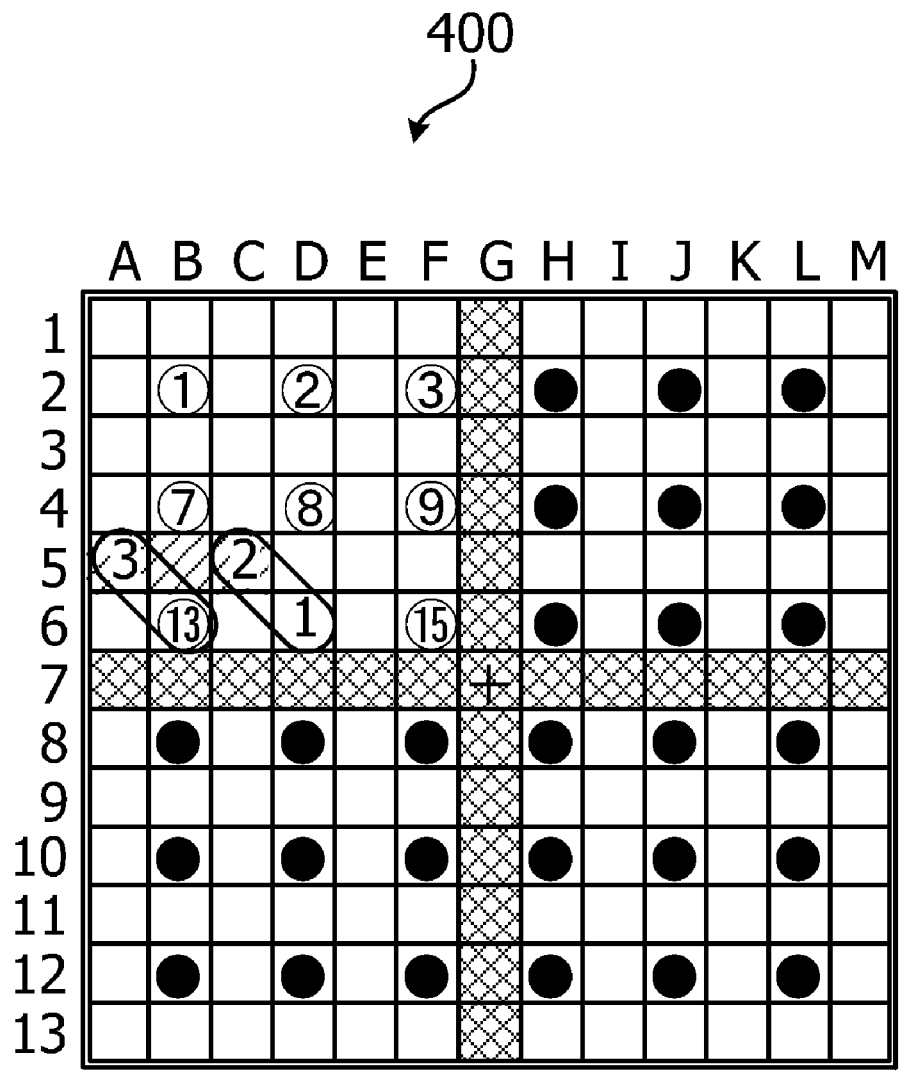
FIG. 56 illustrates a setting situation of researched flags (part 1)

FIG. 56 illustrates a setting situation of researched flags. With the present embodiment, terminals and via formation candidate positions where researched flags have been set are managed in the array F in the researched element list 330. The numerals within the grid in FIG. 56 (excluding the numerals within circles) represent the terminals and via formation candidate positions regarding which researched flags have been set, immediately following determining of placement of a decoupling capacitor to the terminal "D6". Each numeral is an index value of an array F indicating the position thereof. That is to say, a link to terminal "D1" is set to the array F[1], a link to via formation candidate position "C5" is set to the array F[2], and a link to via formation candidate position "A5" is set to the array F[3].

Figure 57:
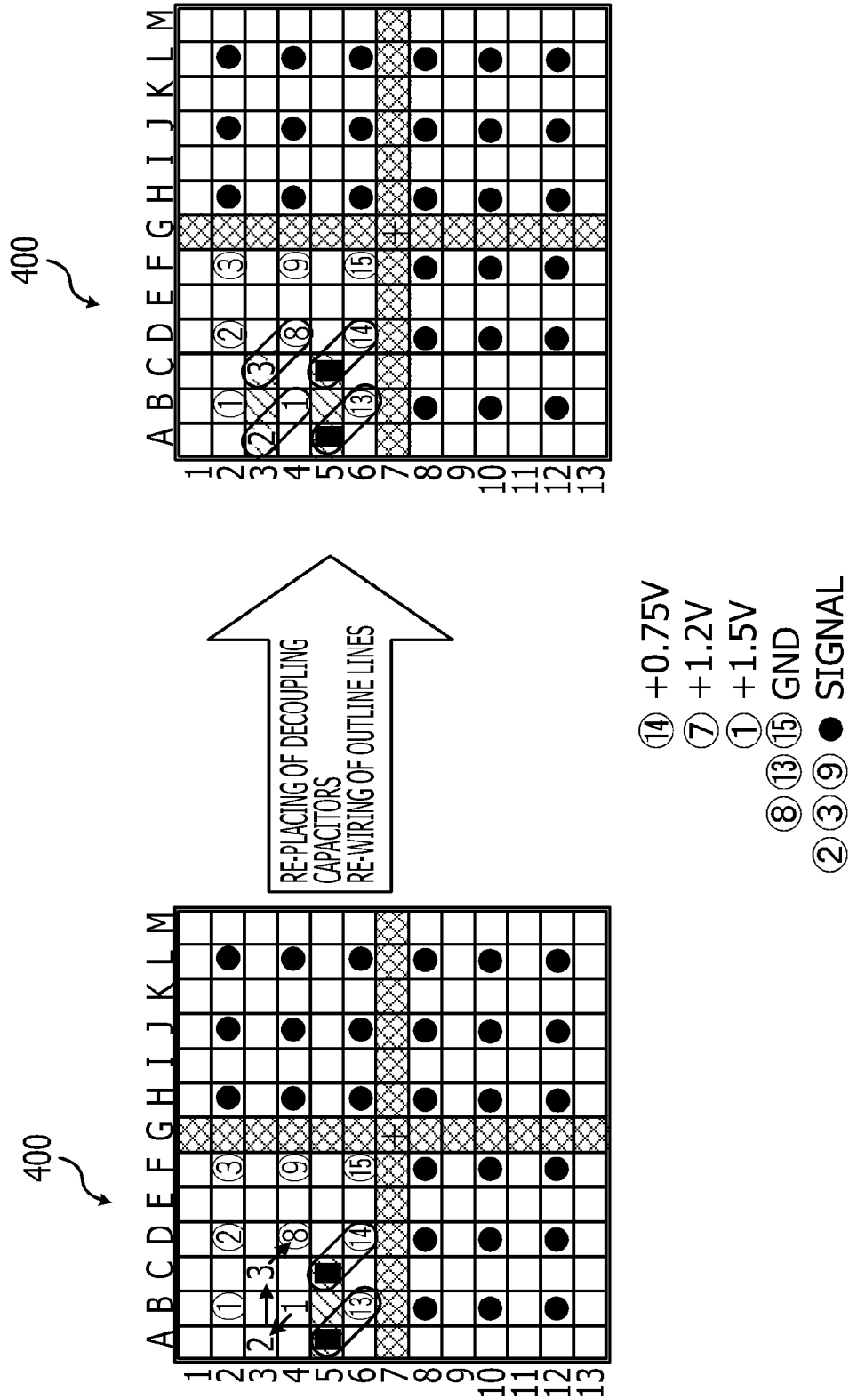
FIG. 57 illustrates a setting situation of researched flags (part 2)

FIG. 57 illustrates a setting situation of researched flags. The numerals within the grid in FIG. 57 (excluding the numerals within circles) represent the terminals and via formation candidate positions regarding which researched flags have been set, immediately following determining of placement of a decoupling capacitor to the terminal "B4". Each numeral is an index value of an array F indicating the position thereof.

Figure 58:
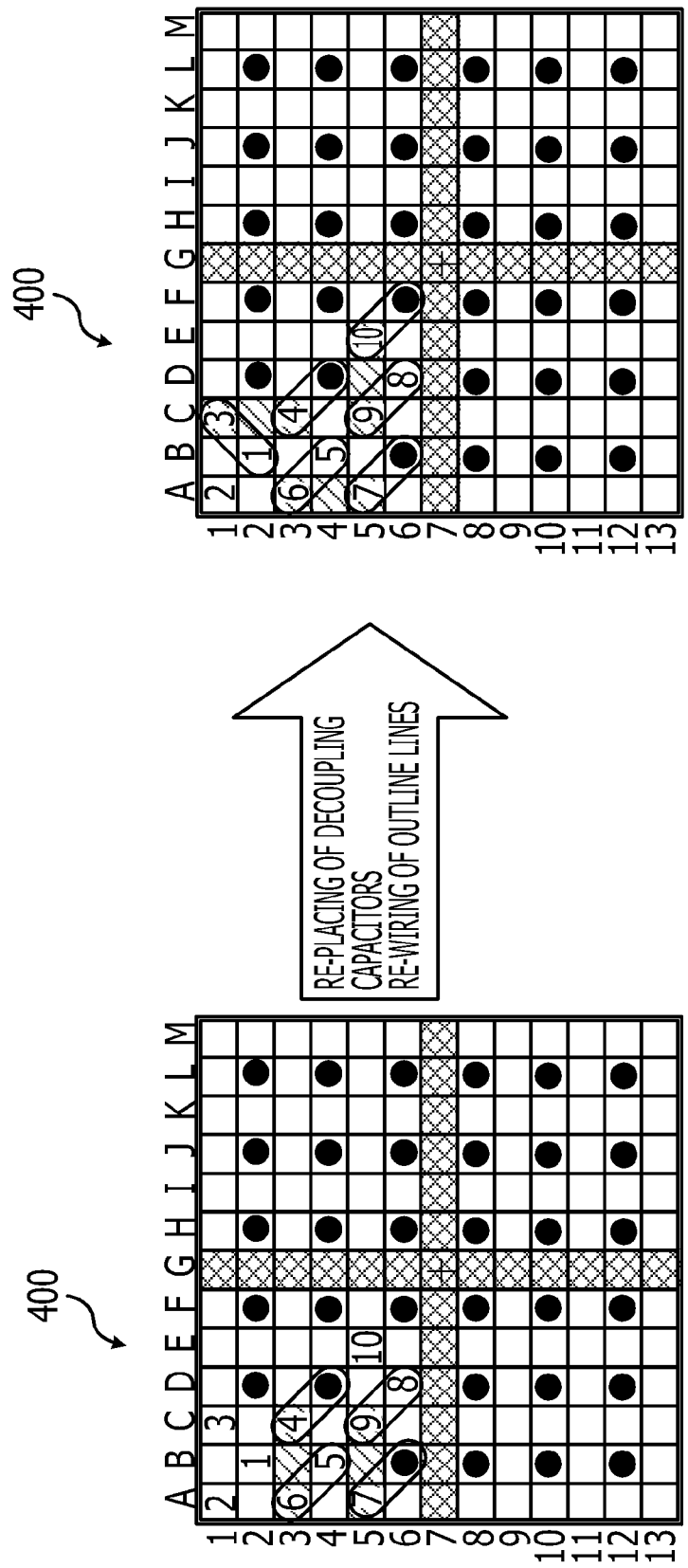
FIG. 58 illustrates a setting situation of researched flags (part 3)

FIG. 58 is a third diagram illustrating a setting situation of researched flags. The numerals within the grid in FIG. 58 (excluding the numerals within circles) represent the terminals and via formation candidate positions regarding which researched flags have been set, immediately following determining of placement of a decoupling capacitor to the terminal "B2". Each numeral is an index value of an array F indicating the position thereof.

Figure 59:
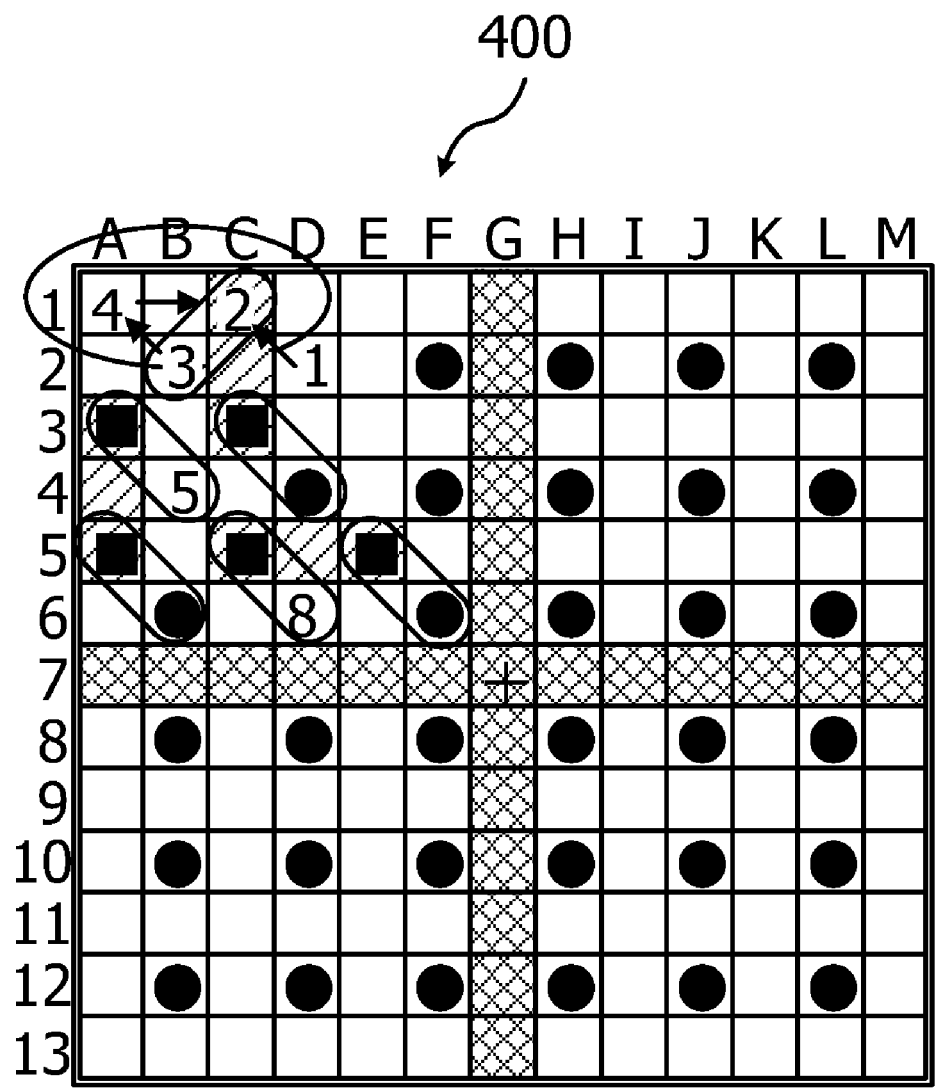
FIG. 59 illustrates a setting situation of researched flags (part 4)

FIG. 59 is a fourth diagram illustrating a setting situation of researched flags. The numerals within the grid in FIG. 59 (excluding the numerals within circles) represent the terminals and via formation candidate positions regarding which researched flags have been set, partway through searching for outline wiring from the terminal "D2". Each numeral is an index value of an array F indicating the position thereof.

The processing from No. 171 described above is performed in this state of researched flags. As a result, a via formation candidate position is searched from the via formation candidate position "A1" (V[1]) to connect the other ground terminal of the decoupling capacitor which is planned to be placed at this position. Searching at this time is performed from the via formation candidate position "C1" (V[2]), but this via formation candidate position "C1" (V[2]) has already been reserved as a candidate for outline from terminal "D2" (P[2]), and the researched flag Vf has been set to on. Accordingly, it can be seen that the via formation candidate position "C1" (V[2]) cannot be paired with the via formation candidate position "A1" (V[1]), so searching is aborted.

Such processing prevents contradictory searching and ensures that there will be no infinite loops, due using researched flags Vf.

Figure 60:
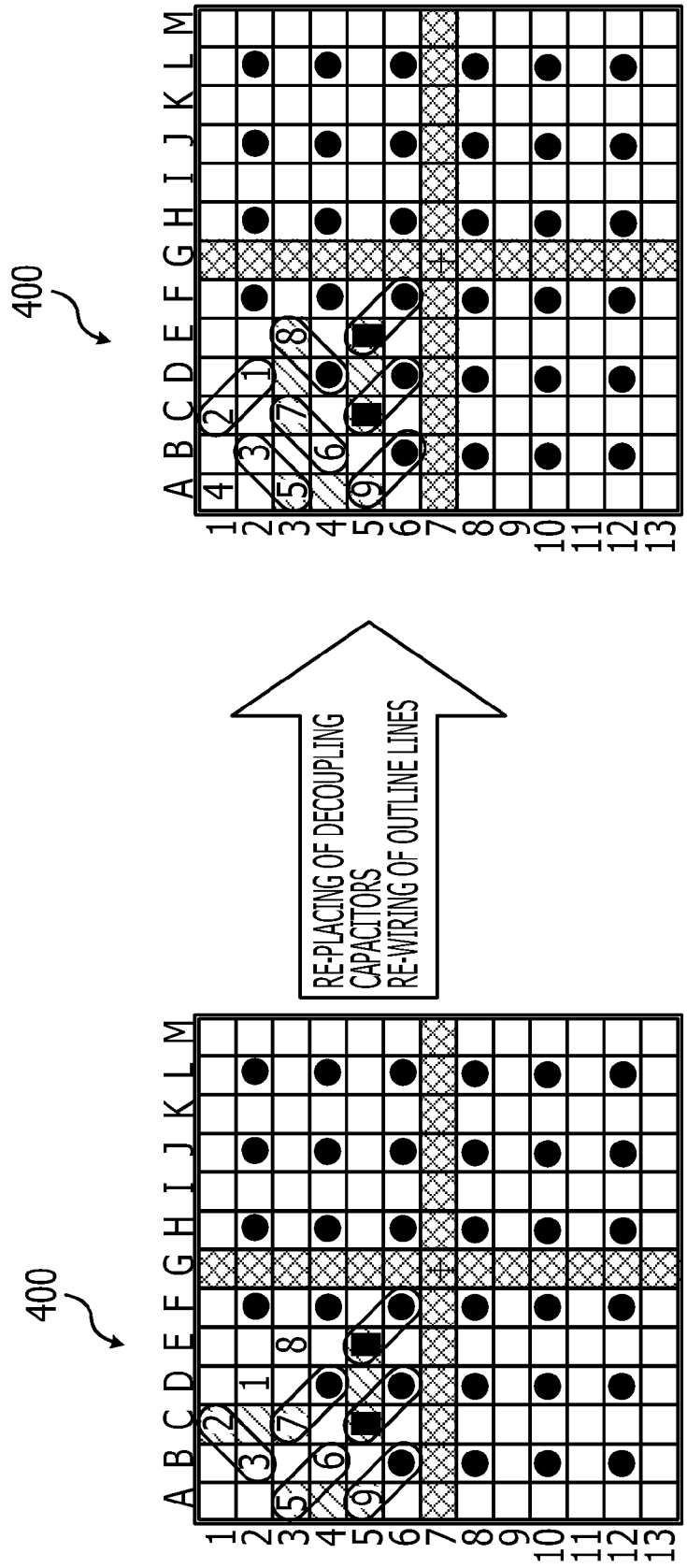
FIG. 60 illustrates a setting situation of researched flags (part 5)

FIG. 60 is a fifth diagram illustrating a setting situation of researched flags. The numerals within the grid in FIG. 60 (excluding the numerals within circles) represent the terminals and via formation candidate positions regarding which researched flags have been set, at the time of ending searching for outline wiring from the terminal "D2". Each numeral is an index value of an array F indicating the position thereof.

Such re-placing of decoupling capacitors that have already been placed, and rewiring of outline wiring from terminals, allows placement of a maximum number of decoupling capacitors.

Figure 61:
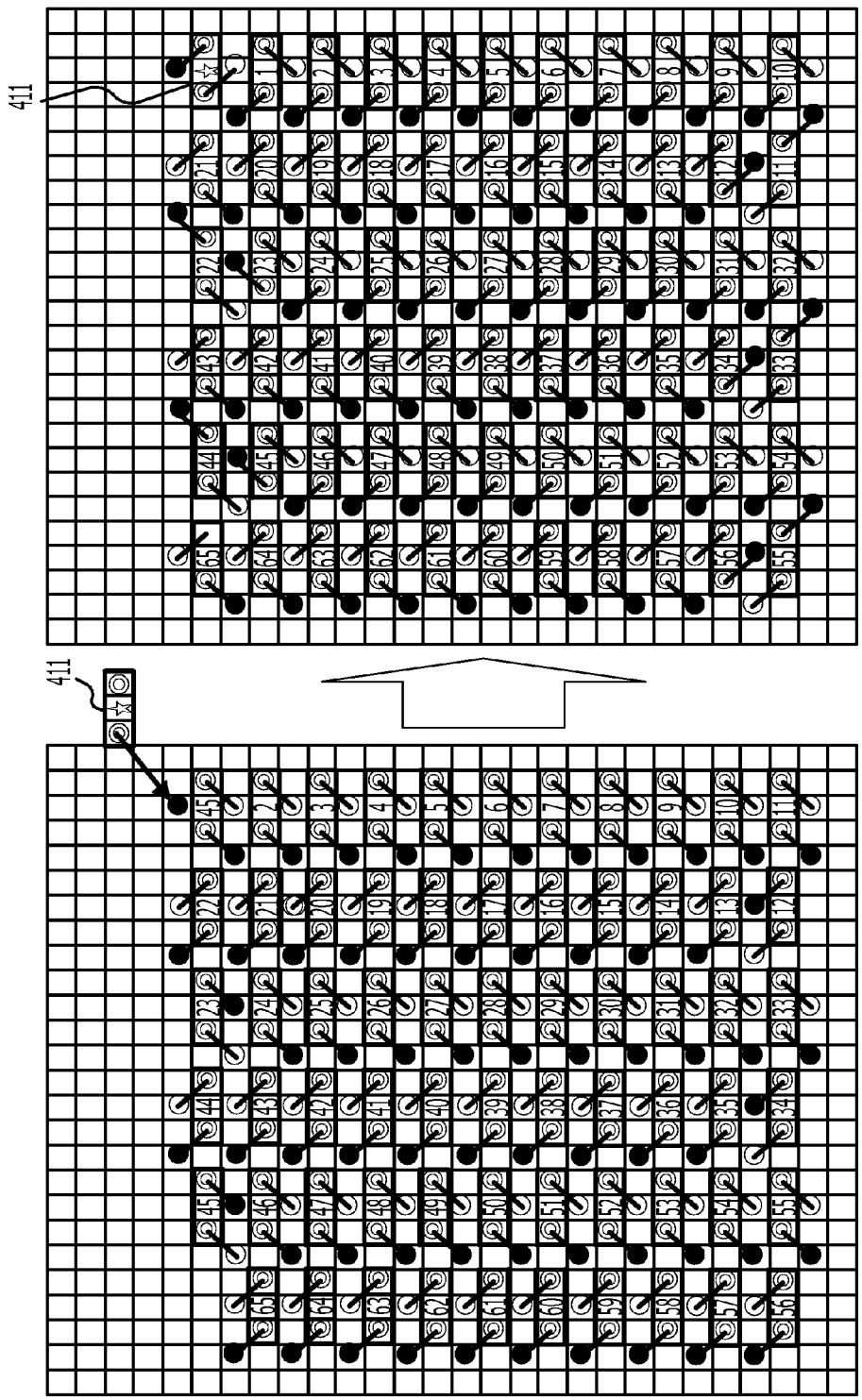
FIG. 61 illustrates decoupling capacitor re-placement and rewiring.

FIG. 61 illustrates a situation of re-placing decoupling capacitors and rewiring. In FIG. 61, the solid circles represent power source terminals, and the outline circles represent ground terminals. The rectangles represent the decoupling capacitors, and positions for formation of vias are represented by double circles.

In the case of connecting another decoupling capacitor 411 from the state shown to the left in FIG. 61, there are no available ground terminals near a power source terminal to which the decoupling capacitor 411 will be connected. Performing re-placing of the decoupling capacitors and rewiring allows the decoupling capacitor 411 to be placed between a power source terminal and ground terminal, as shown in to the right.

Performing such decoupling capacitor placement changing work over the entire BGA part manually would be extremely time and labor consuming. According to the present embodiment, re-placement of the decoupling capacitors and rewiring is performed automatically, and accordingly work efficiency is markedly improved.

Moreover, the placement of decoupling capacitors and wiring from the terminals can be efficiently determined by using bipartite graph matching techniques.

Using the wiring technique illustrated in the third embodiment enables processing to be performed for determining outline wiring from the terminals, without placement of decoupling capacitors. In this case, processing for outline wiring from all terminals can be executed in an efficient and sure manner.

If no decoupling capacitor placement is to be performed, the information relating to placement of decoupling capacitors stored in the connection information storage unit 131 is unnecessary. For example, the information of the link Vc to the other appropriated via formation candidate position and the link Vv to another connectable via formation candidate position by way of a decoupling capacitor, in the via formation candidate position list 320 in FIG. 38, can be deleted therefrom.

Figure 62:
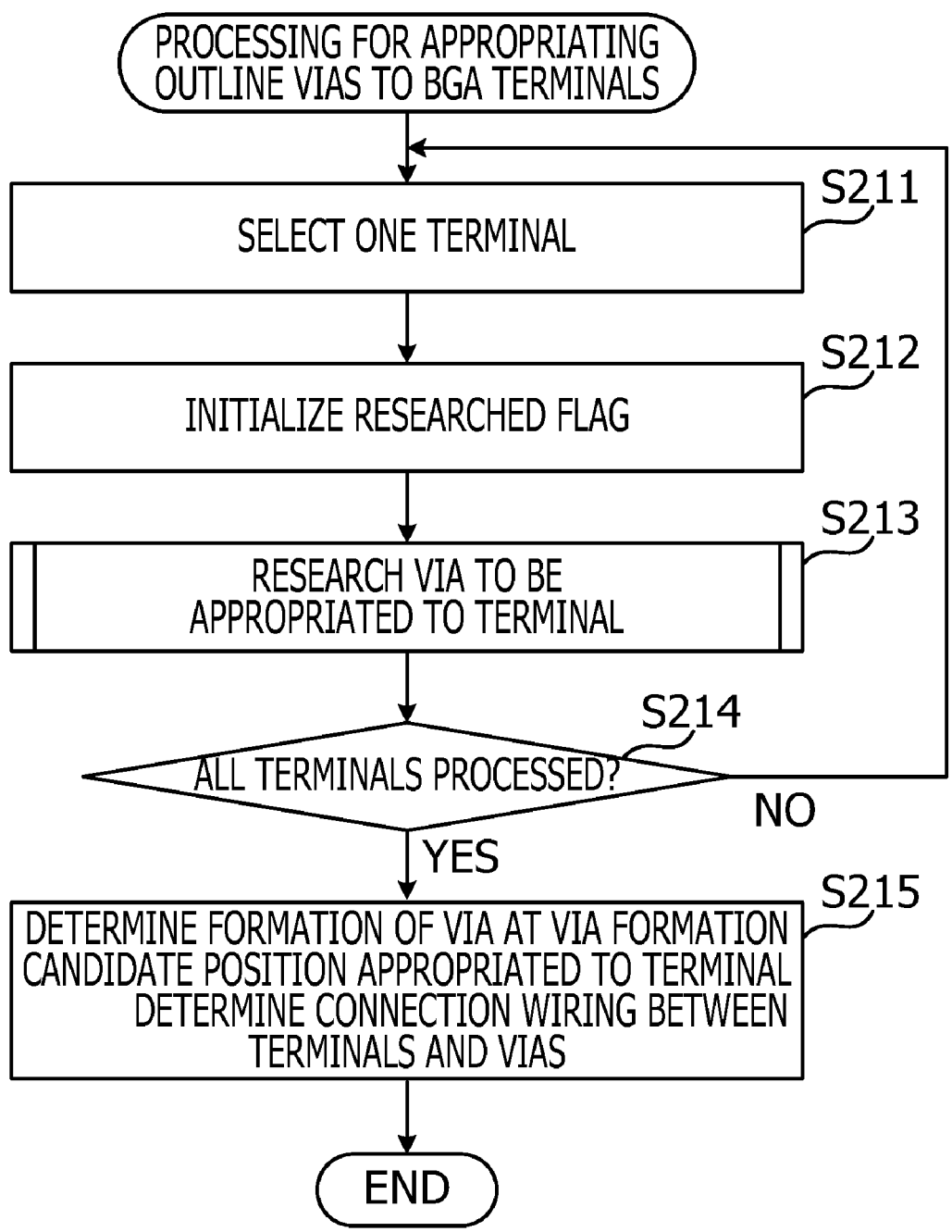
FIG. 62 is a flowchart illustrating processing for appropriating of vias to terminals.

FIG. 62 is a flowchart of processing for approaching vias to terminals. Description of the processing shown in FIG. 62 will now be made following the operation Nos. therein. Note that this processing may be executed for each BGA part.

[Operation S211] The connection relation determining unit 135 selects on unprocessed BGA terminal. Terminals to which via formation candidate positions have already been appropriated are not selected and processing thereof is skipped.

[Operation S212] The connection relation determining unit 135 initializes the researched flags for all terminals and all via formation candidate positions to off.

[Operation S213] The connection relation determining unit 135 performs researching processing for vias to be appropriated to terminals.

[Operation S214] The connection relation determining unit 135 determines whether processing has been performed for all terminals. In the event that all processing has been ended, the flow advances to operation S215. In the event that there are unprocessed terminals, the processing returns to operation S211.

[Operation S215] The connection relation determining unit 135 determines formation of vias at via formation candidate positions appropriated to the terminals, and connection wiring between the terminals and vias. The connection relation determining unit 135 then updates the printed circuit board database 110 according to what has been determined.

Figure 63:
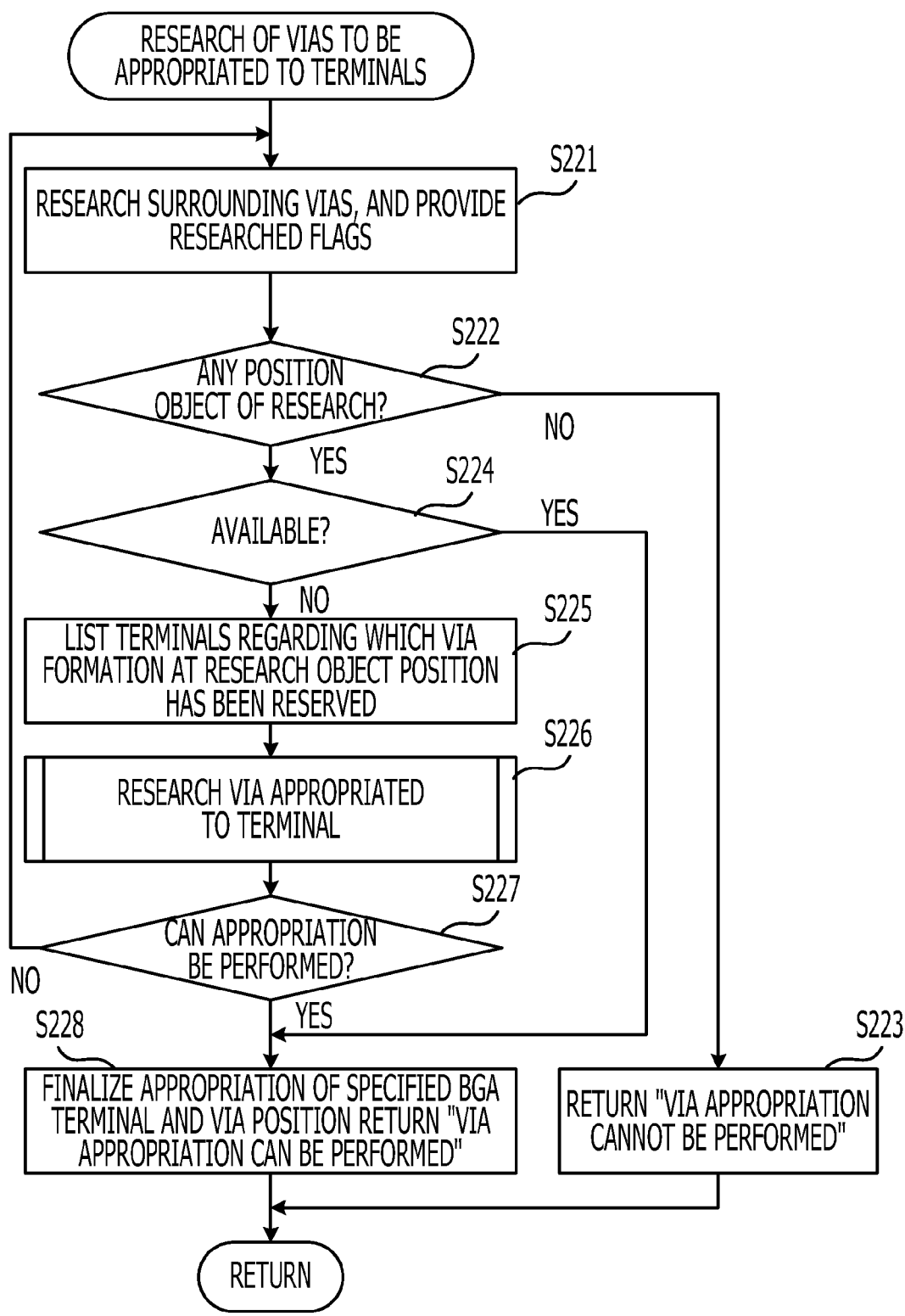
FIG. 63 is a flowchart illustrating processing for researching vias to be appropriated out to terminals.

FIG. 63 is a flowchart of research processing for vias to be appropriated to terminals. Description of the processing shown in FIG. 63 will now be made following the operation Nos. therein.

[Operation S221] The connection relation determining unit 135 researches whether the four via formation candidate positions, around a position shifted half-grid horizontally and vertically from the selected terminal, have been appropriated to another terminal. Note that the connection relation determining unit 135 does not research via formation candidate positions regarding which via formation reservations have been made form the selected terminal. Also, the connection relation determining unit 135 does not research via formation candidate positions regarding which the researched flag has been set to on. The connection relation determining unit 135 sets the researched flag to on for the via formation candidate positions that it has researched.

[Operation S222] The connection relation determining unit 135 determines whether there has been a position to be researched in operation S221. In the event that there has been a position to be researched the flow advances to operation S224. In the event that there is no position to be researched the flow advances to operation S223.

[Operation S223] In the event that there is no position to be researched, the connection relation determining unit 135 returns "Via appropriation cannot be performed" as the processing result, and ends the processing.

[Operation S224] In the event that there is a position to be researched, the connection relation determining unit 135 determines whether the position to be researched is available. The term "available" may be defined as that no terminal has set via formation reservations for this position. If available, the flow advances to operation S228. If not available, the flow advances to operation S225.

[Operation S225] The connection relation determining unit 135 compiles a list of terminals regarding which via formation reservations have been made for the position to be researched.

[Operation S226] The connection relation determining unit 135 recursively performs research processing of vias to be appropriated to terminals, regarding each of the listed terminals as objects of research. This is to research whether via formation reservations can be made at other positions.

[Operation S227] The connection relation determining unit 135 determines, from the research performed in operation S226, whether the via formation reservation set at a position which is an object of research can be cancelled and a via at that position can be appropriated. If a via at that position can be appropriated, the flow is advanced to operation S228. If a via at that position cannot be appropriated, the flow returns to operation S221.

[Operation S228] The connection relation determining unit 135 finalizes appropriation of the researched via formation candidate position to the selected terminal, and returns "Via appropriation can be performed" as the processing result.

Thus, connection to vias from the terminals of the BGA part by outline wiring can be performed.

Processing functions of an exemplary embodiment can be realized by a computer. In this case, a program is provided in which is described the processing of functions which the printed circuit board design assisting device should have. Running the program on a computer realizes the above-described processing functions on the computer. The program describing the processing contents can be recorded in a computer-readable recording medium. Examples of computer-readable recording media include magnetic storage devices, optical discs, magneto-optical recording media, semiconductor memory, and so forth. Examples of magnetic storage devices include hard disk devices (HDD), flexible disks (FD), magnetic tape, and so forth. Examples of optical discs include DVD, DVD-RAM, CD-ROM/RW, and so forth. Examples of magneto-optical recording media include MO (magneto-optical) discs.

The program can be distributed by selling portable recording media such as DVDs and CD-ROMs in which the program is recorded, for example. Also, the program can be stored in the storage device of a server computer, and transferred from the server computer to other computers via a network.

The computer which executes the program stores the program recorded in the portable recording medium or transferred from a server computer in its own storage device. The computer then reads the program from its own storage device, and performs processing following the program. Note that the computer may read the program directly from a portable recording medium and perform processing following the program. Also, an arrangement may be made wherein, whenever a program is transferred from the server computer, the computer performs processing following the received program.

Also, at least part of the above-described processing functions may be realized with an electronic circuit, such as a DSP (Digital Signal Processor), ASIC (Application Specific Integrated Circuit), PLD (Programmable Logic Device) or the like.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions has been described in detail, it should be understood that the various changes, substitutions, and alterations could be made hereto without departing from the spirit and scope of the invention. The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on non-transitory computer-readable media comprising computer-readable recording media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A non-transitory storage medium in which is recorded a program for assisting design of a printed circuit board onto which is to be mounted a grid array package part, said program causing a computer to execute a method comprising:
    referring to positions of a plurality of terminals of said grid array package part, and a part information storage in which are stored attributes indicating whether each of said terminals is a power source terminal or a ground terminal;
    selecting, one at a time, power source terminals of said grid array package part as a selected terminal to be researched;
    searching for a first new connection path between said selected terminal and one of said ground terminals by way of a first decoupling capacitor at a first position;
    referring to a connection path storage storing an already-existing connection path between said terminals connected by way of a second decoupling capacitor regarding which placement has already been determined in determining whether said first new connection path is recorded in said connection path storage;
    storing said first new connection path in said connection path storage when said first new connection path is not recorded in said connection path storage;
    changing a second position of said second decoupling capacitor, when said first new connection path is already recorded in said connection path storage, to secure a placement location for said first new connection path;
    re-searching to find a second new connection path by way of said second decoupling capacitor, between said terminals connected by said second decoupling capacitor, which does not duplicate said first new connection path;
    deleting said already-existing connection path, which has been the object of said re-searching, from said connection path storage; and
    storing said second new connection path and said first new connection path in said connection path storage.

2. The non-transitory storage medium according to claim 1, wherein, each time another already-existing connection path is detected which duplicates said second new connection path, a third position of a third decoupling capacitor on said other already-existing connection path is changed, and re-searching is performed for a third new connection path by way of said third decoupling capacitor which does not duplicate said first new connection path nor said second new connection path.

3. The non-transitory storage medium according to claim 1,
    wherein power source voltage values of said power source terminals are registered beforehand in said part information storage, and
    wherein, at a time of selecting said power source terminals, said power source terminals with lower power source voltage values are selected with higher priority.

4. The non-transitory storage medium according to claim 1,
    wherein power source voltage values of said power source terminals, and a plurality of decoupling capacitors to be connected to said power source terminals, are registered beforehand in said part information storage, and
    wherein said method further comprises:

referring to said part information storage to classify said decoupling capacitors by the power source voltage values of said power source terminals to which a connection is to be made, grouping objects representing said decoupling capacitors into classified groups, and displaying the classified groups on a screen.

5. The non-transitory storage medium according to claim 1, wherein said method further comprises determining, prior to said searching of said first new connection path, a direction to consider with priority regarding wiring from said terminal to said first decoupling capacitor, and wherein said searching of said first new connection path, includes placement of said first decoupling capacitor at a position enabling a wiring connection thereto from said selected terminal in said direction.

6. The non-transitory storage medium according to claim 5, wherein said direction to consider with priority is a direction from a center of said grid array package part outwards.

7. The non-transitory storage medium according to claim 1, wherein said decoupling capacitors to be connected to said power source terminals are registered beforehand in said part information storage, and wherein said method further comprises displaying said power source terminals of an object representing said grid array package part including said power source terminals, and objects representing said decoupling capacitors to be connected to said power source terminals, connected by line segments.

8. The non-transitory storage medium according to claim 1, wherein said referring to said connection path storage comprises:

calculating a percentage of said power source terminals connected to any of said decoupling capacitors, for each power source voltage of said power source terminals, and displaying results of said calculating.

9. The non-transitory storage medium according to claim 1, wherein said part information storage stores mounting conditions of said decoupling capacitors, and wherein said referring to said part information storage comprises determining whether said connection paths stored in said connection path storage satisfy said mounting conditions of said decoupling capacitors.

10. The non-transitory storage medium according to claim 1, wherein, in said connection path searching, said first decoupling capacitor is placed on a first face opposite to a second face on which said grid array package part is mounted, and said terminal to be researched and one of said ground terminals are each connected to said first decoupling capacitor by way of vias.

11. The non-transitory storage medium according to claim 10, wherein, in said connection path searching, said terminals of said grid array package part are placed on grid points of a region sectioned into a grid, and said vias are placed at positions moved from said grid points by a half-grid in both horizontal and vertical directions.

12. The non-transitory storage medium according to claim 10, wherein, in said connection path searching, a determination is made whether to form said vias at a cross-shaped boundary portion passing through the center of said grid array package part in accordance with an operation input.

13. A method executed by a computer assisting design of a printed circuit board onto which is to be mounted a grid array package part, said method comprising:

referring, to positions of a plurality of terminals of said grid array package part, and a part information storer in which are stored attributes indicating whether each of said terminals is a power source terminal or a ground terminal;

selecting, one at a time, said power source terminals of said grid array package part as a selected terminal to be researched;

referring to said part information storer and searching for a first new connection path between said selected terminal to be researched, and one of said ground terminals by way of a first decoupling capacitor;

referring to a connection path storer storing an already-existing connection path between said terminals connected by way of a second decoupling capacitor regarding which placement has already been determined, and determining whether said first new connection path is recorded in said connection path storage;

storing, using the computer, said first new connection path in said connection path storage when said first new connection path is not recorded in said connection path storage;

changing a second position of said second decoupling capacitor when said first new connection path is recorded in said connection path storage to secure a placement location for said first new connection path;

re-searching to find a second new connection path, by way of said second decoupling capacitor, between said terminals connected by said second decoupling capacitor, where said second new connection path does not duplicate said first new connection path; and deleting said already-existing connection path, which has been the object of said re-searching, from said connection path storage, and storing said second new connection path obtained by said re-searching and said first new connection path, in said connection path storage.

14. A printed circuit board design assisting device to execute processing of assisting design of a printed circuit board onto which is to be mounted a grid array package part, said device comprising:

a research object terminal selector referring to positions of a plurality of terminals of said grid array package part, and a part information storage in which are stored attributes indicating whether each of said terminals is a power source terminal or a ground terminal, and selecting, one at a time, said power source terminals of said grid array package part as a selected terminal to be researched;

a connection path searcher referring to said part information storage and searching for a first new connection path between said selected terminal to be researched and one of said ground terminals by way of a first decoupling capacitor;

a path duplication determiner referring to said connection path storage storing an already-existing connection path between said terminals connected by way of a second decoupling capacitor regarding which placement has already been determined, and determining whether said first new connection path is recorded in said connection path storage;

a path re-searcher changing a second position of said second decoupling capacitor when said first new connection path is already recorded in said connection path storage to secure a placement location for said first new connection path, and re-searching to find a second new connection path by way of said second decoupling capacitor, between said terminals connected by said second decoupling capacitor, where said second new connection path does not duplicate said first new connection path; and
a connection path changer storing said first new connection path in said connection path storage when said first new connection path is not recorded in said connection path storage, deleting said already-existing connection path, which has been the object of re-searching, from said connection path storage, and storing said second new connection path obtained by re-searching and said first new connection path, in said connection path storage.

* * * * *